United States Patent
Sewell et al.

(10) Patent No.: US 12,484,314 B2
(45) Date of Patent: Nov. 25, 2025

(54) WIRE-BASED METALLIZATION AND STRINGING FOR SOLAR CELLS

(71) Applicant: Maxeon Solar Pte. Ltd., Singapore (SG)

(72) Inventors: Richard Hamilton Sewell, Los Altos, CA (US); Matthieu Minault Reich, San Jose, CA (US); Andrea R. Bowring, Mountain View, CA (US); Arbaz Shakir, Santa Clara, CA (US); Ryan Reagan, Hayward, CA (US); Matthew Matsumoto, Pasadena, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/405,720

(22) Filed: Jan. 5, 2024

(65) Prior Publication Data
US 2024/0145607 A1  May 2, 2024

Related U.S. Application Data

(62) Division of application No. 17/032,975, filed on Sep. 25, 2020, now Pat. No. 11,901,470.
(Continued)

(51) Int. Cl.
*H10F 19/90* (2025.01)
*H10F 71/00* (2025.01)

(52) U.S. Cl.
CPC ......... *H10F 19/902* (2025.01); *H10F 19/908* (2025.01); *H10F 71/1375* (2025.01)

(58) Field of Classification Search
CPC ............... Y02E 10/50; H01L 31/0201; H01L 31/02167; H01L 31/03926; H01L 31/05;
(Continued)

(56) References Cited

U.S. PATENT DOCUMENTS

2010/0233843 A1  9/2010  Frolov et al.
2012/0247530 A1  10/2012  Dimov et al.
(Continued)

FOREIGN PATENT DOCUMENTS

CN  106653912 A  5/2017
EP  3776664 A1  2/2021
(Continued)

OTHER PUBLICATIONS

International Search Report and Written Opinion from PCT/US2020/052917 mailed Jan. 8, 2021, 10 pgs.
(Continued)

*Primary Examiner* — Mayla Gonzalez Ramos
(74) *Attorney, Agent, or Firm* — Schwabe, Williamson & Wyatt, P.C.

(57) ABSTRACT

Wire-based metallization and stringing techniques for solar cells, and the resulting solar cells, modules, and equipment, are described. In an example, a string of solar cells includes a plurality of back-contact solar cells, wherein each of the plurality of back-contact solar cells includes P-type and N-type doped diffusion regions. A plurality of conductive wires is disposed over a back surface of each of the plurality of solar cells, wherein each of the plurality of conductive wires is substantially parallel to the P-type and N-type doped diffusion regions of each of the plurality of solar cells. One or more of the plurality of conductive wires adjoins a pair of adjacent solar cells of the plurality of solar cells and has a relief feature between the pair of adjacent solar cells.

20 Claims, 32 Drawing Sheets

Related U.S. Application Data

(60) Provisional application No. 62/907,471, filed on Sep. 27, 2019.

(58) Field of Classification Search
CPC ............ H01L 31/0504; H01L 31/0508; H01L 31/0516; H10F 19/902; H10F 19/908; H10F 71/1375
See application file for complete search history.

(56) References Cited

U.S. PATENT DOCUMENTS

| | | |
|---|---|---|
| 2013/0160825 A1 | 6/2013 | Lantzer et al. |
| 2016/0380120 A1 | 12/2016 | Terao |
| 2016/0380132 A1 | 12/2016 | Sewell et al. |
| 2016/0380134 A1* | 12/2016 | Sewell ............ H01L 31/022441 438/98 |
| 2017/0092790 A1 | 3/2017 | Harder |
| 2018/0097125 A1 | 4/2018 | Sewell et al. |
| 2018/0190837 A1 | 7/2018 | Reich et al. |
| 2018/0286994 A1 | 10/2018 | Sewell et al. |
| 2018/0358481 A1 | 12/2018 | Sewell et al. |
| 2019/0305167 A1 | 10/2019 | Sewell et al. |

FOREIGN PATENT DOCUMENTS

| | | |
|---|---|---|
| JP | 2010/0141050 A | 6/2010 |
| WO | WO 2016/065931 A1 | 5/2016 |
| WO | WO 2019/191689 A1 | 10/2019 |

OTHER PUBLICATIONS

International Preliminary Report on Patentability from PCT/US2020/052917 dated Apr. 7, 2022, 7 pgs.
First Action Interview Pre-Interview Communication from U.S. Appl. No. 17/032,975 dated Aug. 31, 2022, 9 pgs.
Non-Final Office Action from U.S. Appl. No. 17/032,975 dated Dec. 14, 2022, 11 pgs.
Final Office Action from U.S. Appl. No. 17/032,975 dated Jun. 23, 2023, 14 pgs.
Extended European Search Report from European Patent Application No. 20868754.1 dated Sep. 6, 2023, 12 pgs.

* cited by examiner (c)

(d)

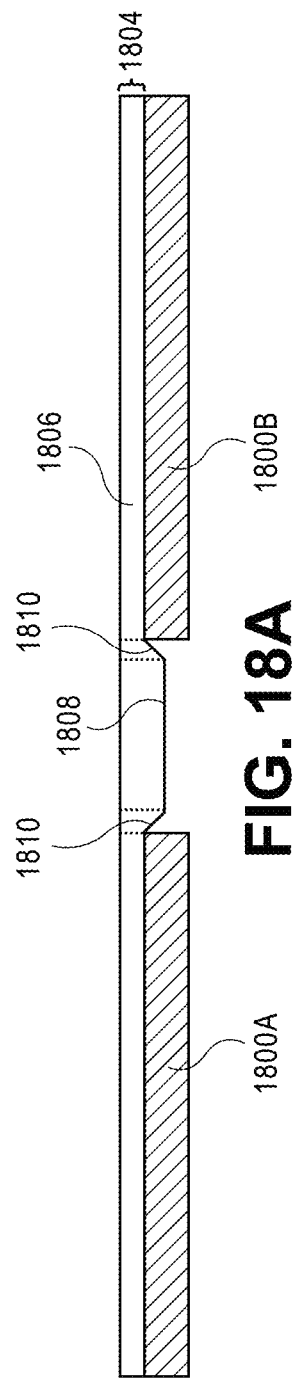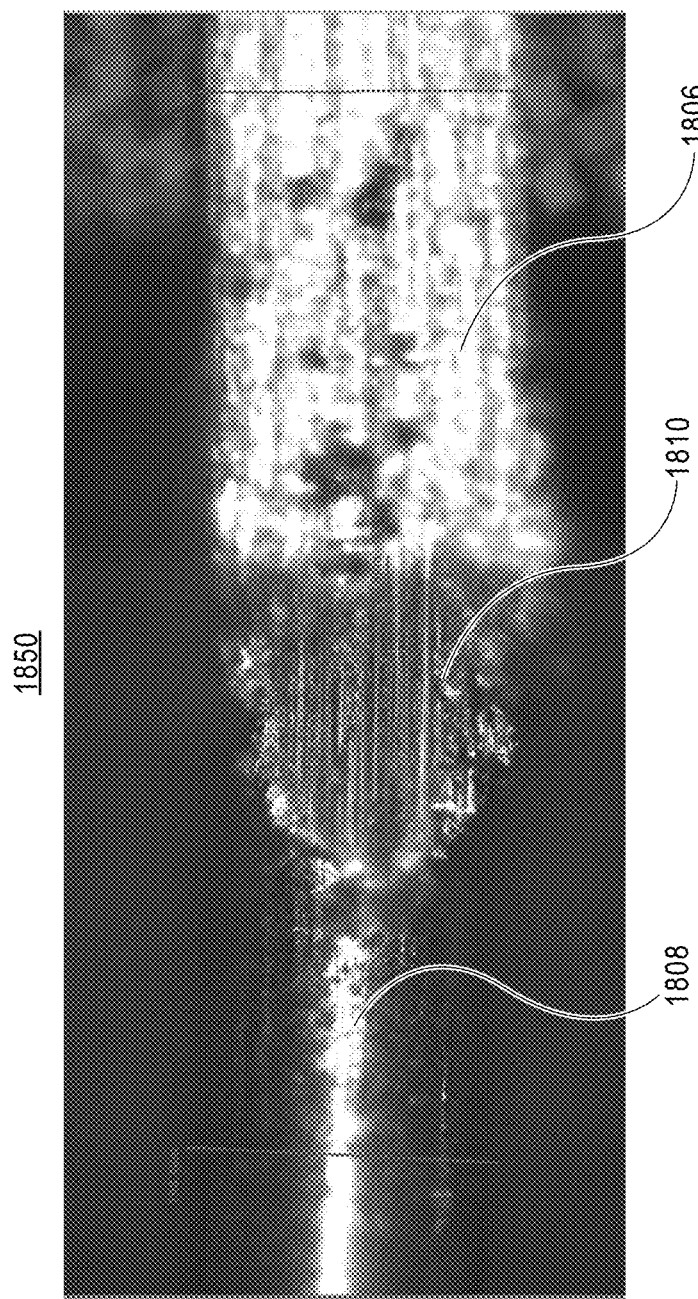
FIG. 18A
FIG. 18B

WIRE-BASED METALLIZATION AND STRINGING FOR SOLAR CELLS

CROSS-REFERENCE TO RELATED APPLICATIONS

This application is a Divisional of U.S. Non-Provisional application Ser. No. 17/032,975, filed on Sep. 25, 2020, which claims the benefit of U.S. Provisional Application No. 62/907,471, filed on Sep. 27, 2019, the entire contents of which are hereby incorporated by reference herein.

STATEMENT OF GOVERNMENT LICENSE RIGHTS

This invention was made with government support under DE-EE0008175 awarded by The U.S. Department of Energy. The government has certain rights in the invention.

TECHNICAL FIELD

Embodiments of the present disclosure are in the field of renewable energy and, in particular, include wire-based metallization and stringing techniques for solar cells, and the resulting solar cells, modules, and equipment.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

FIG. 18A illustrates a cross-sectional view of an arrangement for wire-based metallization of solar cells, in accordance with an embodiment of the present disclosure.

FIG. 18B is an image of a wire portion in a region between two solar cells of the arrangement shown in FIG. 18A, in accordance with an embodiment of the present disclosure.

DETAILED DESCRIPTION

Figure 1A:
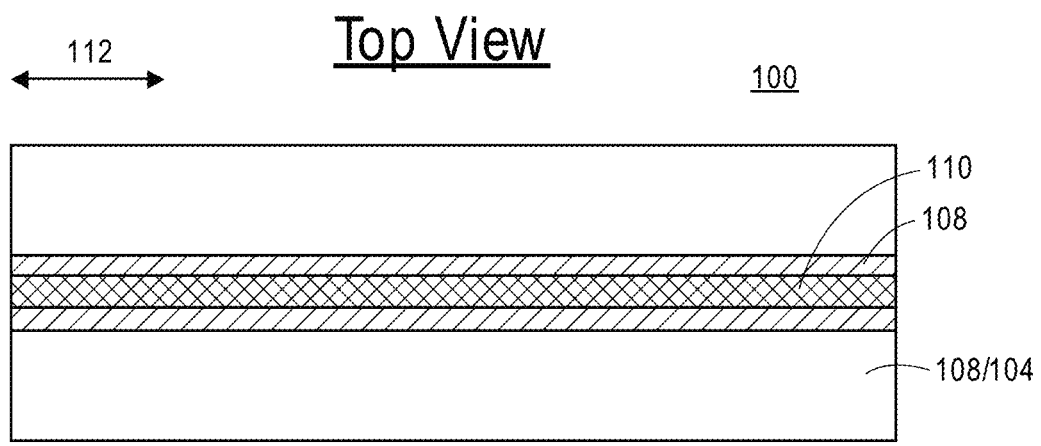
FIG. 1A illustrates a plan view of the back side of a solar cell having wire-based metallization, in accordance with an embodiment of the present disclosure.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment." do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Comprising" is open-ended term does not foreclose additional structure or steps.

"Configured to" connotes structure by indicating that a device, such as a unit or a component, includes structure that performs a task or tasks during operation, such structure is configured to perform the task even when the device is not currently operational (e.g., is not on/active). A device "configured to" perform one or more tasks is expressly intended to not invoke a means or step plus function interpretations under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell in a sequence; instead the term "first" is used to differentiate this solar cell from another solar cell (e.g., a "second" solar cell).

"Coupled" refers to elements, features, structures or nodes unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Doped regions," "semiconductor regions," and similar terms describe regions of a semiconductor disposed in, on, above or over a substrate. Such regions can have a N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the insulating layer can be interchanged with a tunneling dielectric layer, while in others the insulating layer is a masking layer or an "antireflective coating layer" (ARC layer). Exemplary materials include silicon nitride, silicon oxynitride, silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials. In an example, the intervening layer can include a material that can act as a moisture barrier. Also, for example, the insulating material can be a passivation layer for a solar cell.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Wire-based metallization and stringing techniques for solar cells, and the resulting solar cells, modules, and equipment, are described herein. In the following description, numerous specific details are set forth, such as specific process flow operations, in order to provide a thorough understanding of embodiments of the present disclosure. It will be apparent to one skilled in the art that embodiments of the present disclosure can be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a substrate having a back surface and an opposing light-receiving surface. A plurality semiconductor regions is disposed in or above the back surface of the substrate. A conductive contact structure is disposed on the semiconductor regions. The conductive contact structure includes a plurality of conductive wires, each conductive wire of the plurality of conductive wires essentially continuously bonded directly to a corresponding one of semiconductor regions. In one embodiment, each conductive wire of the plurality of conductive wires can be bonded through a metal layer to one of the semiconductor regions. In an example, the metal layer can be a metal seed layer. In an embodiment, each conductive wire of the plurality of conductive wires can be a non-coated conductive wire. In one example, the conductive contact structure can include a non-coated conductive wire or a plurality of non-coated conductive wires.

Also, disclosed herein are strings of solar cells. In one embodiment, a string of solar cells includes a plurality of solar cells, such as back-contact solar cells or front contact solar cells. Each of the plurality of back-contact solar cells includes P-type and N-type doped diffusion regions. A plurality of conductive wires is disposed over a back surface of each of the plurality of solar cells, wherein each of the plurality of wires is substantially parallel to the P-type and N-type doped diffusion regions of each of the plurality of solar cells. Every other one of the plurality of wires is cut in a region between each adjacent pair of the plurality of solar cells. Portions of uncut wires have a different cross-sectional profile in the region between each adjacent pair of the plurality of solar cells than portions of the uncut wires bonded to the solar cells.

Also disclosed herein are methods of fabricating strings of solar cells. In one embodiment a method of electrically coupling solar cells involves aligning conductive wires over the back sides of adjacent solar cells. The wires are aligned substantially parallel to P-type and N-type doped diffusion regions of the solar cells. The method involves bonding the wires directly to the back side of each of the solar cells over the P-type and N-type doped diffusion regions using thermocompression bonding, ultrasonic bonding, or thermosonic bonding.

Also disclosed herein are systems for electrically coupling solar cells. In one embodiment, a system includes a wire support to align conductive wires substantially parallel with P-type and N-type doped diffusion regions of each of the solar cells. The system also includes a bond head to bond the wires to the back side of each of the solar cells over the P-type and N-type doped diffusion regions. The system also includes a cutter to sever the wires.

Thus, one or more embodiments described herein are directed to metallization and stringing techniques. According to embodiments, wires can be used to string back-contact solar cells together instead of patterned cell interconnects. The wires can also serve as metallization to collect current across the cells, either by themselves, or in conjunction with a first level metallization on the solar cells.

To provide context, techniques for stringing together back-contact solar cells can be different than techniques for stringing together front-contact cells. State-of-the-art stringing together of solar cells can involve the use of metal ribbons weaving from the back side of one cell to the front side of the next cell. In other words, between two cells, a ribbon can go underneath one cell and across the top of another adjacent cell (e.g., the next cell). Weaving from front to back for cells can pose manufacturing difficulties (e.g., alignment difficulties, etc.).

In an example involving back-contact cells, metal fingers for each polarity (N and P) can be connected to a single busbar at the edge of the cell. Cell interconnects can then be soldered from the "P busbar" (e.g., the busbar connected to the metal finger for a given P-type region) of one cell to the "N busbar" (e.g., the busbar connected to the metal finger for a given N-type region) of the next solar cell. The space used by such busbars on the solar cells reduces the overall efficiency of the solar cells. Furthermore, the process of forming the metal fingers and the busbars on the cell can be costly.

According to embodiments, instead of using busbars to collect the current throughout each cell, each finger (e.g., P-type doped diffusion regions or N-type doped diffusion regions) of one cell is directly connected to the corresponding finger (e.g., a finger of opposite polarity) of the next cell using continuous conductive wires. The wires are first attached across some or all cells of the entire string (e.g., in a continuous string), shorting each pair of solar cells. Every other wire is subsequently cut between cells in order to restore separate P and N electrodes. For example, P and N electrodes are separate but connected back and forth if every other wire is not cut. Every other wire connects the P electrodes of a first cell to the N electrodes of a second cell. The other wires connect the N electrodes of the first cell to the P electrodes of the second cell. The pair of cells is therefore shorted if one of the two sets of wires is not cut. Therefore, cutting one of the two sets of wires between a given pair of cells can restore separate P and N electrodes.

It is to be appreciated that improvements in metallization methods for forming conductive contacts of solar cells are generally desirable. In contrast to some metallization methods, e.g., plating conductive contacts on a solar cell, other techniques can include bonding conductive foil and/or conductive wires to a semiconductor substrate (e.g., a silicon substrate). Such methods can require loading and reloading a substantial number of wires into a bonding tool, which can be particularly challenging to setup and process. Techniques described herein provide for approaches and apparatuses to place, align and bond conductive wires and to a semiconductor substrate in a solar cell metallization and/or stringing process. Various examples are provided throughout.

Figure 1B:
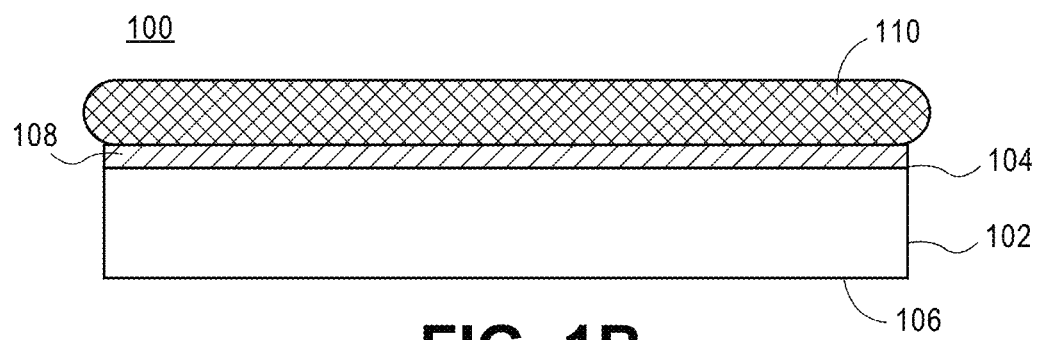
FIG. 1B illustrates a cross-sectional view corresponding to the solar cell of FIG. 1A.

FIGS. 1A and 1B illustrate a plan view of the back side of a solar cell having wire-based metallization, and a corresponding cross-sectional view, respectively, in accordance with an embodiment of the present disclosure.

Referring to FIGS. 1A and 1B, a portion 100 of a solar cell includes a substrate 102 having a back surface 104 and an opposing light-receiving surface 106. A plurality of N-type and P-type semiconductor regions (one such region shown as 108) is disposed in or above the back surface 104 of the substrate 102. A conductive contact structure is disposed on the plurality of N-type and P-type semiconductor regions 108. The conductive contact structure includes a plurality of conductive wires (one conductive wire shown as 110). Each conductive wire 110 is essentially continuously bonded directly to the solar cell. It is to be appreciated that, in some embodiments, a continuously bonded or essentially continuously bonded arrangement is described with respect to exposed silicon. In a particular embodiment, most of the semiconductor (e.g., polycrystalline silicon) is covered by a dielectric (e.g., a bottom anti-reflective coating layer), and the wire therefore only contacts the semiconductor directly at the periodic openings in the dielectric, but does so continuously or essentially continuously. In some embodiments, the openings are also continuous, e.g., in contrast non-periodic openings in the dielectric. In an embodiment, each conductive wire 110 can be a non-coated conductive wire. In one example, the conductive contact structure can include a non-coated conductive wire or a plurality of non-coated conductive wires.

In an embodiment, each conductive wire 110 of the plurality of conductive wires is parallel along a first direction 112 to form a one-dimensional layout of a metallization layer for the portion 100 of a solar cell, examples of which are described in greater detail below in association with FIGS. 4A-4C and 5.

One or more embodiments described herein provides a technique for bonding (thermocompression or thermosonic with compression) of a metal wire (such as an aluminum wire) to a solar cell. In an embodiment, the metal wire is allowed or caused to flow or stretch away from a bonding interface, such as a silicon bonding interface. As the metal wire is stretched, an existing surface oxide cracks apart to reveal un-reacted metal (e.g., a fresh aluminum surface) which will readily bond with features of the solar cell. It is to be appreciated that, in some embodiments, aluminum wires are preferred since they can be subjected to thermocompression bonding at a temperature in a range of approximately 300-450 degrees Celsius, or lower with the inclusion of ultrasonic energy. In a particular example, the bonding temperature can include approximately 350 degrees Celsius. By contrast, a copper wire can need to be heated to substantially higher temperatures for thermocompression bonding and, as a result, can cause a silicon substrate to bow upon cooling after bonding to the silicon substrate. It is also to be appreciated that excessive bowing with copper wires can result from the fact that copper has a higher yield strength than pure aluminum. On cooling, both aluminum and copper will contract to drive wafer bowing, but the degree of contraction in aluminum is limited by the low yield strength. Many aluminum alloys have higher yield strength (e.g., 241 MPA for AL6061) while pure aluminum has a yield strength of 11 MPA. Accordingly, in some embodiments, pure or essentially pure aluminum wires are used for forming a metallization layer for silicon based solar cells to enable low bowing. In an example, the aluminum wires do not include any additional coating or layer. However, in other embodiments, copper wires are used for forming a metallization layer for silicon based solar cells.

In accordance with one or more embodiments of the present disclosure, a conductive wire has a non-round or somewhat flattened cross-section as a result of a compression bonding process, such as a thermocompression bonding process or a thermosonic or ultrasonic bonding process. As a comparative example, FIG. 2A illustrates cross-sectional views of (a) a conventionally bonded wire versus (b) a compressed wire, in accordance with an embodiment of the present disclosure.

Figure 2A:
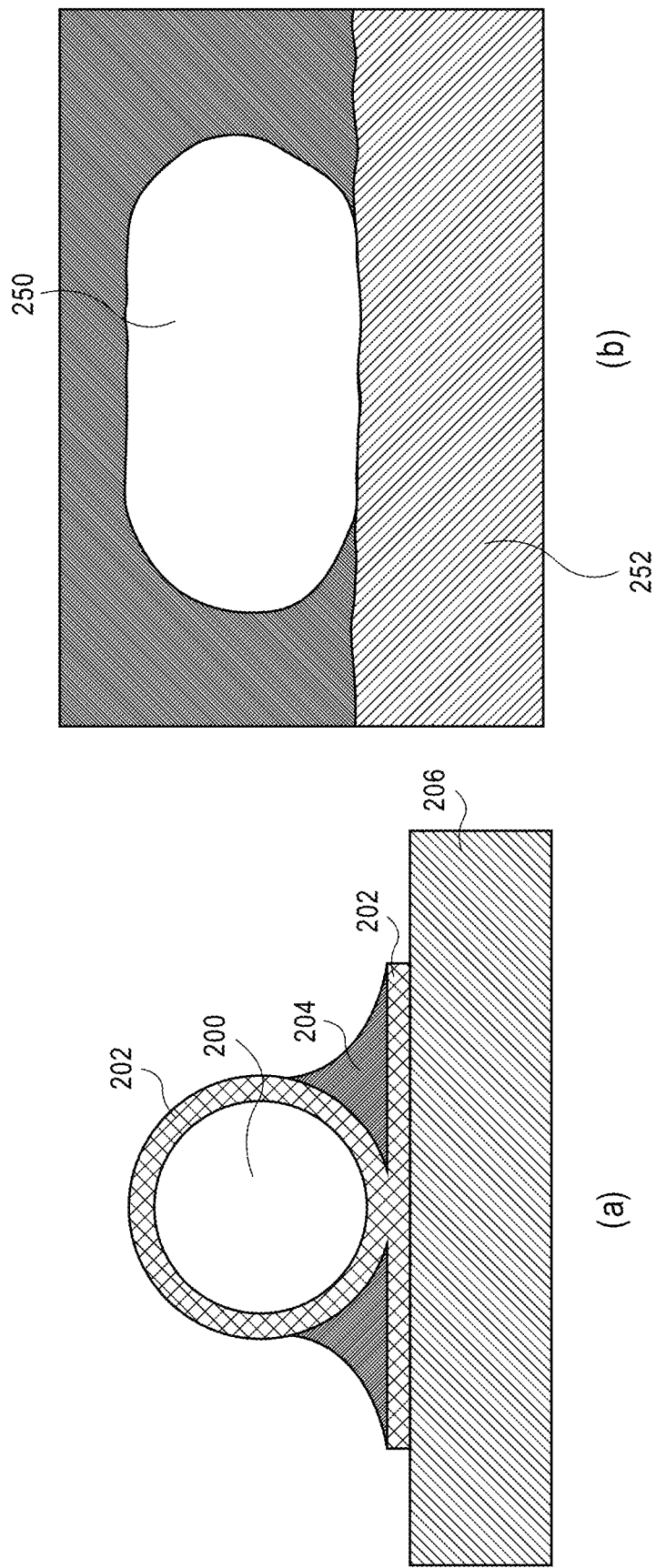
FIG. 2A illustrates cross-sectional views of (a) a conventionally bonded wire versus (b) a compressed wire, in accordance with an embodiment of the present disclosure.

Referring to part (a) of FIG. 2A, a conventionally bonded wire includes a wire 200 bonded through solderable layers 202 and/or a conductive adhesive or solder 204 to a silicon feature 206 such as a substrate or emitter layer. The wire 200 maintains a substantially circular shape. By contrast, referring to part (b) of FIG. 2A, a compression bonded wire (such as a thermally compressed wire) includes a wire 250 bonded directly to (i.e., in direct contact with) a silicon feature 252 such as a substrate or emitter layer. The wire 250 has a flattened shape with extended flat upper and lower surfaces and curved side surfaces. In an embodiment, the "flattened" wire shape is a flattened circular shape, as is depicted in part (b) of FIG. 2A. In other embodiments, starting wires have a square, rectangular, triangular, pseudo-square, or pseudo-triangular shape, and the resulting compressed wire is a flattened version of the corresponding shape. In yet other embodiments, triangular cross sections can be fabricated after bonding and, as such, a round wire is initially used that ends as rectangular or triangular shape with a flat bottom, matching the surface contours of the wafer. In one embodiment, the wire 250 of part (b) of FIG. 2A does not include an additional layer or a coating, e.g., in contrast to the wire 200 of part (a) of FIG. 2A which includes additional solderable layers 202.

In accordance with one or more embodiments of the present disclosure, a conductive wire makes direct contact with a silicon portion of a solar cell as a result of compression bonding, such as a thermocompression bonding process or a thermosonic or ultrasonic bonding process, but microscopic gaps are present between the bonded surfaces. As an example, FIG. 2B illustrates (c) a cross-sectional view of a compressed wire and (d) a plan view of a compressed wire, in accordance with an embodiment of the present disclosure.

Figure 2B:
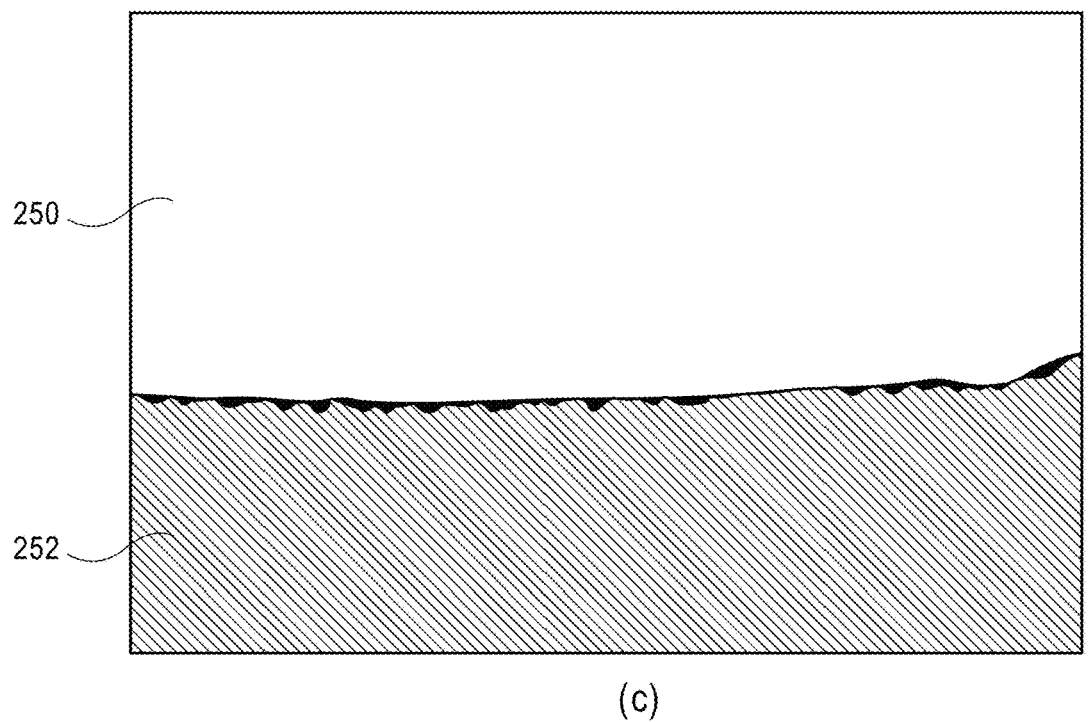
FIG. 2B illustrates (c) a cross-sectional view of a compressed wire and (b) a plan view of a compressed wire, in accordance with an embodiment of the present disclosure.
Figure 2B:
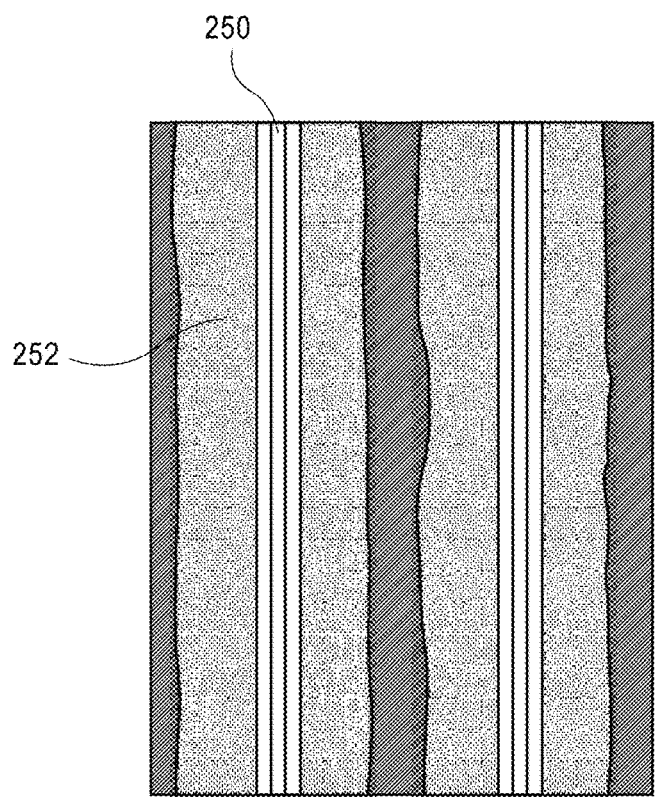

Referring to part (c) of FIG. 2B, a compression bonded wire (such as a thermally compressed wire) includes a wire 250 bonded directly to (i.e., in direct contact with) a silicon feature 252 such as a substrate or emitter layer. The wire 250 is considered directly and essentially continuously bonded to the silicon feature 252 even though voids, oxides, surface contaminants, or coated layers on the silicon (shown as dark regions) on the scale of a few microns can exist between the bonded surfaces. In an embodiment, the bulk material of the wire 252 is within 2 microns of the bulk material of the silicon feature 252 since no solder, flux, adhesive, polymer, or solderable layer is used for bonding.

Referring to part (d) of FIG. 2B, a plan view of the wire 250 is shown bonded to the silicon region 252. The wire has a substantially flat surface along the center of the wire. In an embodiment, the wire 250 is continuously bonded to silicon over a length of, e.g., greater than 10 mm, which is in contrast to a point bond resulting from a spot weld process. In another embodiment, the wire 250 has closely-spaced periodic regions of greater compression (as a result of periodic increases in downward force) to enhance adhesion.

Figure 3:
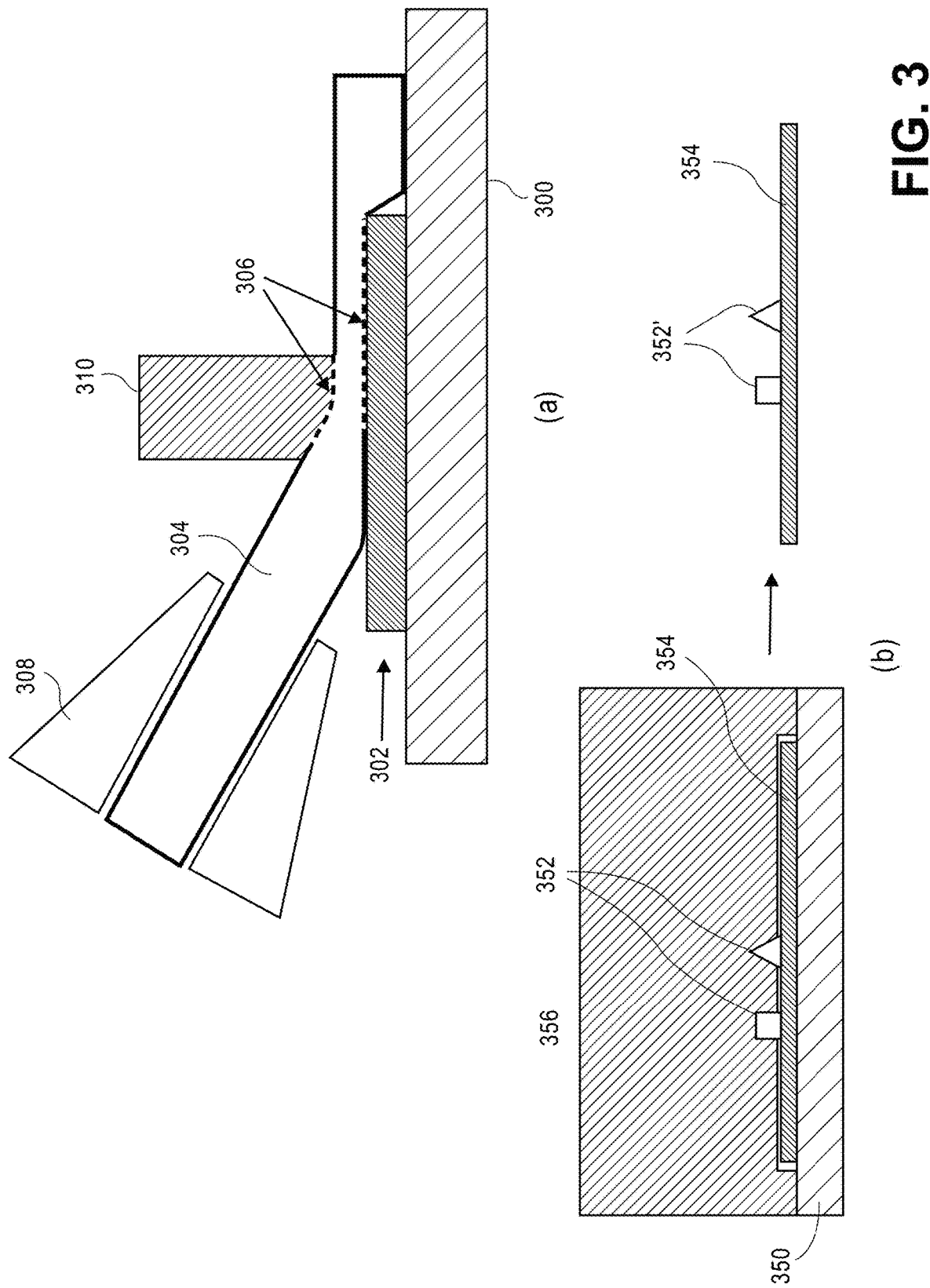
FIG. 3 includes schematics illustrating concepts of compression bonding of wires to solar cell surfaces, in accordance with an embodiment of the present disclosure.

FIG. 3 includes schematics illustrating concepts of compression bonding of wires to solar cell surfaces, in accordance with an embodiment of the present disclosure.

Referring to part (a) of FIG. 3, a wafer 302 is supported by a chuck 300 (e.g., a graphite vacuum chuck maintained at a temperature of, e.g., approximately in a range of 400-450 degrees Celsius, such as 420 degrees Celsius). As the wafer 302 is moved along the direction of the arrow, a conductive wire 304 is compressed against a surface of the wafer 302. Compression can involve oxide break-up 306 and can be effected using a pre-aligner 308. A fixed slider 310 applies pressure to the wire 304 and, in an embodiment, can be maintained at substantially the same temperature as the chuck 300.

Referring to part (b) of FIG. 3, incoming wires 352 are positioned on a surface of a substrate 354 which is supported by a chuck 350. The chuck 350 moves in a direction into the page and pushes the wires 352 against a fixed slotted bond head slider 356. Following bonding, the substrate 354 is provided with thermally compressed wires 352' thereon. In an embodiment, incoming wires are circular, but slots in the bond head are triangular or rectangular or trapezoidal, forcing the resulting metal finger to take that shape, similar to an extrusion process, as shown. In a particular embodiment, triangular fingers are of benefit for light capturing especially in a bifacial application.

Figure 4A:
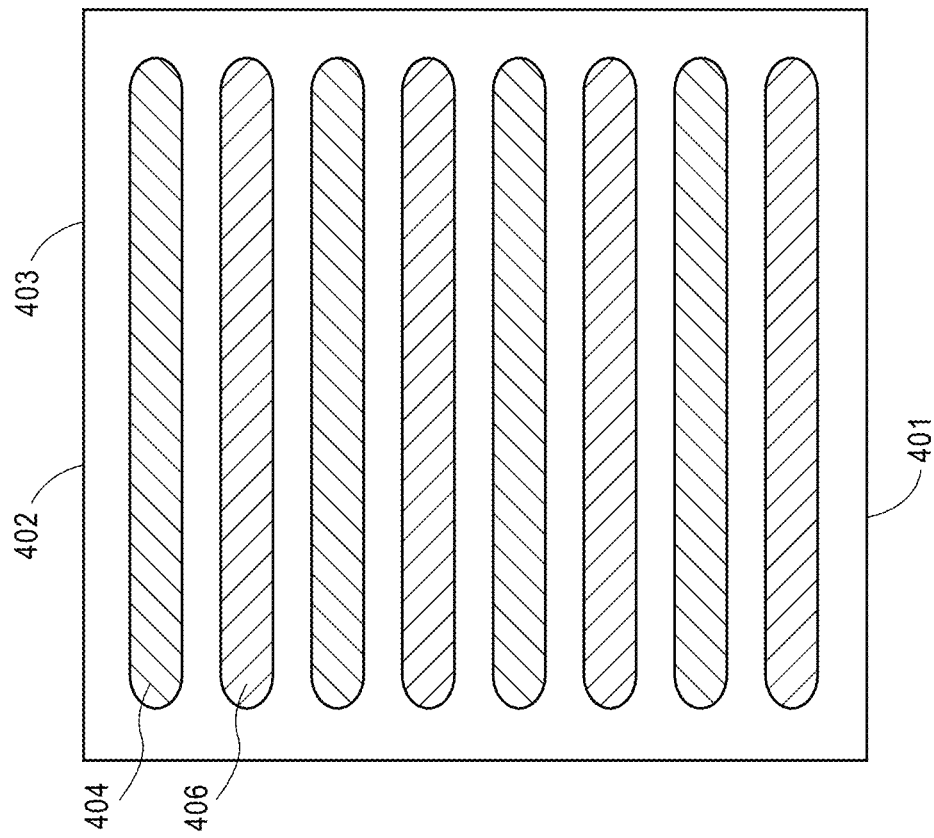
FIGS. 4A-4C illustrate plan views of various stages in a metallization and stringing method for back-contact solar cells, in accordance with an embodiment of the present disclosure.
Figure 4A:
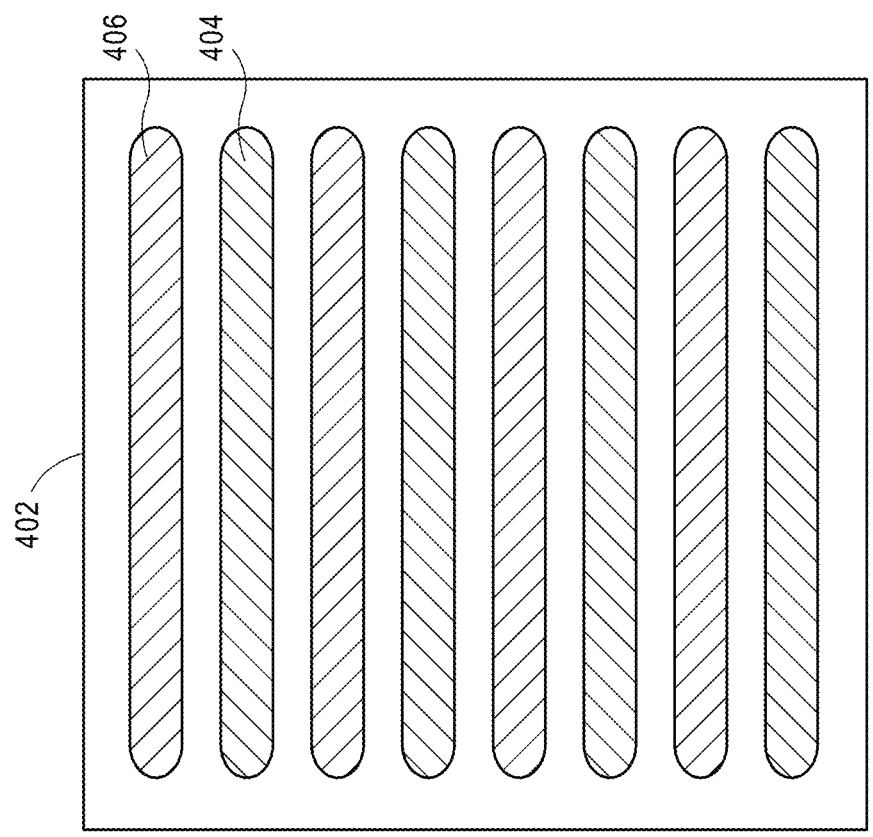
Figure 4B:
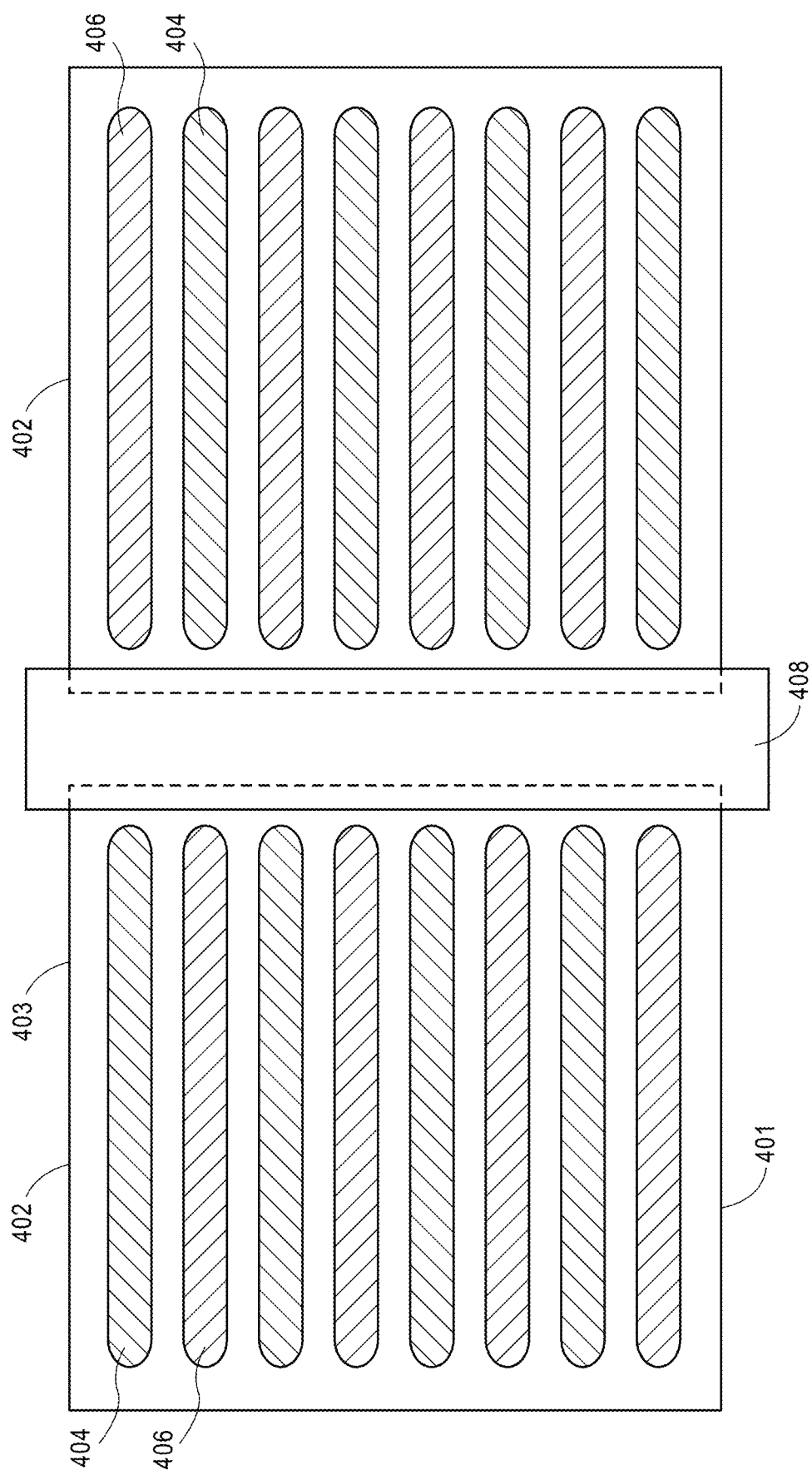
Figure 4C:
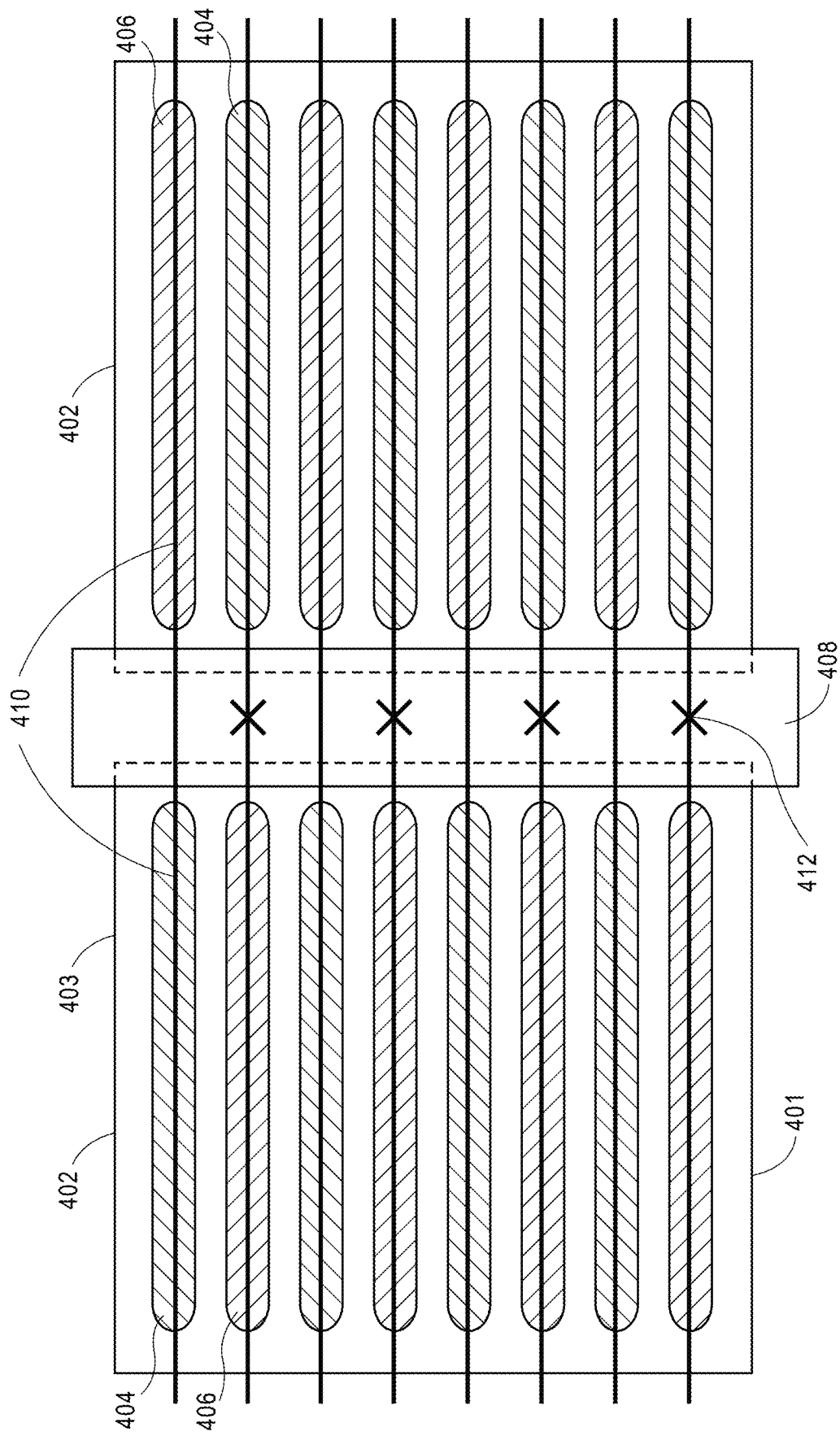

FIGS. 4A-4C illustrate plan views of various stages in a metallization and stringing method for back-contact solar cells, in accordance with an embodiment of the present disclosure.

FIG. 4A illustrates a back-side view of adjacent solar cells 402 that are to be stringed together, including alternating P-type doped diffusion regions 404 and N-type doped diffusion regions 406. In one such embodiment, each of the plurality of solar cells 402 is substantially rectangular, and the P-type doped diffusion regions 404 and the N-type doped diffusion regions 406 are substantially parallel to the edges 401, 403 of the solar cells 402. A solar cell that is substantially rectangular could be, for example, a square, or another rectangular shape, and can have standard, cut, or rounded corners. As illustrated in FIG. 4A, the solar cells 402 are asymmetric in the sense that the solar cells 402 end with a P finger on one side (e.g., side 403) and an N finger on the opposite side (e.g., side 401). The asymmetric solar cells can then be placed in alternating orientations along the string, as illustrated in FIG. 4A. The asymmetric solar cell design together with the alternating orientations along the string enable the use of wires that are parallel to the edges 401, 403 of the solar cells because the P finger on one of the solar cells is directly across from the N finger of the adjacent solar cell, as is explained below with respect to FIG. 4C.

Referring to FIG. 4B, a method of metallization and stringing includes attaching a non-conductive shield, tape or paint strip 408 to the back sides of the adjacent solar cells 402. The non-conductive shield, tape or paint strip 408 can serve to hide the wires when viewed from the front. Thus, the non-conductive shield covers exposed sections of the wires between each adjacent pair of the plurality of solar cells. Therefore, according to embodiments, the non-conductive shield, tape or paint strip 408 includes a material that is substantially opaque to sufficiently cloak the wires when viewed from the front. The non-conductive shield, tape or paint strip 408 can also assist in alignment of the solar cells, and/or holding the solar cells 402 together. The non-conductive shield, tape or paint strip 408 can include materials such as polypropylene or polyethylene, and can further include an adhesive layer like an acrylate. A non-conductive shield, tape or paint strip 408 with an adhesive layer can be beneficial to assist in alignment. Although a non-conductive shield, tape or paint strip 408 can be beneficial for the reasons explained above, other embodiments do not include a non-conductive shield (e.g., the non-conductive shield 408 can be optional).

Referring to FIG. 4C, the method of metallization and stringing includes aligning conductive wires 410 over the back sides of adjacent solar cells 402. In one embodiment, the wires 410 are aligned substantially parallel to the P-type doped diffusion regions 404 and N-type doped diffusion regions 406 of the solar cells 402. The wires 410 can have a cross-sectional shape that is round, flattened, slightly flattened, or another shape. Round wires can be beneficial because they can be rolled or twisted. In an embodiment involving the alignment and placement of round wires, the wires can be flattened prior to or during bonding the wires to the back side of each of the solar cells.

Conductive wires include an electrically conducting material (e.g., a metal such as aluminum, copper or another suitable conductive material), with or without a coating such as tin, silver, or nickel. In an embodiment, an organic solderability protectant is not used on the wires. In another embodiment, an organic solderability protectant is used on the wires. In the embodiment illustrated in FIG. 4C, the number of wires is equal to (or substantially equal to) the number of diffusion regions of each of the plurality of solar cells. In one example, the number of wires can be approximately between 5-15 wires, between 10-20 wires, between 15-25 wires, between 20-30 wires, between 25-35 wires, between 30-40 wires, between 35-45 wires, between 40-50 wires, or greater than 50 wires. In one such embodiment, a single wire is aligned over each of the P-type doped diffusion regions 404 and N-type doped diffusion regions 406 of the solar cells 402. According to one embodiment, each of the wires 410 is roughly centered over one of the P-type doped diffusion regions 404 and N-type doped diffusion regions 406 of the solar cells 402. As illustrated in FIG. 4C, the wires 410 can be aligned so that they are substantially parallel to the edges 401, 403 of the plurality of solar cells 402.

Referring again to FIG. 4C, the wires 410 can be aligned via a variety of mechanisms. For example, in one embodiment, aligning the conductive wires 410 over the back sides of adjacent solar cells 402 involves use of a grooved roller or a bond head. Other mechanisms can be used to align the conductive wires 410 over the P-type doped diffusion regions 404 and N-type doped diffusion regions 406 of the solar cells 402 instead of, or in addition to, a grooved roller or a bond head. For example, according to one embodiment, a reed, or other mechanism suitable for aligning and guiding the conductive wires can be used. When aligning wires over a solar cell that is not the first solar cell, the presence of wires bonded to the first solar cell can assist in alignment of the wires over the subsequent solar cells, in accordance with an embodiment.

After aligning the conductive wires 410, the conductive wires are bonded to the back side of the solar cells 402 the P-type doped diffusion regions 404 and N-type doped diffusion regions 406 of the solar cells 402, e.g., using thermocompression bonding or ultrasonic bonding approaches as described herein. Referring again to FIG. 4C, according to one embodiment, the method of metallization and stringing includes cutting every other one of the wires 410 between each adjacent pair of the solar cells 402. As illustrated in FIG. 4C, the wires 410 are cut at the locations 412, such that all of the wires connected to the P-type diffusion on one side of a solar cell 402, and all of the wires connected to the N-type diffusion of the opposite side of the solar cell are cut. Prior to cutting the wires 410 in the locations 412, the pair of solar cells are shorted. Cutting the wires 410 enables electrically coupling the solar cells for collection of current from the solar cell string. Cutting the wires 410 in the locations 412 can involve any wire cutting technique. For example the wires 410 can be cut in the locations 412 with a laser or a blade. Although the FIGS. 4A-4C illustrate only two solar cells, a solar cell string can include any number of solar cells stringed together (e.g., 2 or more solar cells stringed together). The process is continuous in the sense that arbitrarily long strings of solar cells can be made.

In another embodiment, conduction in the diffusion regions occurs perpendicular to the direction of the wires (e.g., a 1-D grid of p- and n-regions has an overlying 1-D grid of wires that are bonded perpendicular thereto, but where a single wire only contacts either the n- or p-regions, as controlled by openings in a dielectric).

Figure 5:
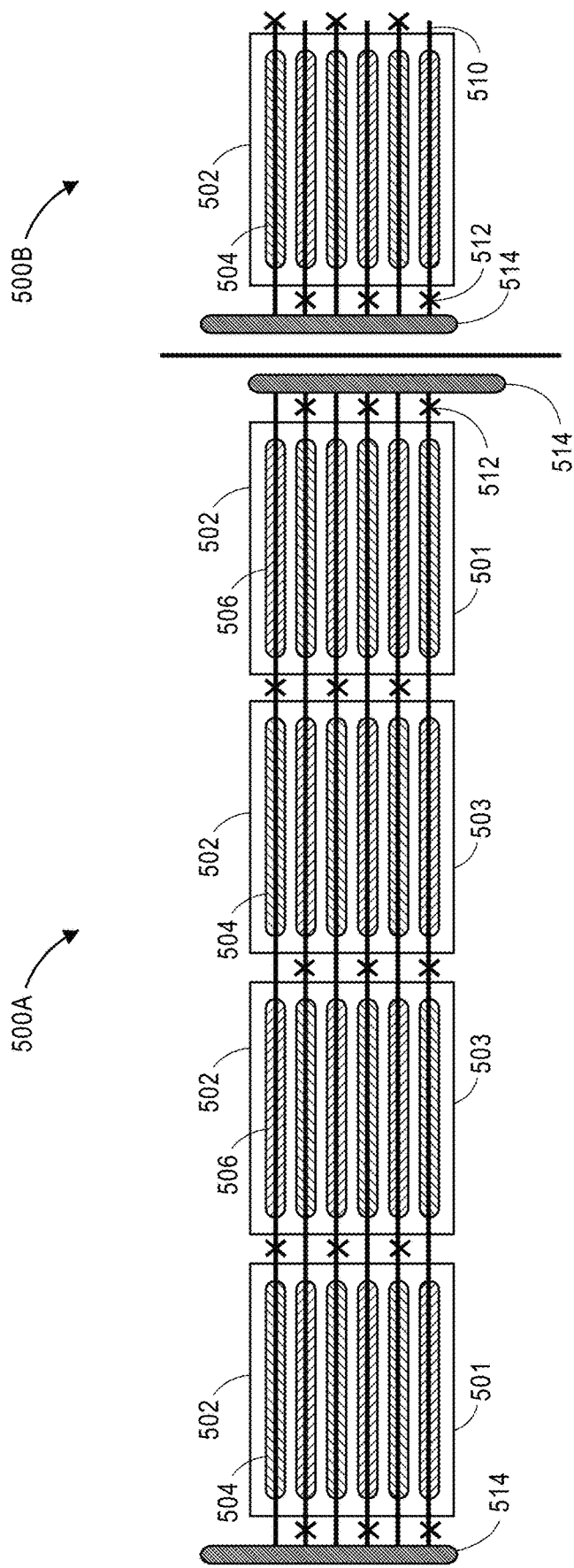
FIG. 5 illustrates a string of solar cells, in accordance with an embodiment of the present disclosure.

FIG. 5 illustrates one example of a string of solar cells, in accordance with an embodiment of the present disclosure. The solar cell string 500A illustrated in FIG. 5 includes a plurality of solar cells 502 that are electrically coupled together in series. The solar cell string 500A has two end solar cells 501, and inner solar cells 503 connected in series between the two end solar cells 501. Each of the two end solar cells 501 is electrically coupled with a busbar 514. At each of the end solar cells 501, every other one of the wires is coupled with a busbar 514 to couple only one of the two electrodes of the end solar cell, either the P-type doped diffusion regions 504 or the N-type doped diffusion regions 506. In one embodiment, the coupling of every other one of the wires from an end solar cell 501 with a busbar 514 can be achieved by first cutting all the wire at each end of the string, and connecting only the wires for either the P-type or N-type doped diffusion regions. Alternatively, all the wires for an end solar cell 501 can first be connected to a busbar 514, and then every other wire can be cut.

Only the end solar cells 501 are connected to a busbar 514, in contrast to other stringing techniques which can involve attaching busbar(s) to each solar cell, according to some embodiments. The busbars 514 can couple the solar string 500A with another solar string (e.g., such as the solar string 500B), or to another circuit (e.g., a circuit outside the module through a junction box).

As illustrated in FIG. 5, in one embodiment, a given cut section of wire is to electrically couple at most two solar cells together in series, wherein the P-type doped diffusion area of one of the two solar cells is connected to the N-type doped diffusion area of the other solar cell. However, other embodiments can include more than two solar cells being coupled together with a given cut section of wire. For example, if solar cells are connected in parallel, it is possible to connect more than two cells with a given cut section of wire. Also as illustrated in FIG. 5, in one embodiment, a cut section of wire that electrically couples an end solar cell 501 to the busbar 514 couples a single solar cell to the busbar 514. However, as mentioned above, in embodiments that connect solar cells in parallel, a given cut section of wire can connect more than a single solar cell to the busbar. Thus, a solar string can be created using the plurality of wires 510 by aligning and bonding the wires over the P-type and N-type doped diffusion regions of each of the solar cells, followed by cutting some of the wires to achieve the desired configuration of solar cells in a string.

Thus, in accordance with one or more embodiments of the present disclosure, a stringing method provides a structure having compressed wires where every second wire is cut between wafers and busbars at ends. It is to be appreciated that portions of the compressed wires between solar cells are not compressed. In an embodiment, the wires that are not cut between solar cells have a different cross-section on the solar cells than between the solar cells. As an example, FIG. 6A is an image of a region between two solar cell portions and a corresponding illustrated plan view of two such solar cells, in accordance with an embodiment of the present disclosure.

Figure 6A:
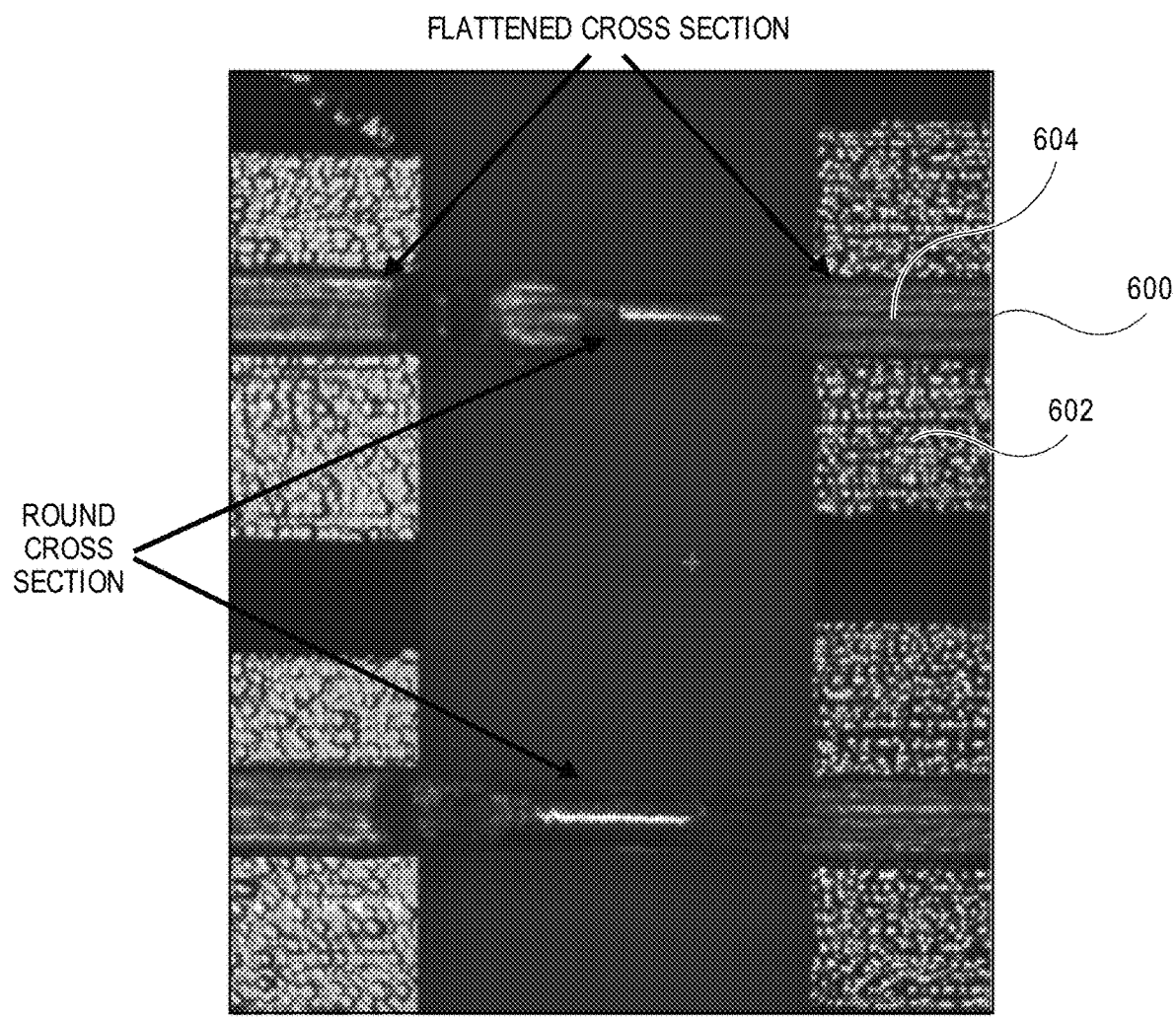
FIG. 6A is an image of a region between two solar cell portions and a corresponding illustrated plan view of two such solar cells, in accordance with an embodiment of the present disclosure.
Figure 6A:
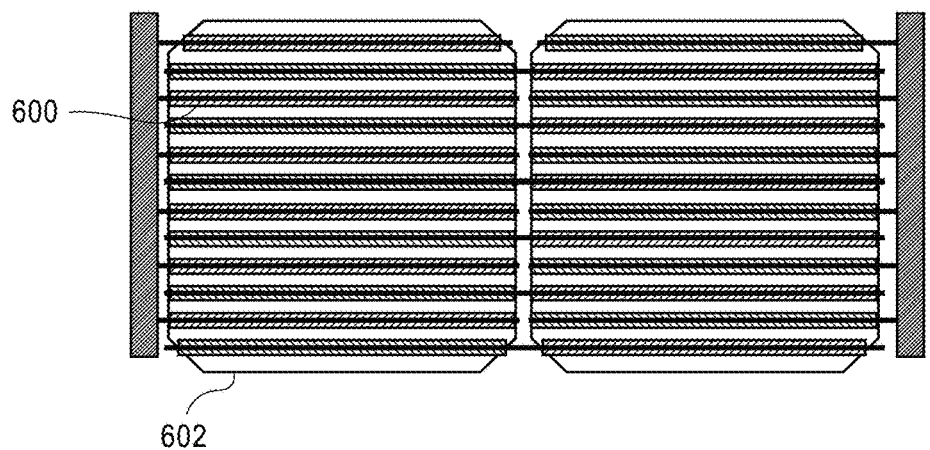

Referring to FIG. 6A, solar cells 602 include wires 600 thereon and there between. In one such embodiment, every other wire 600 is cut between cells 602. For wires that are not cut, the wire 600 has an essentially circular cross-sections between solar cells 602, and has a flattened circular cross-sectional profile on the solar cell 602 where the wires 600 have been compressed (e.g., thermally or ultrasonically) to the solar cells 602. In an embodiment, each wire 600 has a surface with microgrooves 604 along a length of the wire 600, as is depicted. In one such embodiment, the microgrooves 604 are formed in the wires 600 by a wire guide during guiding of the wires 600 in alignment with the cells 602.

Figure 6C:
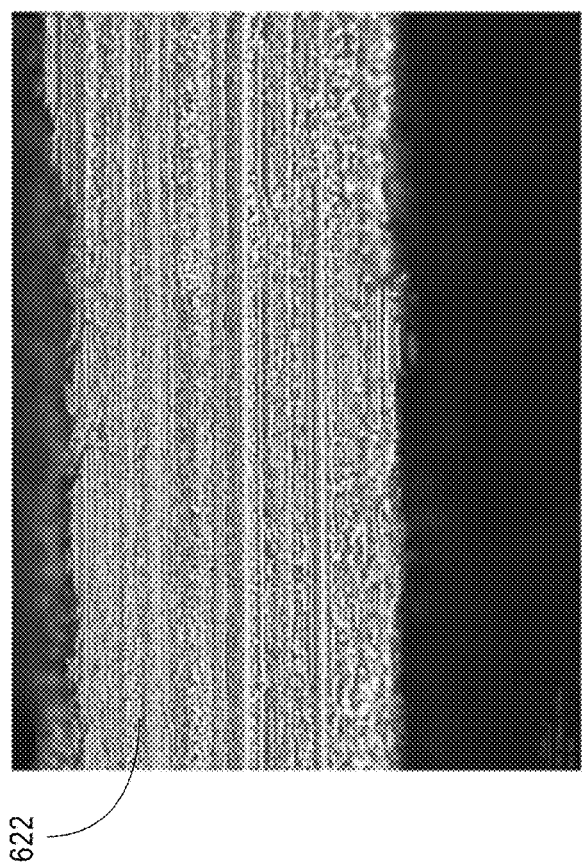
FIGS. 6B and 6C are images showing surface texture of a smooth round wire prior to bonding and a wire with microgrooves after bonding, respectively, in accordance with an embodiment of the present disclosure.
Figure 6B:
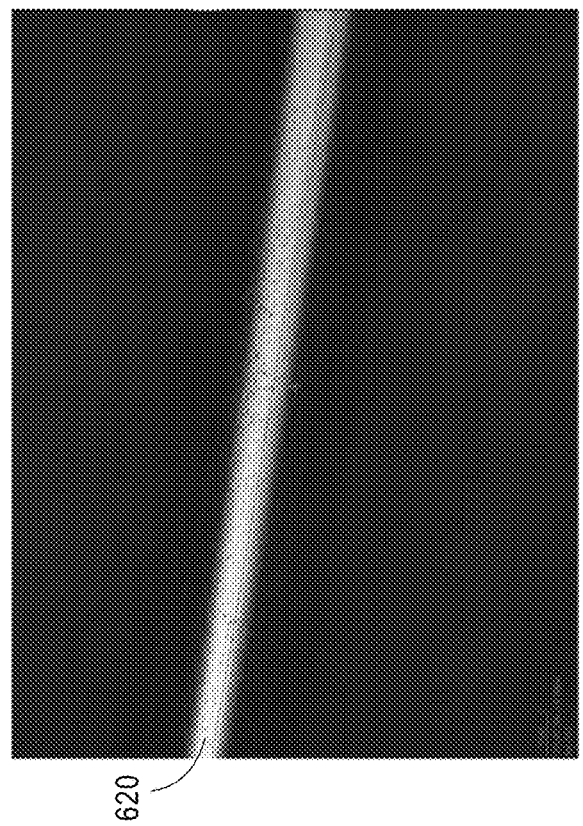

It is to be appreciated that microgrooves 604 can be formed as a result of a stringing and/or bonding process. As an example, FIGS. 6B and 6C are images showing surface texture of a smooth round wire 620 prior to bonding and a wire 622 with microgrooves after bonding, respectively, in accordance with an embodiment of the present disclosure. The microgrooves of wire 622 can be formed as part of the wire to cell bonding process.

With reference again to FIG. 6A, two interconnected cells can each have associated bus bars. As an example, FIG. 6D illustrates a cell to cell interconnect for two adjacent cells, in accordance with an embodiment of the present disclosure.

Figure 6D:
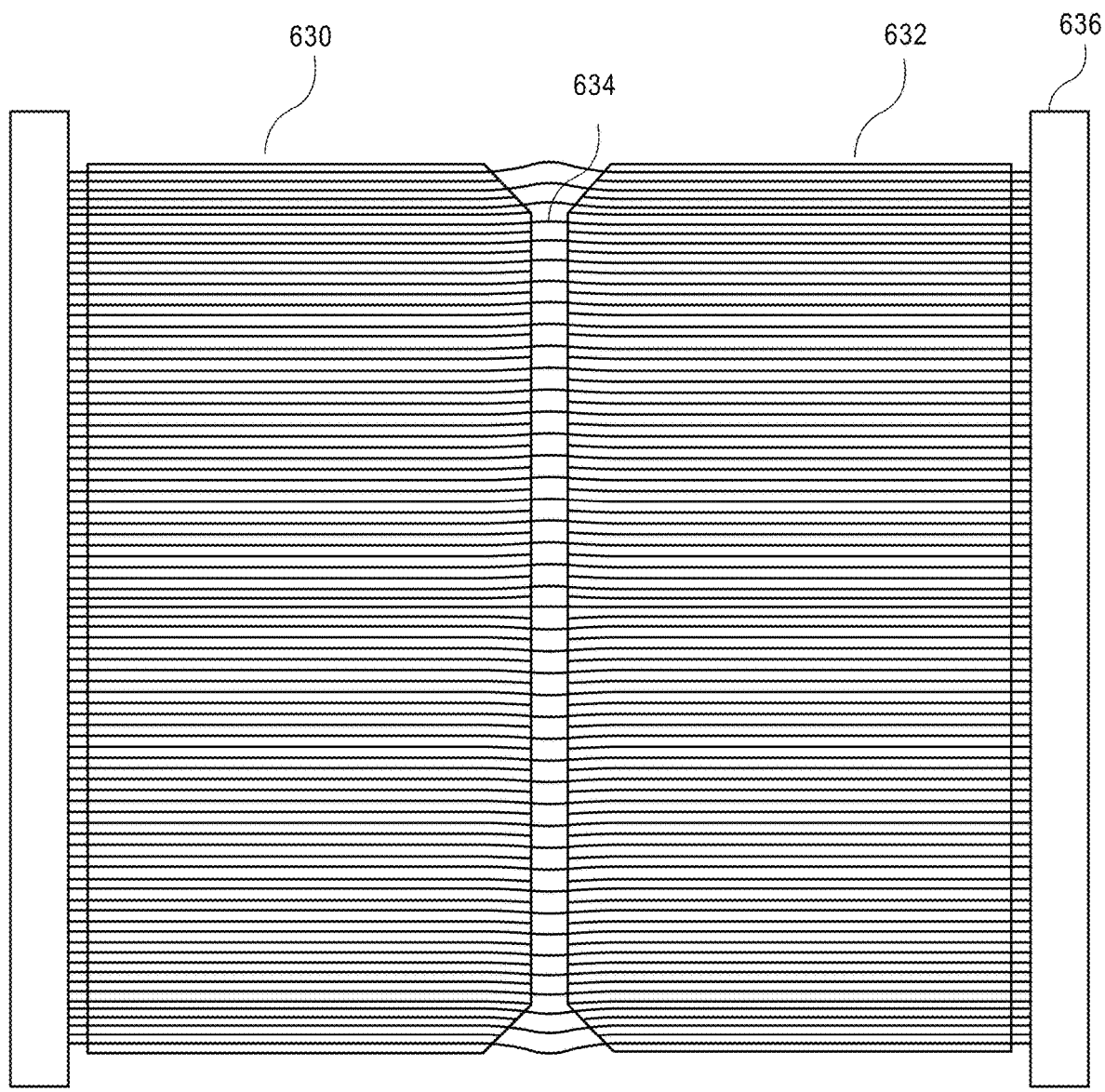
FIG. 6D illustrates a cell to cell interconnect for two adjacent cells, in accordance with an embodiment of the present disclosure.

Referring to FIG. 6D, a first half solar cell portion 630 is interconnected to a second half solar cell portion 632 by wires 634. In an embodiment, wires 634 include a strain relief features between cells 630 and 632, where every second wire is cut and the wires are bent in the plane of the cells 630 and 632. As described in association with FIG. 6A, in accordance with an embodiment of the present disclosure, the portions of wires 634 between cell portions 630 and 632 are essentially round and smooth, while the portions of wires 634 are flattened to a certain extent and have microgrooves formed therein. In an embodiment, as is depicted, each of the half solar cell portions 630 and 632 has an associated busbar 636.

In another aspect, compression of a wire is not directly to a silicon surface but rather to a metal seed layer on the silicon surface. For example, FIGS. 7A and 7B illustrate a plan view of the back side of a solar cell having wire-based metallization, and a corresponding cross-sectional view, in accordance with an embodiment of the present disclosure.

Figure 7A:
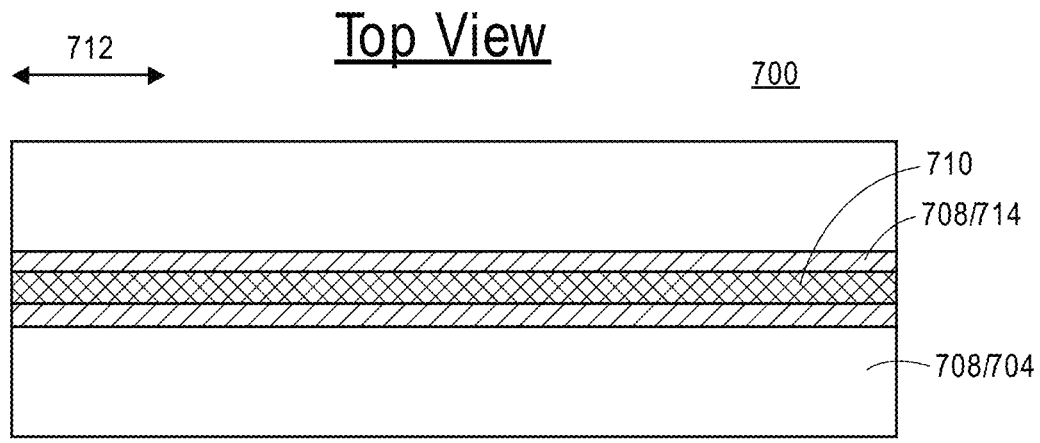
FIG. 7A illustrates a plan view of the back side of a solar cell having wire-based metallization, in accordance with an embodiment of the present disclosure.
Figure 7B:
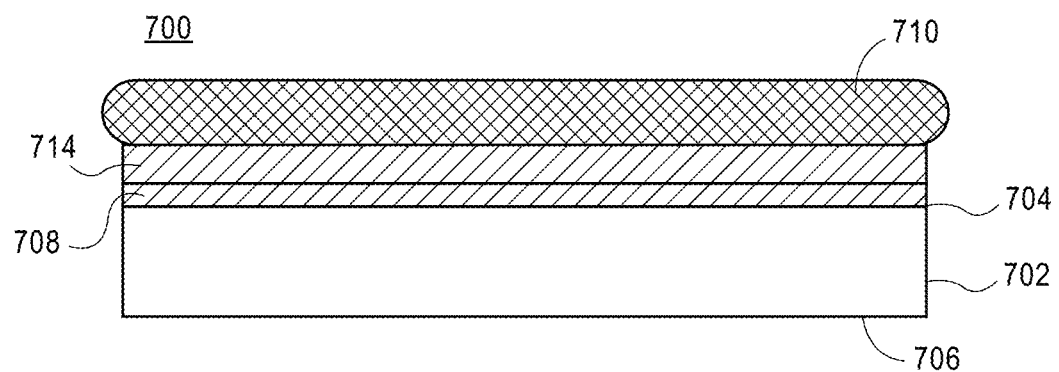
FIG. 7B illustrates a cross-sectional view corresponding to the solar cell of FIG. 7A.

Referring to FIGS. 7A and 7B, a portion 700 of a solar cell includes a substrate 702 having a back surface 704 and an opposing light-receiving surface 706. A plurality of N-type and P-type semiconductor regions (one such regions shown as 708) is disposed in or above the back surface 704 of the substrate 702. A conductive contact structure is disposed on the plurality of N-type and P-type semiconductor regions 708. The conductive contact structure includes a plurality of conductive wires (one conductive wire shown as 710). Each conductive wire 710 is bonded to the solar cell at bonding points. Each conductive wire 710 of the plurality of conductive wires is parallel along a first direction 712 to form a one-dimensional layout of a metallization layer for the portion 700 of a solar cell.

In an embodiment, as is depicted in FIGS. 7A and 7B, the conductive contact structure further includes a metal seed layer 714 (e.g., an M1 layer) disposed between the plurality of N-type and P-type semiconductor regions 708 and the plurality of conductive wires 710. In some embodiment including a metal seed layer 714, the conductive wires can be soldered or welded (e.g., with a laser) to the metal seed layer 714. In an embodiment, the metal seed layer 714 is an aluminum seed layer. In one such embodiment, the aluminum layer has a thickness of approximately between 50-150 nanometers, between 100-200 nanometers, between 150-250 nanometers, between 200-300 nanometers, between 250-350 nanometers, between 300-400 nanometers, between 350-450 nanometers, or between 400-500 nanometers, and includes aluminum in an amount greater than approximately 97% and silicon in an amount in the range of approximately 0-2%. In other embodiments, the metal seed layer 714 includes a metal such as, but not limited to, nickel, silver, cobalt, titanium, or tungsten.

It is to be appreciated that there can be different approaches when including an M1 layer: (1) the M1 is structured by etching after the wire is bonded. In this case, the M1 is effectively an interlayer and is structured by etching after the wire is bonded (with the wire serving to protect the metal seed layer beneath). In this case, the M1 layer can be very thin since it only acts to improve the bond and there is no need to have a separate seed patterning step other than a very short etch after the wires are placed. However, a relatively larger number of wires can be needed since the collection between the wires is in the semiconductor or in the polysilicon (though, as noted below, the polysilicon and doping areas could be interdigitated to allow for an intermediate number of wires). In another approach (2) the M1 is designed for collection between the wires, which can be compatible with an interdigitated pattern or a pattern where an M1 layer is parallel to the wires, but wider than the wires. In an embodiment, a higher number of collection wires allows the M1 to be relatively thin. In an example, the number of wires can be between 5-15 wires, between 10-20 wires, between 15-25 wires, between 20-30 wires, between 25-35 wires, between 30-40 wires, between 35-45 wires, between 40-50 wires, or greater than 50 wires.

Figure 8:
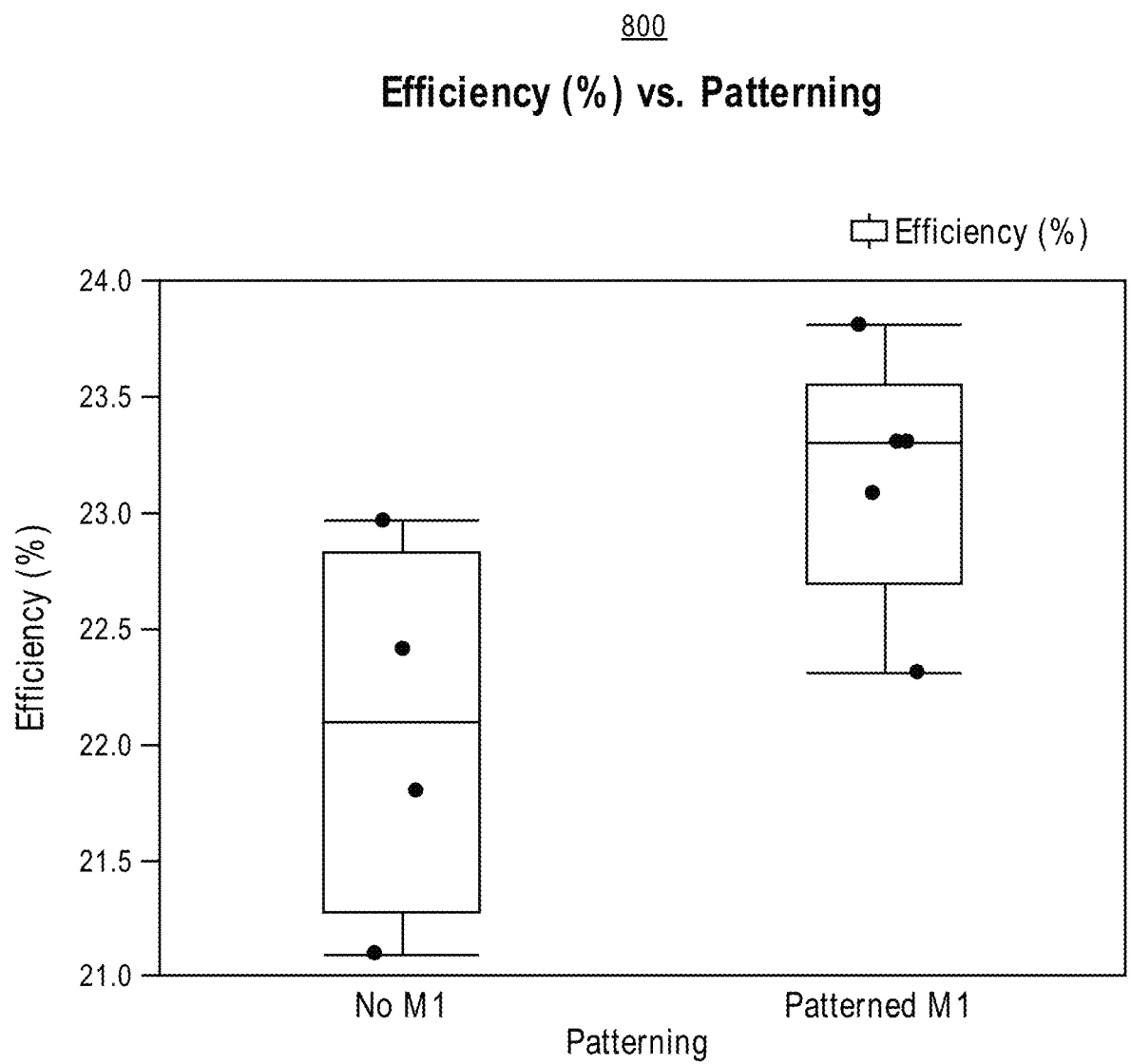
FIG. 8 is a plot of solar cell efficiency (%) for a solar cell having a conductive wire compressed to silicon surface without an intervening M1 layer versus a solar cell having a conductive wire compressed to silicon surface having an intervening fishbone patterned M1 layer, in accordance with an embodiment of the present disclosure.
Figure 9:
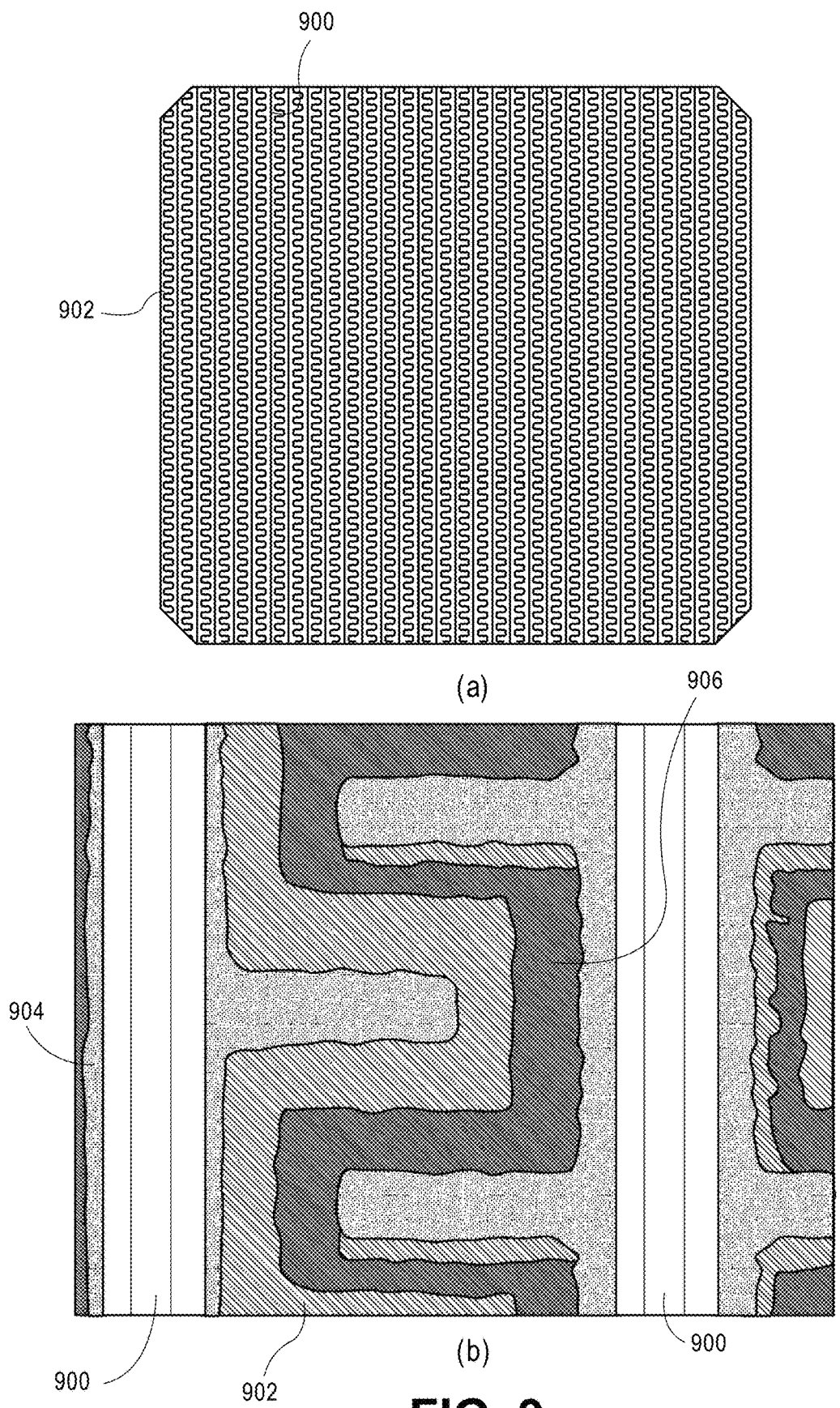
FIG. 9 illustrates plan views of (a) a complete solar and (b) a portion of a cell having conductive wires and a fishbone patterned M1 layer, in accordance with an embodiment of the present disclosure.

FIG. 8 is a plot 800 of solar cell efficiency (%) for a solar cell having a conductive wire compressed to silicon surface without an intervening M1 layer versus a solar cell having a conductive wire compressed to silicon surface having an intervening fishbone patterned M1 layer, in accordance with an embodiment of the present disclosure. FIG. 9 illustrates plan views of (a) a complete solar and (b) a portion of a cell having conductive wires and a fishbone (interdigitated finger) patterned M1 layer, in accordance with an embodiment of the present disclosure.

Referring to FIG. 9, a solar cell includes a seed layer (M1) layer 902 having a fishbone pattern. A plurality of such fishbone patterns is staggered with one another. A conductive wire 900 runs parallel with a longitudinal direction of each fishbone pattern of the M1 layer. In a particular embodiment, the pitch of the wires 900 is approximately 1.0-1.5 mm such as 1.2 mm. The M1 layer can be on a larger silicon emitter region 904, such as a polysilicon regions. Trenches 906 can be formed between such polysilicon regions. As seen in plot 800, such an arrangement provides a highly efficient solar cell. In other embodiments, a continuous polysilicon layer or region is used. In another embodiment, an M1 layer is excluded, and the polysilicon emitter layer has a fishbone pattern, effectively providing a seedless fishbone pattern.

In accordance with one or more embodiments of the present disclosure, folded busbars are achieved by using a wire-based metallization. As an example, FIG. 10 illustrates cross-sectional views of (a) solar cells prior to busbar folding and (b) solar cells after busbar folding, in accordance with an embodiment of the present disclosure.

Figure 10:
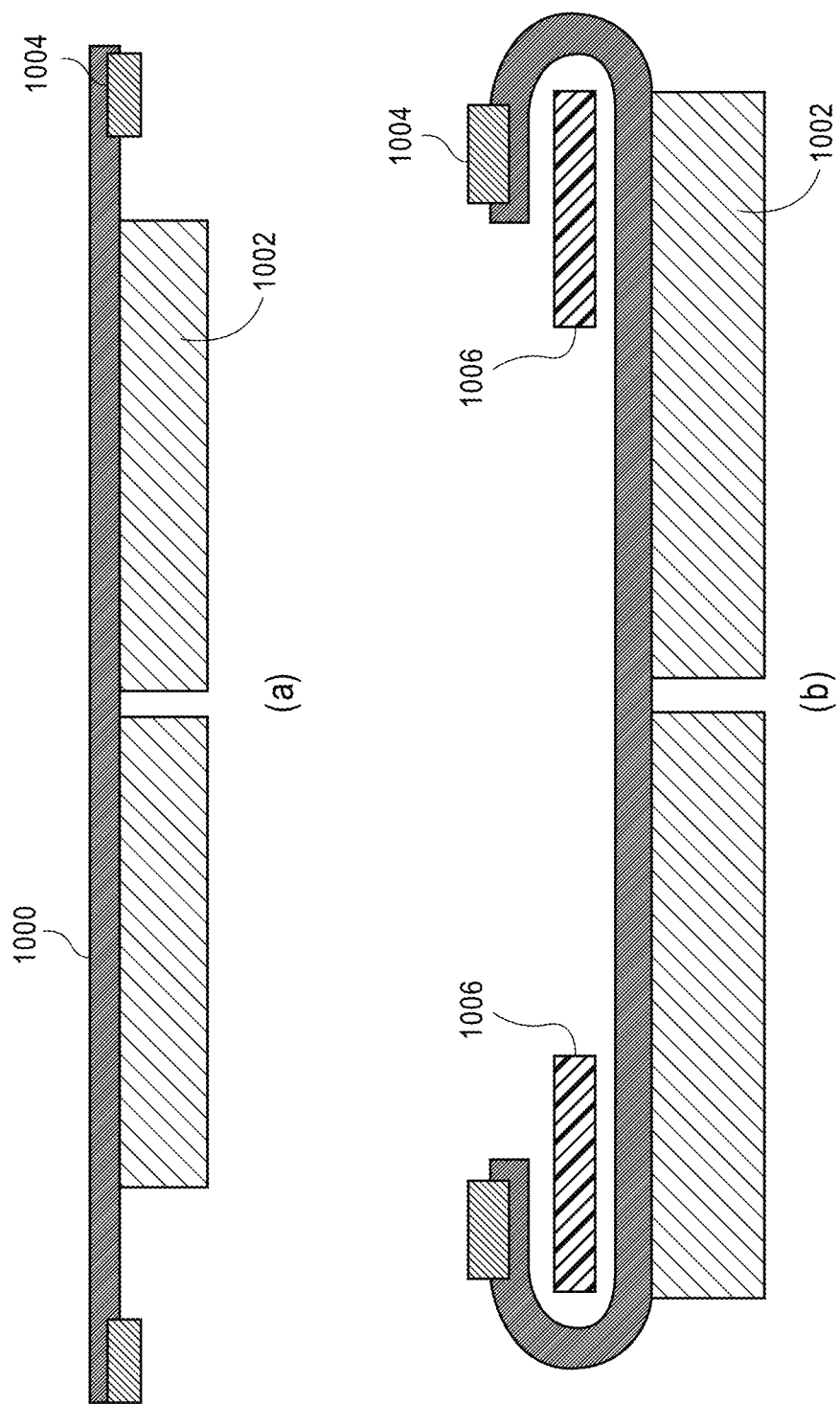
FIG. 10 illustrates cross-sectional views of (a) solar cells prior to busbar folding and (b) solar cells after busbar folding, in accordance with an embodiment of the present disclosure.

Referring to part (a) FIG. 10, solar cells 1002 have wire metallization 1000 thereon and stringing the solar cells 1002. Busbars 1004 are included at the ends of the wire metallization 1000. Referring to part (b) FIG. 10, the busbars 1004 are folded over a footprint of the solar cells 1002. An insulator feature 1006 can be included to isolate the folded portion of the wire metallization 1000 from the wire metallization 1000 on the solar cells 1002, as is depicted.

Thus, wire-based metallization can enable fabrication of busbars that are folded in behind cells to reduce overall module size and thus increase module efficiency. An insulator is placed between the busbar and the cell backside to prevent shorting. In another embodiment, instead of folding the wires back onto a busbar a conductive piece with a patterned insulator that allows for connection to alternating wires (so only those connected to n-wires on one end). In either this or the folded approach, the conductive pieces at the end of each of two cells could be joined together by a separate interconnect, or the wires could be terminated at one end of each cells (with a folding or an insulated piece) then joined directly to an adjoining cell using the wires which extend beyond the edge of that adjoining cell.

In accordance with one or more embodiments of the present disclosure, a bond head is used for wire-based metallization where each wire is aligned and compressed by a heated bond head. The bond head can be fixed onto a heated bond head and can be held at a fixed distance above the wafer (e.g., approximately 5-50 microns). Use of a bond head can enable precise control of wire placement on a wafer so that wires are aligned to corresponding emitter fingers.

In one embodiment, a solar cell can have a busbar on one end of the solar cell and wire metallization extending outward from the other end. In an embodiment, the wire metallization on the other end can be electrically connected to a busbar of another solar cell. In an example, the wire metallization of the solar cell can be located on or in contact with the busbar of another solar cell. A plurality of solar cells can be connected in this a manner to form a solar cell string (e.g., two or more solar cells can be connected in series by placing the metallization on one end of one solar cell in contact with a busbar at one end of another solar cell).

Figure 11B:
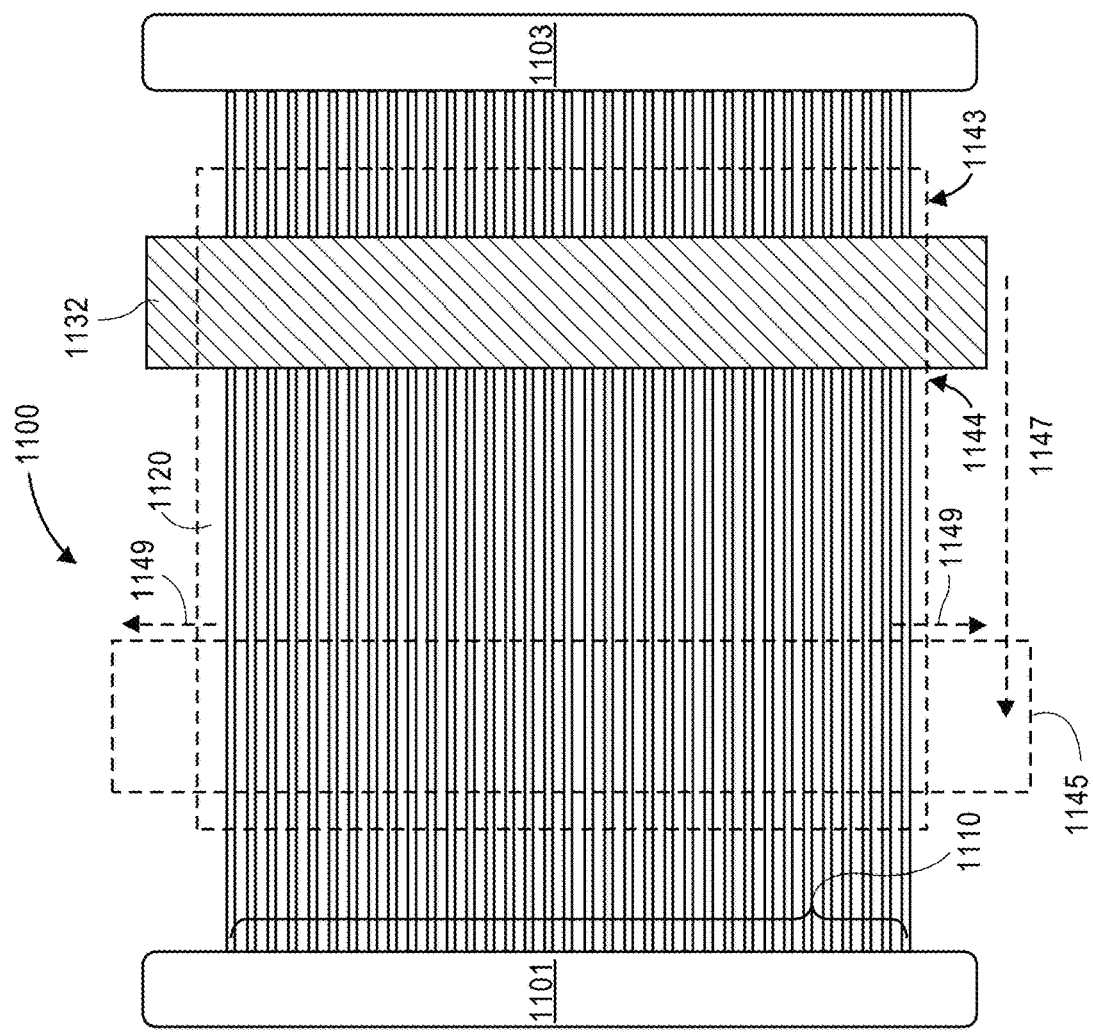
FIGS. 11A and 11B illustrate plan views of various stages in a metallization method for solar cells and for coupling solar cells, in accordance with an embodiment of the present disclosure.
Figure 11A:
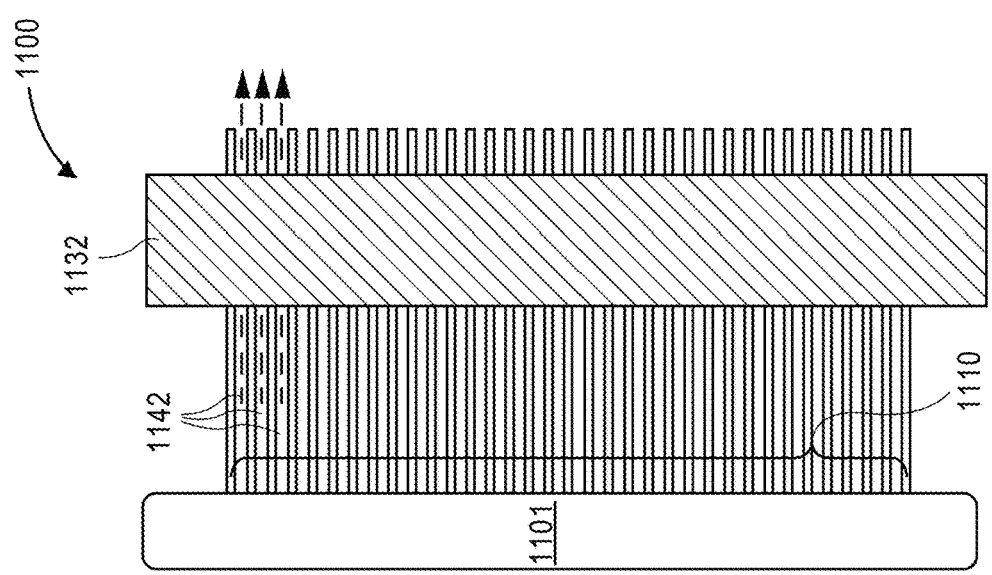

In an exemplary bonding scheme, FIGS. 11A and 11B illustrate plan views of various stages in a metallization method for solar cells and for coupling solar cells, in accordance with an embodiment of the present disclosure.

Referring to FIG. 11A, conductive wires 1110 can be placed 1142 in a bond head 1132. Also, a bonding tool 1100 for bonding conductive wires 1110 to a semiconductor substrate (1120 of FIG. 11B) is shown. In an embodiment, the conductive wires 1110 can include an electrically conducting material (e.g., a metal such as aluminum, copper or another suitable conductive material, with or without a coating such as tin, silver, nickel or an organic solderability protectant). In one embodiment, the conductive wires 1110 can be unrolled from a conveyor unit 1101 and subsequently placed 1142 in the bond head 1132. In some embodiments, block 1101 can instead represent a wire guide, here the conductive wires 1110 can be aligned into the bond head 1132 using the wire guide 1101. In an example, the wire guide 1101 can include wires dispensed from a plurality of grooves, where the grooves allow for the alignment of the conductive wires 1110 into the bond head 1132.

With reference to 11B, the conductive wires 1110 can be aligned 1144 over the semiconductor substrate 1120, according to some embodiments. In one embodiment, the semiconductor substrate 1120 is a solar cell. In an embodiment, the bond head 1132 can include a plurality of openings. In an example, the plurality of openings can allow for the alignment 1144 of the conductive wires over semiconductor substrate 1120. In an embodiment, the bond head 1132 can align the conductive wires 1110 to the semiconductor substrate 1120. In one embodiment, the bond head 1132 allows for the conductive wires 1110 to be placed over a semiconductor substrate 1120. In some embodiments, the components of the bond head 1132 can include stainless steel, ceramic or graphite.

With reference again to FIG. 11B, the conductive wires 1110 can be bonded to the semiconductor substrate 1120, according to some embodiments. In an embodiment, the bond head 1132 can be used to bond the conductive wires 1110 to the semiconductor substrate 1120. In an embodiment, the bond head 1132 can effect thermocompression bonding. In an embodiment, bond head 1132 can bond the conductive wires 1110 from a first location 1143 to a second location 1145 along a bonding path 1147. In an example, as depicted in FIG. 11A, a continuous length of the conductive wires 1110 can be placed 1142 into the bond head 1132 from a first conveyor unit 1101. Subsequent to placing the conductive wires 1110 into the bond head 1132, referring to FIG. 11B, the conductive wires 1110 can be placed into a wire grip unit 1103, where both the conveyor unit 1101 and the wire grip unit 1103 can hold the conductive wires in place during the bonding. Subsequent to placing the conductive wires 1110 into the wire grip unit 1103, the conductive wires 1110 can be bonded to the semiconductor substrate 1120 along the bonding path 1147. In an embodiment, the bond head 1132 inhibits lateral movement 1149 of the conductive wires 1110 during the bonding 1147. In an example, the bond head 1132 can inhibit the conductive wires 1110 from moving and/or inhibits misalignment of the conductive wires during the bonding process. As shown in FIG. 11B, in an example, the lateral movement 1149 can be perpendicular to the bonding movement and/or path 1147.

Figure 12A:
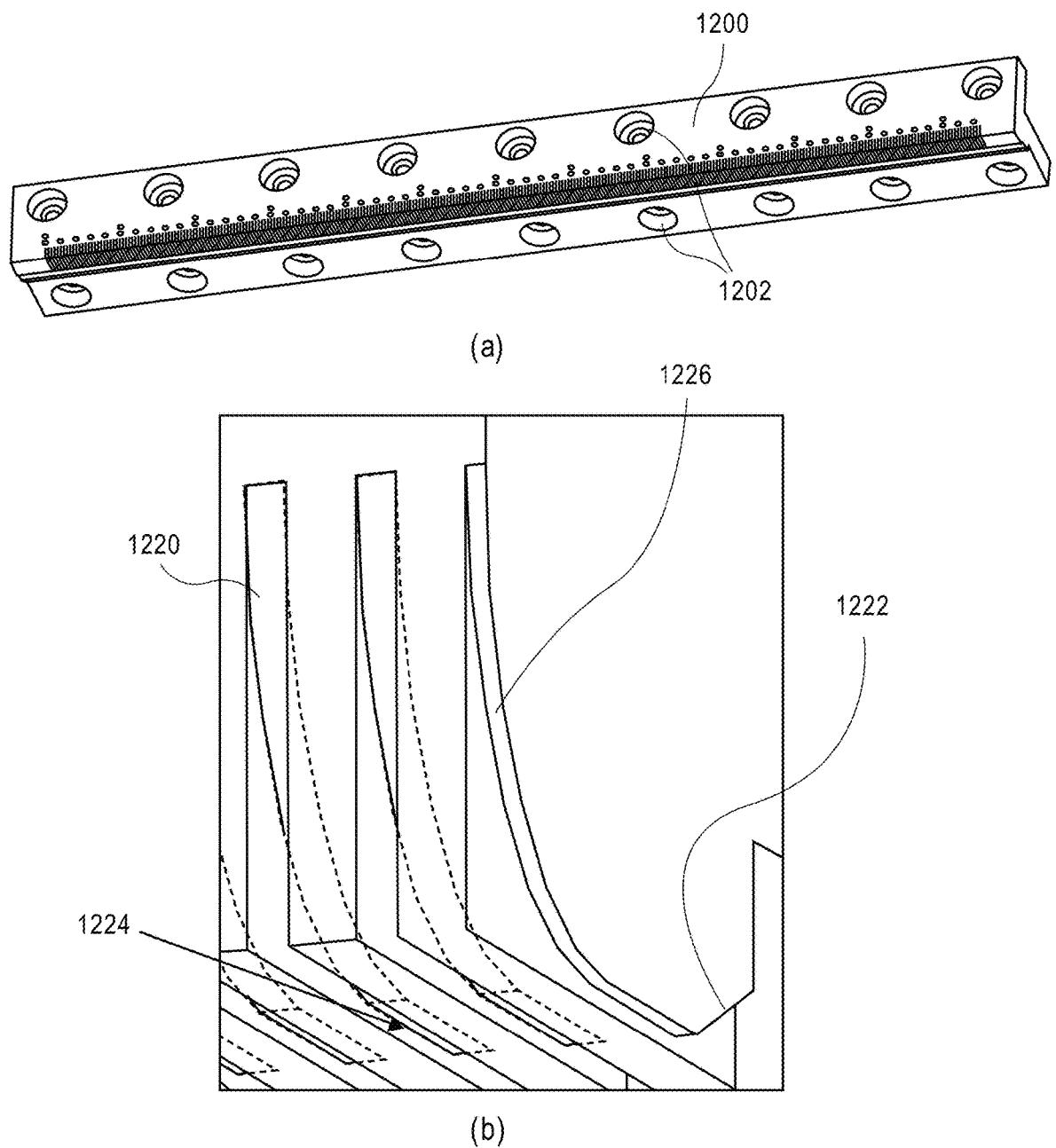
FIG. 12A illustrates (a) a bond head and (b) a schematic of wire travel through a bond head, in accordance with an embodiment of the present disclosure.

FIG. 12A illustrates (a) a bond head and (b) a schematic of wire travel through a bond head, in accordance with an embodiment of the present disclosure.

Referring to part (a) of FIG. 12A, a bond head 1200 includes openings 1202 therein for individual wire accommodation. Referring to part (b) of FIG. 12A, a wire path 1226 includes an entry slot 1220 and an exit slot 1222. A compression region 1224 is between the entry slot 1220 and the exit slot 1222. In an embodiment, the entry slot 1220 has a slightly wider diameter than the wire diameter, the compression region, and the exit slot. The depth of the compression slot 1222 is less than the diameter of the wire such that the surface of the wire protrudes below the bond head 1200. A wire remains in a loaded slot due to stiffness of the wire and, possibly, also due to the presence of the pre-aligner or slotted guide immediately adjacent to the bonding head, so that the wire is supported by the pre-aligner and extends out of the pre-aligner into the slot of the bond head. It is to be appreciated that, in some embodiments, the wire will remain in the slot even after the wire is cut due to the stiffness of the wire. In an embodiment bond head 1200 is composed of a material having non-stick properties (e.g., graphite, polished steel with hard coating (TiN, TiCr, TiAlN, CrN, etc., or polished ceramic such as stabilized zirconia).

Figure 12B:
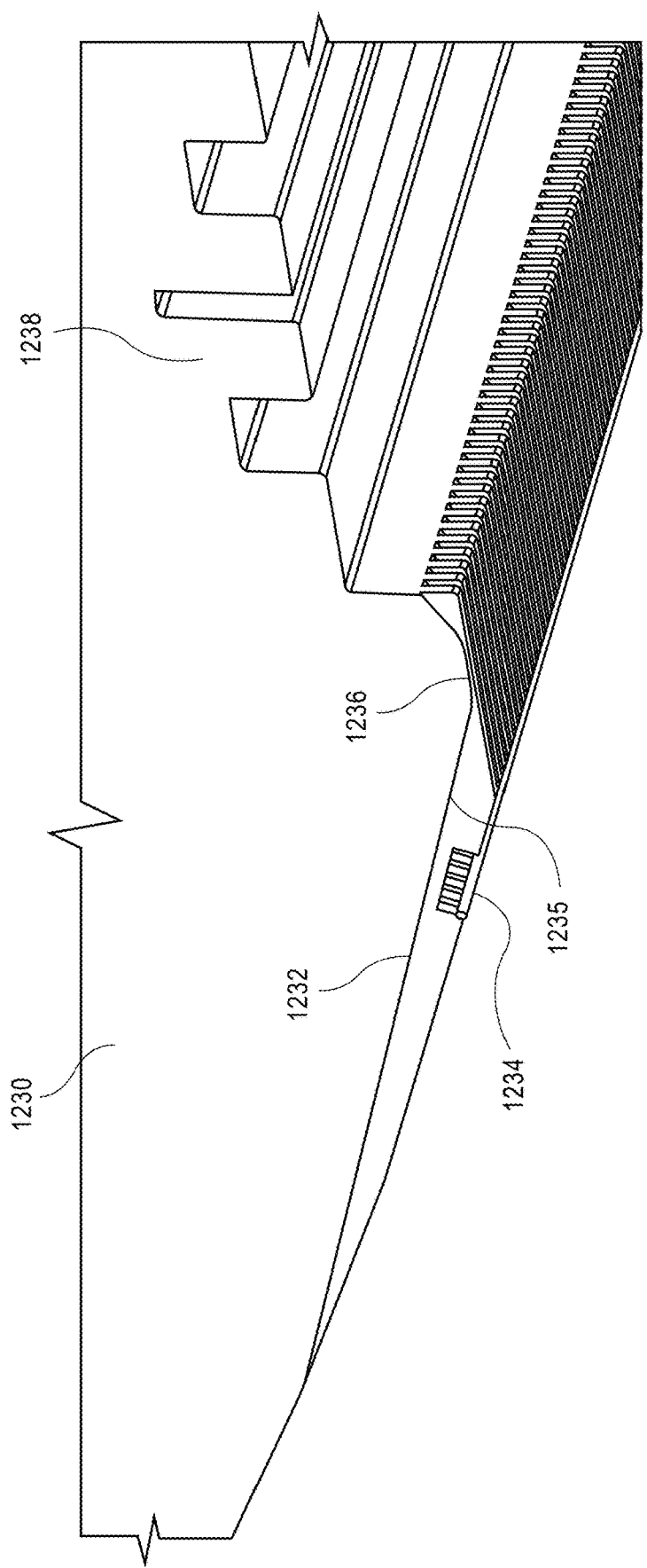
FIG. 12B illustrates a cross-sectional view of a bond head for a tool for bonding a wire to a solar cell, where the section is made along a plane parallel to a wire guiding slot and the center of the slot, in accordance with an embodiment of the present disclosure.
Figure 12C:
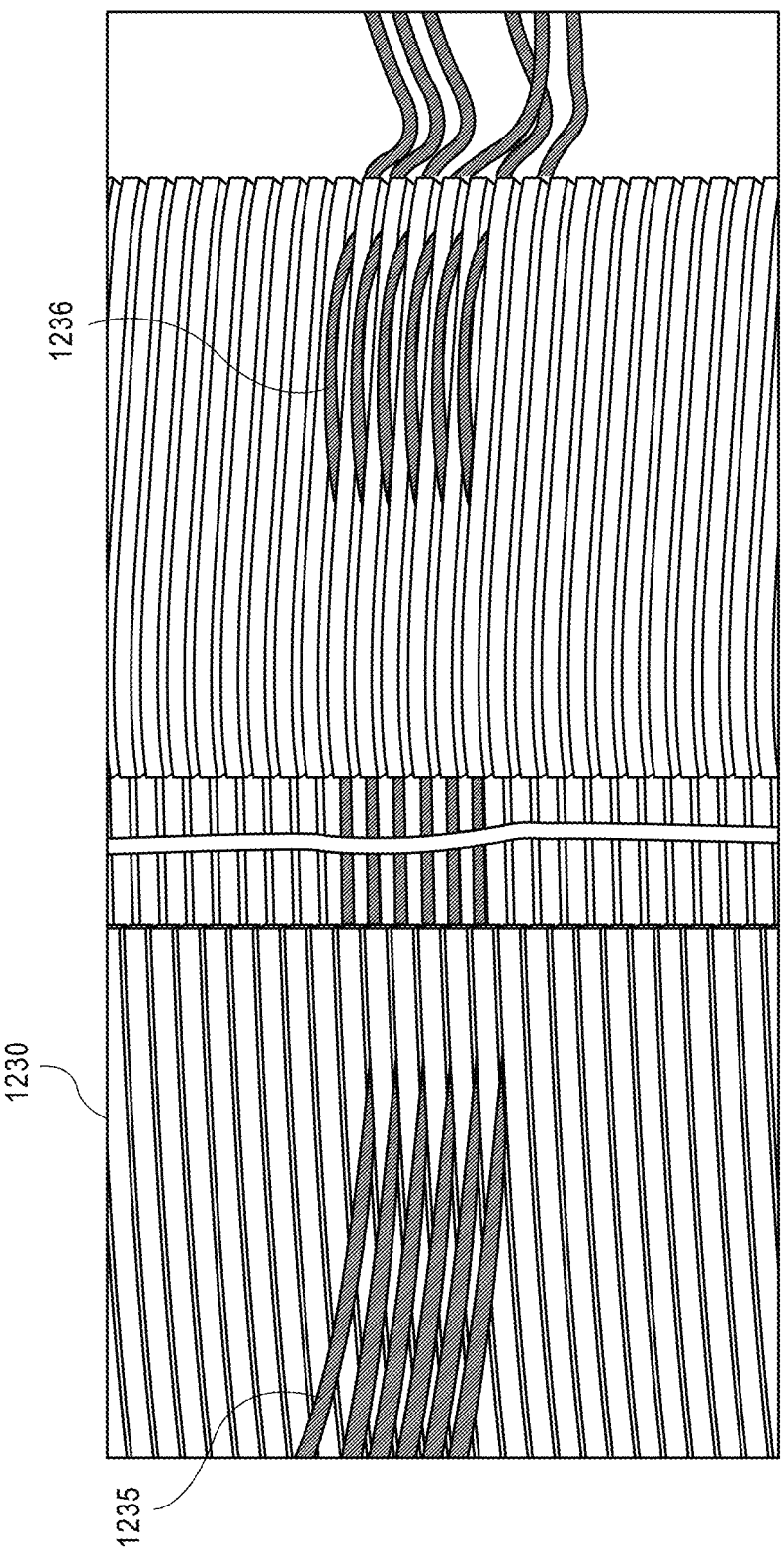
FIG. 12C illustrates an underside view of a bond head for a tool for bonding a wire to a solar cell, in accordance with an embodiment of the present disclosure.

FIG. 12B illustrates a cross-sectional view of a bond head for a tool for bonding a wire to a solar cell, where the section is made along a plane parallel to a wire guiding slot and the center of the slot, in accordance with an embodiment of the present disclosure. FIG. 12C illustrates an underside view of a bond head for a tool for bonding a wire to a solar cell, in accordance with an embodiment of the present disclosure.

Referring to FIG. 12B, a bond head 1230 includes one or more grooves 1232 to guide one or more corresponding wires 1235. A steel retaining wire 1234 can be included. A bonding surface 1236 provides a location where bonding to a solar cell is performed. Recessed 1238 can be included as locations where, e.g., a wire cutter is included. Referring to FIG. 12C, a wire 1235 is shown as being guided through bond head 1230 to bonding surface 1236.

Figure 12D:
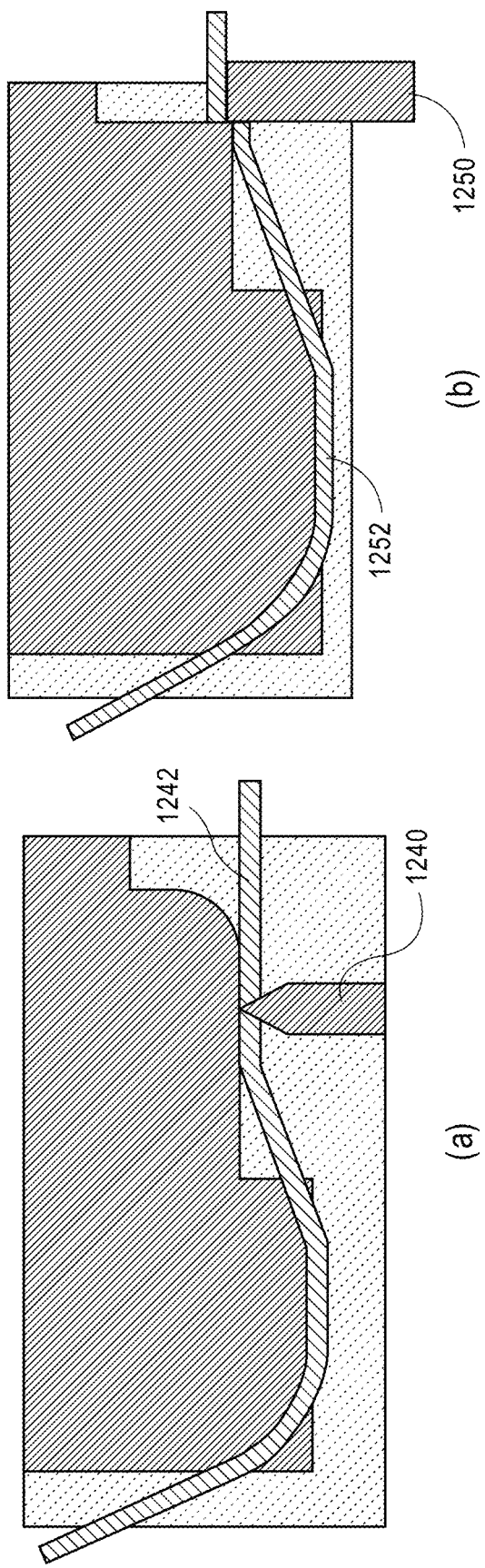
FIG. 12D illustrates possible rear surfaces of a bond head, in accordance with an embodiment of the present disclosure.

FIG. 12D illustrates possible rear surfaces of a bond head, in accordance with an embodiment of the present disclosure. Referring to FIG. 12D, a rear side of the bond head 1200 has a horizontal flat region for wire 1242 cut 1240 (part (a) of FIG. 12A), or has an edge for wire 1252 shear cut 1250.

In accordance with one or more embodiments of the present disclosure, wire-based metallization of solar cells is achieved by ultrasonic welding of wires to solar cells. To provide context, a significant fraction of the manufacturing cost of solar cells (especially interdigitated back contact (IBC) cells) is incurred during the metallization process. Metallization typically involves applying a metal seed layer, plating or bonding a thick metal layer to the metal seed layer, and then performing one or more process operations to pattern the metal seed layer and/or thick metal layers to form the desired pattern. By bonding wires directly to the cell, one or more of the above operations can be eliminated. However, achieving a high quality bond between aluminum and silicon typically requires low vacuum, high temperature, or both. Addressing one of more of the above issues, one or more embodiments described herein are directed to an ultrasonic welding technique to apply aligned aluminum wires directly to a silicon wafer or silicon nitride coating, without requiring a metal seed layer or the high temperature and pressure required for thermocompression bonding.

To provide further context, ultrasonic bonding of metal foils to a wafer has generally involved the use of a knurled surface attached to an ultrasonic horn, which grips the foil and vibrates it against the surface to be bonded to, which is pressed against an anvil. Such knurls are generally quite coarse, and could potentially punch through a very thin wire and cause damage to the surface underneath. By using grooves instead of a knurled surface (i.e., essentially a 1D groove pattern instead of a 2D groove pattern), it is possible to grip the wires without damaging the wires and to align the wires to the features on the wafer for bonding. In a particular embodiment, such an approach enables ultrasonic bonding of aluminum directly to silicon wafers.

Figure 13:
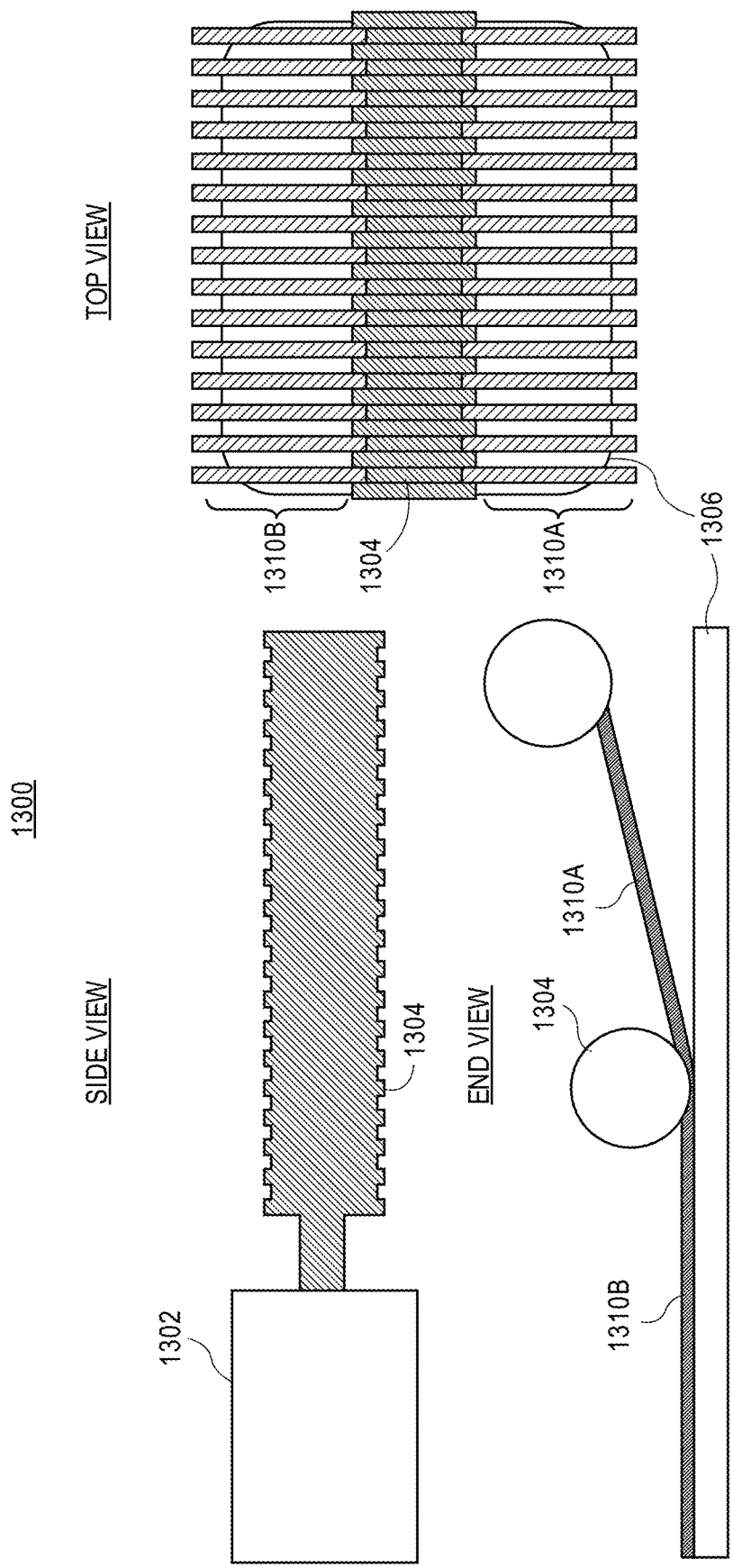
FIG. 13 is a schematic showing a side view and top view of a tooling system combining an ultrasonic bonder and a wire guide, in accordance with an embodiment of the present disclosure.

FIG. 13 is a schematic showing a side view and top view of a tooling system 1300 combining an ultrasonic bonder and a wire guide, in accordance with an embodiment of the present disclosure.

Referring to FIG. 13, wires 1310A are wound around an ultrasonic horn 1304 coupled to a power supply or transducer and rotary motor 1302. The ultrasonic horn 1304 has grooves/notches that are shallower than the diameter of the wires 1310A, and can be rectangular (as shown) or another shape. This arrangement constrains the lateral position of the wires 1310A, but still allows them to be pressed onto a surface of a wafer 1306. The wires 1310A in the horn 1304 are aligned to the desired surface features near the edge of the wafer 1306, at the point where metallization should begin. The wires 1310A are bonded ultrasonically with a very brief (e.g., <2 s, and even <0.2 s) ultrasonic welding process. The ultrasonic horn/wire guide 1304 is then drawn/rolled across the wafer 1306, with continuous or periodic weld points fixing the wires in place to provide bonded wire portions 1310B.

In an embodiment, the above process can bond dissimilar metals (e.g., copper and aluminum), which would otherwise not adhere to one another in a plating process and which would interdiffuse rapidly during a thermocompression bonding process. Heat (e.g., from a hotplate) can be applied to improve adhesion and/or contact resistance. The wire guiding and bonding functions can also be separated by using a wire guide (with channels to constrain the wires) in close proximity to a cylindrical ultrasonic horn 1304, which bonds the wires to the wafer at the point where they exit the guide. In other embodiments, wires embedded in a polymer matrix can be used in order simplify the handling of the wires (e.g., a single wire web, instead of 300+ individual wires, could be used as an input). In an embodiment, ultrasonic agitation can both remove any polymer coating from the wire, e.g., before bonding the wire to the substrate (possibly with different power/pressure/amplitude settings).

Figure 14:
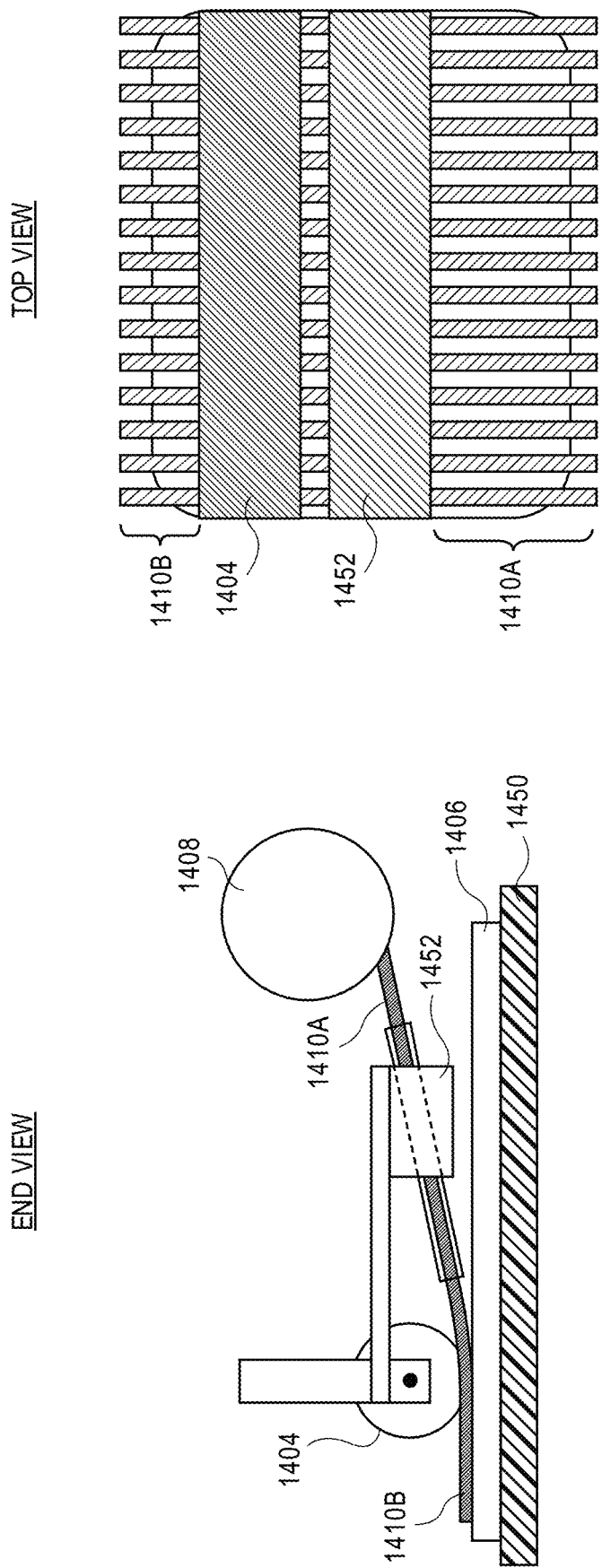
FIG. 14 is a schematic showing a side view and top view of a tooling system with separate ultrasonic bonder and wire guide, in accordance with an embodiment of the present disclosure.

FIG. 14 is a schematic showing a side view and top view of a tooling system 1400 with separate ultrasonic bonder and wire guide, in accordance with an embodiment of the present disclosure.

Referring to FIG. 14, wires 1410A from a spool 1408 are guided using a separate wire guide 1452 with channels to confine wires 1410A in lateral dimension. Bonding is accomplished by periodic (or continuous) ultrasonic vibration from a long, narrow horn 1404, which does not need to guide the wires 1410A but only grips them with a knurled surface (e.g., features significantly smaller than wire diameter). Heat from a hotplate 1450 can also be applied in combination with the ultrasonic agitation, to aid in bonding. The ultrasonic horn 1404 can be a single cylinder or more than one cylinder/wheel, depending on feasible bonding width. The process provides bonded wire portions 1410B on substrate 1406, which can be supported on the hotplate 1450.

FIGS. 15A-15D illustrate example semiconductor substrates fabricated using methods, approaches or equipment described herein, according to some embodiments. In an embodiment, the semiconductor substrates are solar cells 1520a, 1520b, 1520c, 1520d. In an embodiment, the solar cells 1520a, 1520b, 1520c, 1520d can include a silicon substrate 1525. In some embodiments, the silicon substrate 1525 can be cleaned, polished, planarized and/or thinned or otherwise processed. In an embodiment, the semiconductor substrate 1525 can be single-crystalline or a multi-crystalline silicon substrate. In an embodiment, the silicon substrate 1525 can be an N-type or a P-type silicon substrate. In an example, the semiconductor substrate can be a monocrystalline silicon substrate, such as a bulk single crystalline N-type doped semiconductor substrate. In an embodiment, the solar cells 1520a, 1520b, 1520c, 1520d can have a front side 1502 and a back side 1504, where the front side 1502 is opposite the back side 1504. In one embodiment, the front side 1502 can be referred to as a light receiving surface 1502 and the back side 1504 can be referred to as a back surface 1504. In an embodiment, the solar cells 1520a, 1520b, 1520c, 1520d can include a first doped region 1521 and a second doped region 1522. In an embodiment, the first doped region can be a P-type doped region (e.g., doped with boron) and the second doped region can be an N-type doped region (e.g., doped with phosphorus). In an embodiment, the solar cells 1520a, 1520b, 1520c, 1520d can include an anti-reflective coating (ARC) 1528 on the front side 1502 of the solar cells. In some embodiments, the solar cells 1520a, 1520b, 1520c, 1520d can include an anti-reflective coating (ARC) 1526.

Figure 15A:
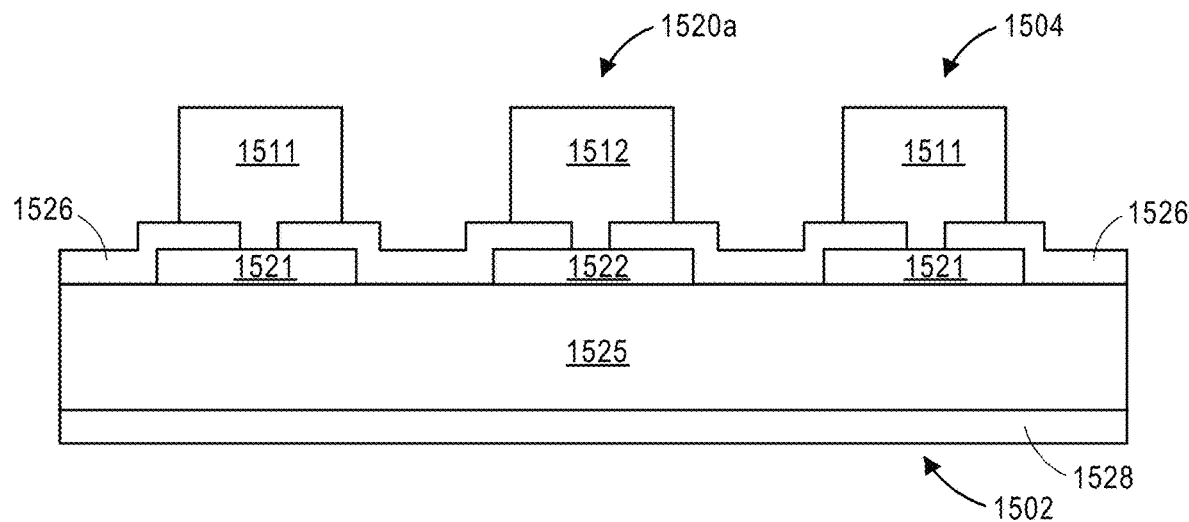
FIGS. 15A-15D illustrate example semiconductor substrates fabricated using methods, approaches or equipment described herein, according to some embodiments.

Referring to FIG. 15A, an exemplary back-contact solar cell fabricated using methods, approaches or equipment described herein, according to some embodiments. The back-contact solar cell 1520a can include the first and second doped regions 1521, 1522 disposed on a back side 1504 of a solar cell 1520a. In an embodiment, conductive wires 1511, 1512 can be bonded to the first and second doped regions 1521, 1522 on the back side 1504. In an example, the first and/or second doped regions can include polysilicon regions. In one example, first and second doped regions 1521,1522 are separated by a lightly doped region 1579 there between, e.g., where the lightly doped regions can have a doping concentration substantially less than the first and second doped regions 1521, 1522. In an embodiment, a thin oxide layer 1573 (e.g., tunnel oxide layer) can be disposed between the first and second doped regions 1521, 1522 and the substrate 1525. The first and second doped regions 1521, 1522 can, instead, be located in the substrate 1525. The first and second doped regions 1521, 1522 can have separation regions formed there between. In an example, the first and second doped regions 1521, 1522 have trenches formed there between, the trenches extending partially into the substrate. The trenches can be replaced with intrinsic or lightly doped semiconductor regions.

Figure 15B:
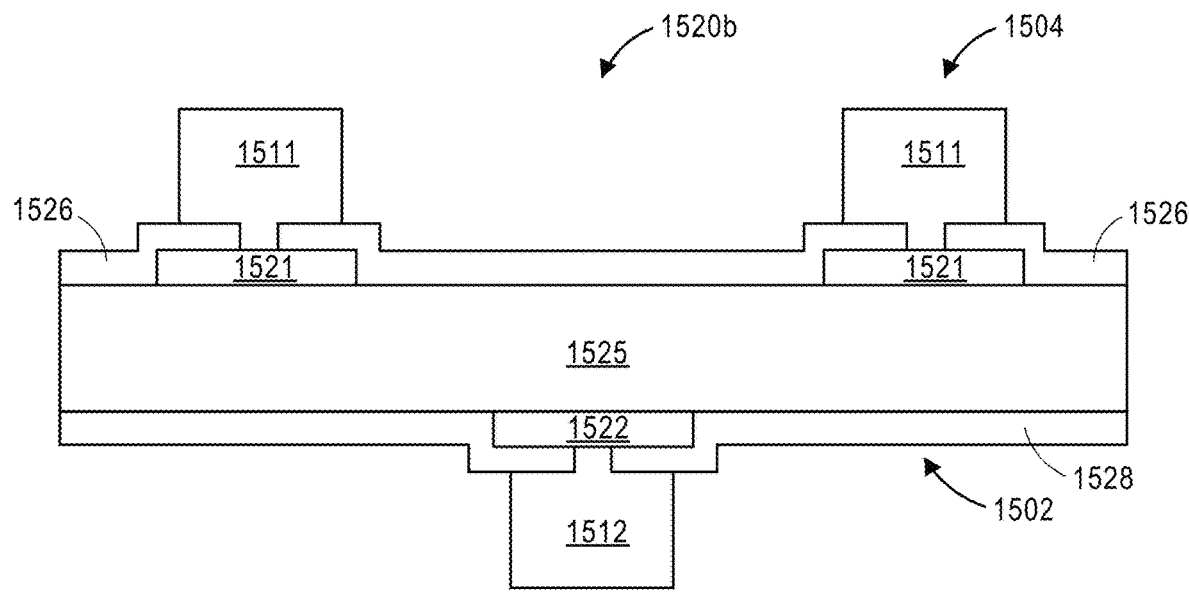

With Reference to FIG. 15B, an example front-contact solar cell fabricated using methods, approaches or equipment described herein, according to some embodiments. The front-contact solar cell 1520b can include the first doped regions 1521 disposed on the back side 1504 of the solar cell 1520b. In an example, the second doped region 1522 can be disposed on the front side 1502 of the solar cell 1520b. Although one example of a second doped region 1522 is shown, one or more, of the second doped region 1522 can be used. In an embodiment, conductive wires 1511, 1512 can be bonded to the first and second doped regions 1521, 1522 on the front and back sides 1504 of the solar cell 1520b. The second doped region 1522 can offset from the first doped regions 1521, as shown. The second doped region 1522 can be aligned, e.g., vertically aligned with, the first doped regions 1521.

Figure 15C:
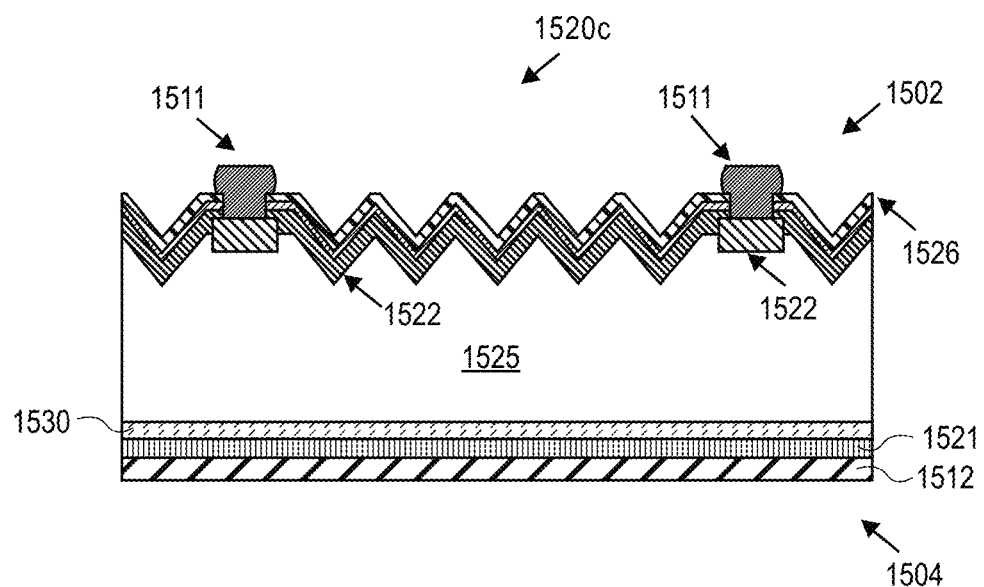

FIG. 15C illustrates an example front-contact solar cell fabricated using methods, approaches or equipment described herein, according to some embodiments. The front-contact solar cell 1520c can include the first doped regions 1521 disposed on the back side 1504 of the solar cell 1520c. Conductive contact structures 1511, 1512 can be formed via wire bonding technique on the front and back sides 1502, 1504 of the solar cell 1520c, respectively, where the conductive contact structures 1511, 1512 include thermally compresses wires or wire portions on the first and second doped regions 1521, 1522. The first and second doped regions 1521, 1522 can include an amorphous silicon region. The solar cell 1520d can include an intervening layer (e.g., an anti-reflective layer coating ARC) 1526 on the front side 1502 of the solar cell 1520c. The solar cells 1520c can include a back intervening layer (e.g., a back anti-reflective coating BARC) 1526 on the back side 1504 of the solar cell 1520c. A thin oxide layer 1530 can be disposed between the first doped region 1521 and the substrate 1525.

Figure 15D:
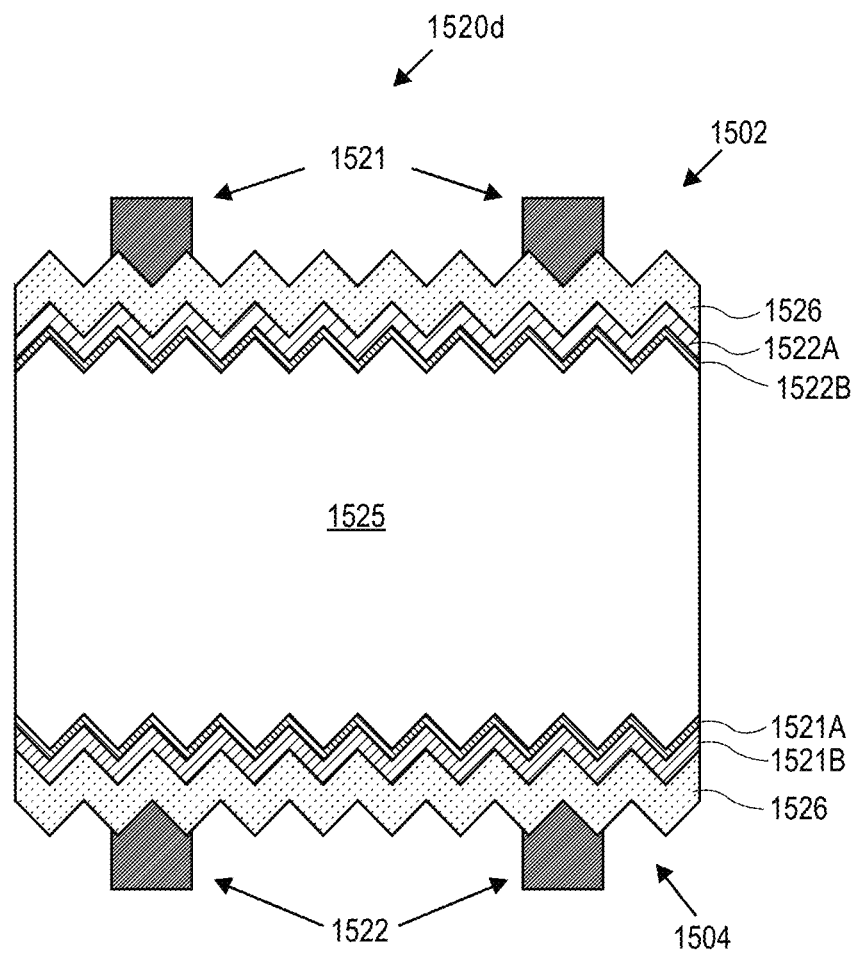

FIG. 15D illustrates another exemplary front-contact solar cell fabricated using methods, approaches or equipment described herein, according to some embodiments. The solar cell 1520d can include the first doped regions 1521A, 1521B disposed on the back side 1504 of the solar cell 1520d. In an example, the second doped region 1522A, 1522B can be disposed on the front side 1502 of the solar cell 1520d. In an embodiment, conductive contact structures 1511, 1512 can be formed via a wire bonding technique on the front and back sides 1504 of the solar cell 1520d, respectively, where the conductive contact structures 1511, 1512 include thermally compressed wires or wire portions on the first and second doped regions 1521A, 1521B, 1522A, 1522B. The first doped regions 1521A, 1521B can include a doped polysilicon region. The solar cell 1520d can include an intervening layer (e.g., an anti-reflective coating ARC) 1528 on the front side 1502 of the solar cell 1520d. The solar cells 1520d can include a back intervening layer (e.g., a back anti-reflective coating BARC) 1526 on the back side 1504 of the solar cell 1520d.

Referring to FIGS. 15A-15D, in one embodiment, methods described herein can be applied to both a front-contact and/or a back-contact solar cell. In an example, conductive wires 1510 can be aligned and bonded to doped regions 1521, 1522 on either of or both of a front side 1502 and a back side 1504 of a solar cell. In one example, the conductive wires 1510 can be bonded to a single side, e.g., a back side 1504 or a front side 1502. In an embodiment, the wires and/or conductive contact structures 1511, 1512 can have a square, rectangle, semi-square, and/or semi-rectangular shape due to the bonding techniques (e.g., thermal compression bonding) described herein. In some examples, the wires and/or conductive contact structures 1511, 1512 can have a partially rounded surfaces and/or semi-circular surfaces due to the bonding techniques (e.g., thermal compression bonding) described herein.

In accordance with one or more embodiments of the present disclosure, strain relief structures and interconnects are described. As an example, FIGS. 16A and 16B illustrate cross-sectional views and a plan view of various arrangements for wire-based metallization of solar cells, in accordance with an embodiment of the present disclosure.

Figure 16A:
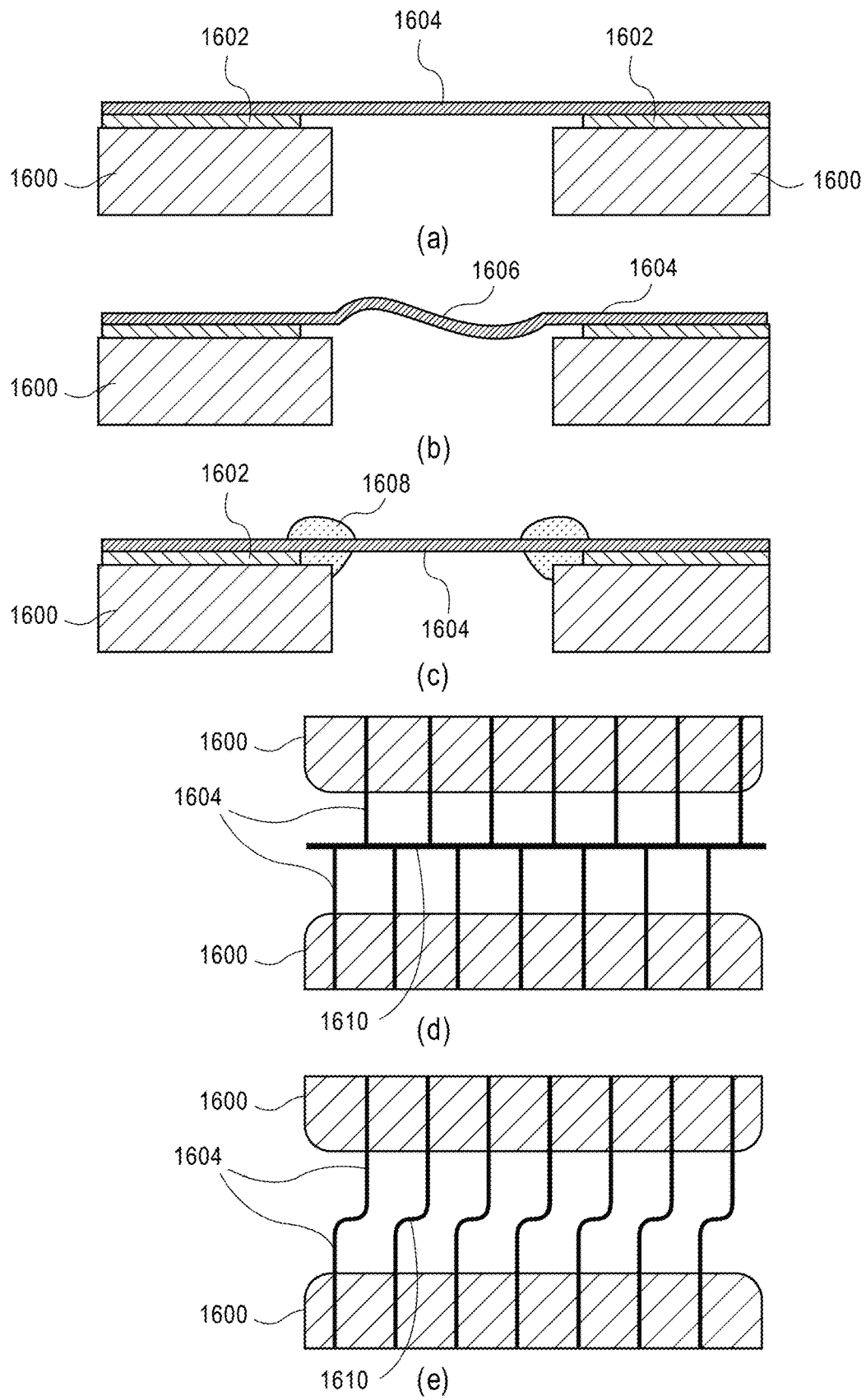
FIGS. 16A and 16B illustrate cross-sectional views and a plan view of various arrangements for wire-based metallization of solar cells, in accordance with an embodiment of the present disclosure.
Figure 16B:
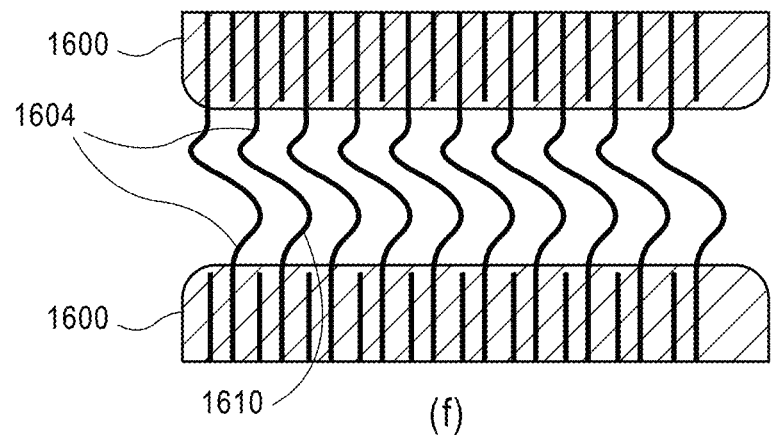
Figure 16B:
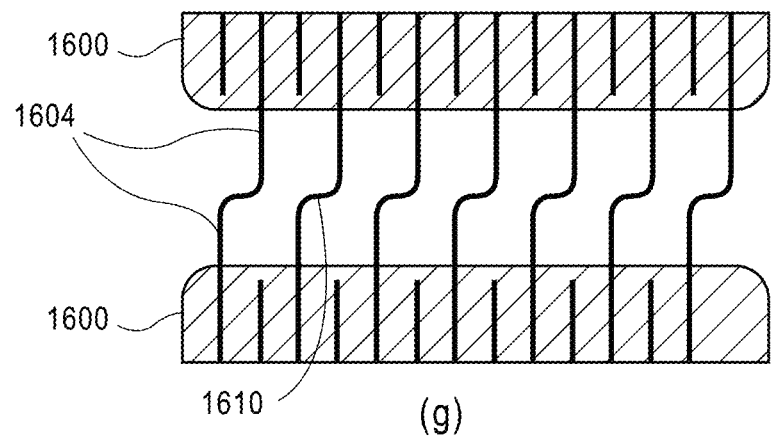

Referring to part (a) of FIG. 16A, solar cells 1600 include emitter regions 1602 having a wire 1604 coupled thereto. Referring to part (b) of FIG. 16A, a wire 1604 is provided with excess length which is then bent to form an out of plane strain relief feature 1606. The bend 1606 can be either towards, or away from a glass direction, or both. In one embodiment, the bend 1606 is less than the distance between a back of a cell and either a glass or backsheet of a solar panel. In an embodiment, 1606 does not include sharp features. The bend 1606 can allow for any thermal expansion/contraction or mechanical stress to be taken by the bends rather than directly into the weld/solder joints.

Referring to part (c) of FIG. 16A, an epoxy or rigid body 1608 is included to prevent transfer of force to Al wire and cell connections. In an embodiment, an epoxy or coating is adhered to both the wire and the cell, on one or both sides of a cell to cell gap. The arrangement can transfer any stress in the wires away from the solder/weld bonds and diffuse onto the cell. The arrangement can also add robustness to portion of the wire that can be thinned out or work hardened by the cell bonding process.

Referring to part (d) of FIG. 16A, an intercell bus 1610 is offset (in plane) relative to on cell wires 1604 and runs perpendicular to the on cell wires 1604. Such an arrangement can relieve stress by not having a continuous line the length of two cells. Furthermore, the arrangement can add redundancy, since one broken wire will not necessarily lead to power loss from two cells. The intercell bus 1610 can be connected to every wire, as is depicted, or for every other wire.

Referring to part (e) of FIG. 16A, single-bend stress relief features 1610 are in plane relative to on cell wires 1604. The single-bend stress relief features 1610 are made for all wires in this example. Such an arrangement can relieve stress by not having a continuous straight line the length of two cells. It is to be appreciated that the arrangement can avoid sharp features, additional wire length can be needed, and cells are moved together during bending.

Referring to part (f) of FIG. 16B, double-bend stress relief features 1610 are in plane relative to on cell wires 1604. Such an arrangement can relieve stress by not having a continuous straight line the length of two cells. It is to be appreciated that the arrangement can avoid sharp features, additional wire length can be needed, and cells are moved together during bending. The double-bend stress relief features 1610 can be made for every wire, or for every other wire as is depicted.

Referring to part (g) of FIG. 16B, single-bend stress relief features 1610 are in plane relative to on cell wires 1604. The single-bend stress relief features 1610 are made for every other wire in this example. Such an arrangement can relieve stress by not having a continuous straight line the length of two cells. It is to be appreciated that the arrangement can avoid sharp features, additional wire length can be needed, and cells are moved together during bending.

In another aspect, it is to be appreciated that thermal expansion can cause solar cells to move relative to one another inside a module. Strain relief may be required for metal cell-to-cell interconnects to prevent breakage of the interconnect. In-plane strain relief bends may be preferred so that metal does not contact front glass or backsheet features of a photovoltaic module.

Figure 16C:
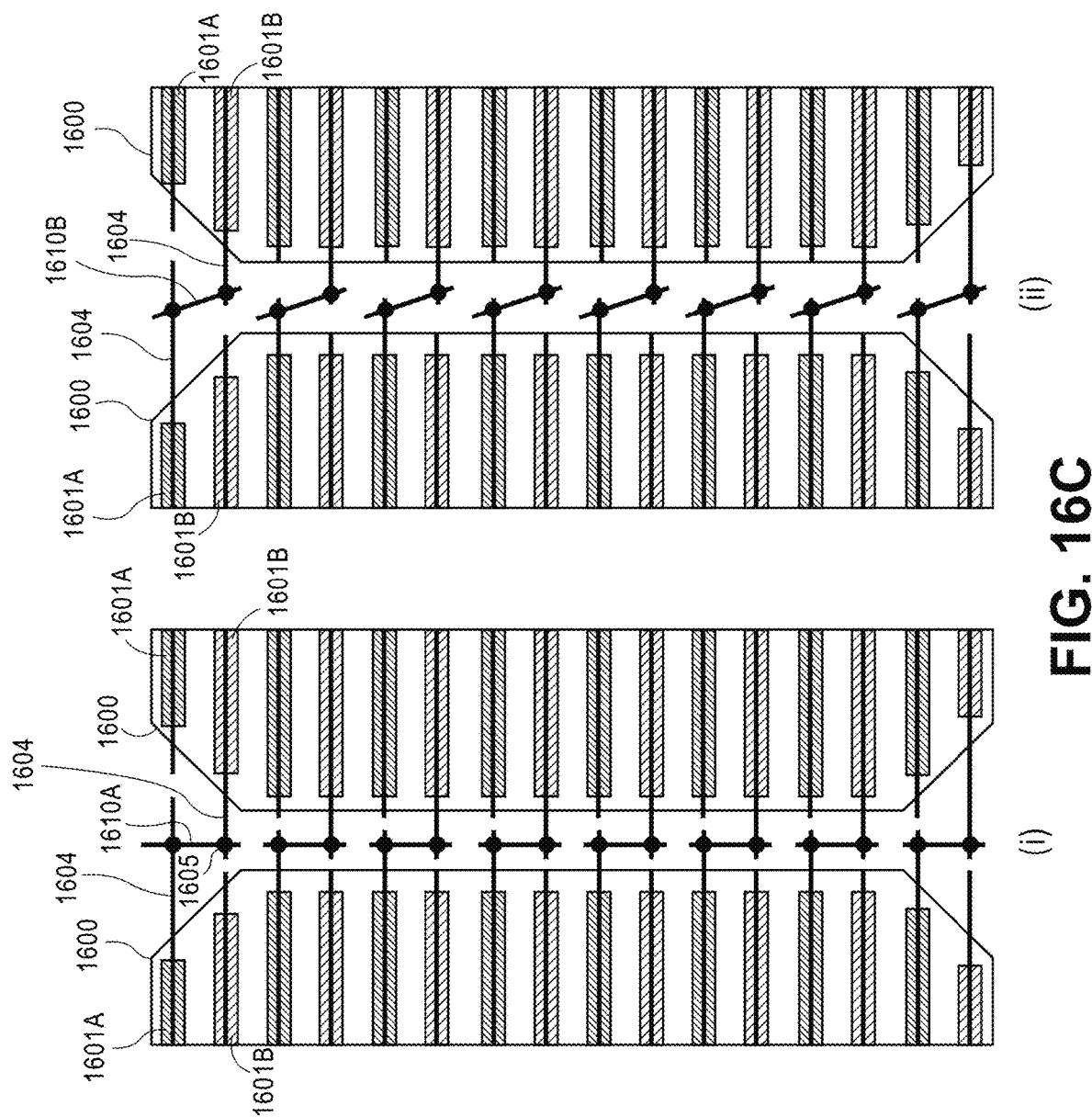
FIG. 16C illustrates plan views of various arrangements for wire-based metallization of solar cells, in accordance with an embodiment of the present disclosure.

FIG. 16C illustrates plan views of various arrangements for wire-based metallization of solar cells, in accordance with an embodiment of the present disclosure.

Referring to part (h) of FIG. 16C, adjacent cells 1600 have aligned emitter types 1601A and 1601B. In an embodiment, the emitter regions can include P-type and N-type doped diffusion regions. Stress relief features 1610 are in plane relative to on cell wires 1604 and join alternating wire portions of the on cell wires 1604. The stress relief features 1610 are made for every other wire in this example. In one embodiment, the stress relief features 1610 each include a wire portion bonded to a wire portion of each of the adjacent cells 1600. The wire portion of each of the stress relief features 1610 can be bonded to a corresponding wire portion of each of the adjacent cells 1600 at a connection point 1605, such as a solder joint or a weld formed using laser welding, thermocompression bonding or ultrasonic bonding. Referring to part (i) of FIG. 16C, the structure of part (h) of FIG. 16C is shown after expansion, e.g., after relative movement between adjacent cells 1600. In an embodiment, as used herein, the stress relief feature can also be referred to as a relief feature or a relief structure.

Referring again to FIG. 16C, in accordance with an embodiment of the present disclosure, an additional wire, ribbon, interconnect or busbar is placed between cells and welded or soldered to every wire. Horizontal wires (e.g., on cell wires 1604) are cut as shown to create a circuit. Strain relief features 1610 or vertical wires can be cut as shown to create a circuit. Regions 1601A and 1601B are regions of opposite polarity. The cells 1600 are all the same orientation when bonded. The first strain relief structure 1610 is created by placing a wire or ribbon in the space between cells in a string, and welding the wire or ribbon to each finger (e.g., on cell wire 1604). The inter cell ribbon or wire is then cut periodically so that fingers from one cell are connected to only the required fingers on the adjacent cells. As the cells move relative to each other in thermal cycling, the short interconnecting strain relief features 1610 (e.g., ribbons or wires) are able to absorb the strain by a small twist in the plane of the module.

The structure of FIG. 16C can have the advantage of not requiring any wire bending operations, and so can be less likely to delaminate wires at the edges of the wafer. Welding and cutting can be performed using a scanning laser and thus can be simpler to implement in high volume manufacturing. In one such embodiment, welding and cutting operations can be combined into a single processing operation. A further advantage of this approach can include that wafers are all bonded in the string with the same orientation, possibly making equipment and wafer placement simpler.

Referring again to FIG. 16C, in an embodiment, the stress relief features 1610 can include an inter cell ribbon, wire, foil and/or any other type of applicable interconnect material. In an example, the stress relief features 1610 can include an aluminum wire or an aluminum foil. In an embodiment, the stress relief features 1610 can include a thicker ribbon portion (e.g., in comparison to as shown in FIG. 16C), an interconnect portion, and/or include any other type of interconnect material. In an embodiment, the stress relief features 1610 of FIG. 16C (h) can be positioned approximately perpendicular to the on cell wires 1604. In an embodiment, subsequent to expansion, e.g., after relative movement between adjacent cells 1600, the stress relief features 1610 of FIG. 16C (i) can be positioned at angles approximately greater than or less than 90 degrees with respect to the on cell wires 1604. In an example, the stress relief features 1610 of FIG. 16C (i) can be at an angle less than approximately 90 degrees with respect to the on cell wire 1604 coupled to the first solar cell (e.g., shown on the left) of FIG. 16C (i). In an example, the stress relief features 1610 of FIG. 16C (i) can be at an angle greater than approximately 90 degrees with respect to the on cell wire 1604 coupled to the second solar cell (e.g., shown on the right) of FIG. 16C (i). In an embodiment, the stress relief features 1610 can include a solder region, weld region and/or a cut region as shown in FIG. 16C and described above.

With reference again to FIG. 16C, in an embodiment, a method of stringing a solar cell can include positioning at least two solar cells adjacent to one another. In an embodiment, the solar cells, e.g., a referred to as a first solar cell and a second solar cell, can be positioned where the emitter regions of the first solar cell can be in alignment with the emitter regions of the second solar cell. In an embodiment, the method can include positioning a plurality of wires in alignment with the emitter regions. In an embodiment, a thermocompression process (as described above) can be performed to bond the plurality of wires to the emitter regions of the solar cells. In an embodiment, the method can include positioning a ribbon, wire, foil and/or interconnect material in contact with the plurality of wires. In an example, the interconnect material can be positioned between the first and second solar cells, as shown in FIG. 16C. In an example, the interconnect material can be positioned approximately perpendicular to the plurality of wires. In an embodiment, as described above, a welding and/or cutting process can be performed on the interconnect material and/or the plurality of wires to form a string of solar cells. In an example, the welding and/or cutting can be performed using a scanning laser. In one such example, welding and cutting operations can be combined into a single processing operation or performed separately. In an example, cutting the interconnect material and/or wires can include cutting the interconnect material and/or wires with less than 1 mm of overhang from the solar cells. As described herein, emitter regions can be used to described emitter types.

Figure 16D:
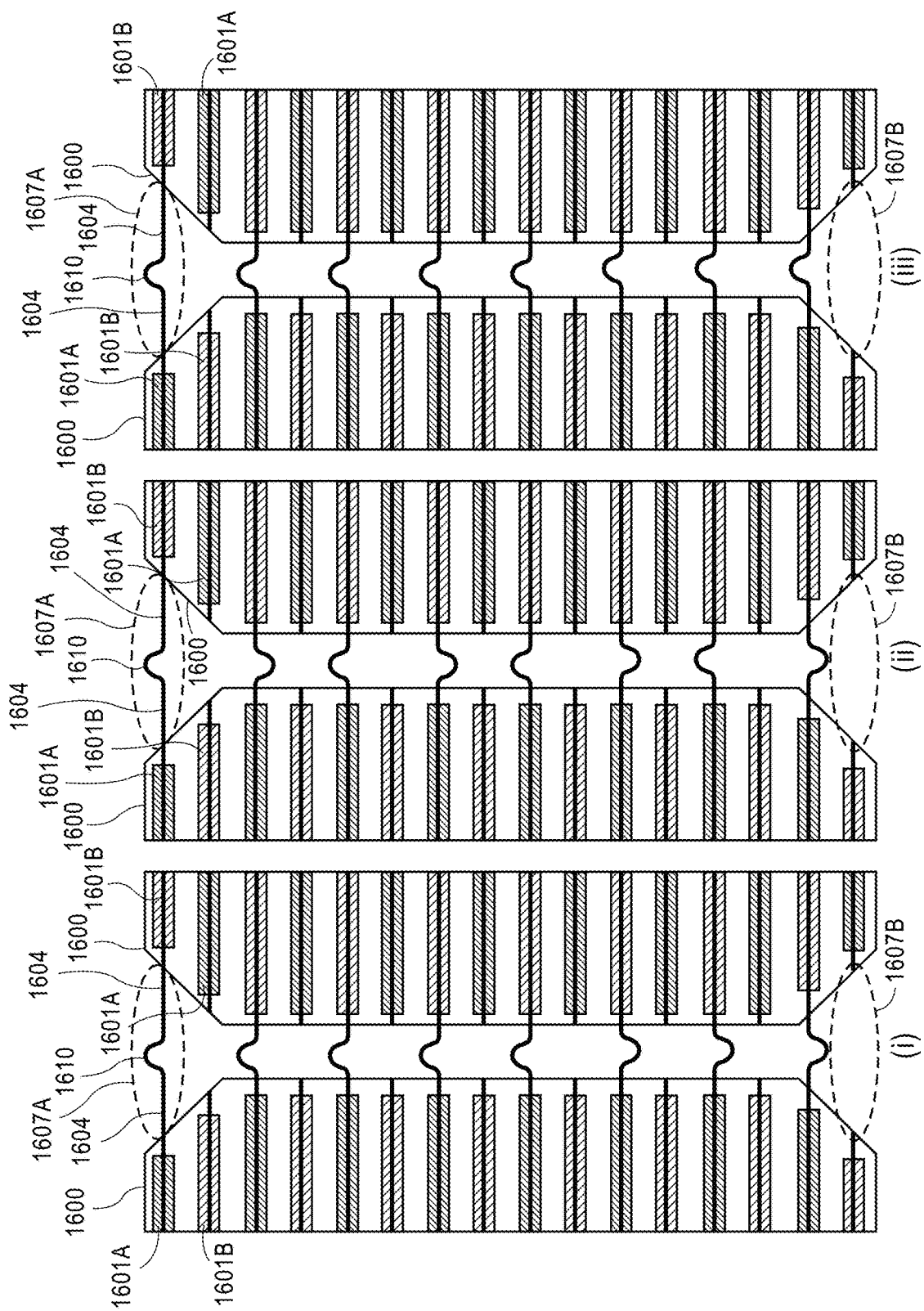
FIG. 16D illustrates plan views of various arrangements for wire-based metallization of solar cells, in accordance with an embodiment of the present disclosure.

FIG. 16D illustrates plan views of various arrangements for wire-based metallization of solar cells, in accordance with an embodiment of the present disclosure.

Referring to parts (j), (k) and (l) of FIG. 16D, adjacent cells 1600 have emitter types 1601A and 1601B. In an embodiment, each cell 1600 can have two types of emitter 1601A and 1601B (e.g., N-type and P-type semiconductor regions). In an example, these emitters are aligned such that the first type of emitter 1601A on a first cell (e.g., the cell positioned on the left in parts (j), (k) and (l) of FIG. 16D), is aligned with the second type of emitter 1601B on a second cell (e.g., the cell positioned on the right in parts (j), (k) and (l) of FIG. 16D) and the second type of emitter 1601B on the first cell is aligned with the first type of emitter 1601A on the second cell. Stress relief features 1610 are in plane relative to on cell wires 1604 and join adjacent wire portions of the on cell wires 1604. The stress relief features 1610 are made for every other wire in these examples. Specific exemplary arrangements of the stress relief features are shown in parts (j), (k) and (l) of FIG. 16D, e.g., (j) upper stress relief features are in a direction toward the top of the cells 1600 and lower stress relief features are in a direction toward the bottom of the cells 1600, (k) stress relief features alternate between a direction toward the top of the cells 1600 and a direction toward the bottom of the cells 1600, and (l) all stress relief features are in a direction toward the top of the cells 1600. It is to be appreciated that reference to "top" and "bottom" in FIG. 16D is with respect to the plan view of the orientation of the page as depicted, and not to a top side and bottom side of a solar cell.

Referring again to FIG. 16D, in accordance with an embodiment of the present disclosure, wires are bent in the plane of the wafer between cells as shown. The direction of the bends can be all in one direction or can alternate. With reference to the above, the orientation of emitter types for the solar cells 1600 are positioned to generate a series interconnection between the solar cells 1600. In an example, every other wire is cut to electrically connect and align the first type of emitter on a first cell with the second type of emitter on a second cell, e.g., to form a series circuit. Strain relief between cells can be provided by in-plane bends in the wires in the space between cells. In an embodiment, the in-plane bends can be referred to as bend stress relief features or bend relief features. In-plane bends can be preferred over out of plane bends to prevent the cell metallization from touching the module front glass or backsheet. Bends can be formed out of plane and then bent in plane or formed in plane. Bends can all be in one orientation or can be a mix of orientations. Alternating orientations can be beneficial for balancing in-plane forces during wire bending operations. In the interconnection scheme of FIG. 16D, adjacent cells are oriented 180 degrees with respect to each other such that p-fingers on one wafer can be connected to n-fingers on an adjacent wafer using the same wire. In an embodiment, one edge 1607A of each of the solar cells can be connected by a wire 1604 and another, opposite, edge 1607B of each of the solar cells can be disconnected or can be open. Due to the opposite orientation of the emitter types of each of the solar cells, one edge of both cells can be electrically connected and another, opposite, edge can be electrically disconnected, e.g., open. Although as shown in parts (j), (k) and (l) of FIG. 16D, the top edge 1607A are connected and the bottom edge 1607B are disconnected, the opposite configuration can also be used. In an example, not shown, the top edge 1607A can be disconnected or open and the bottom edge 1607B can instead be connected by a wire.

With reference again to FIG. 16D, in an embodiment, a method of stringing a solar cell can include positioning at least two solar cells adjacent to one another. In an embodiment, positioning the solar cells can include positioning a second solar cell in an orientation 180 degrees rotated with respect to a first solar cell. In an example, the first emitter regions of the first solar cell can be aligned with the second emitter regions of the second solar cell. In an embodiment, the method can include positioning a plurality of wires in alignment with the emitter regions. In an embodiment, a thermocompression process (as described above) can be performed to bond the plurality of wires to the emitter regions of the solar cells. In an embodiment, the method can include bending the plurality of wires at locations in between the first and second solar cells. In an example, the plurality of wires can be bent in plane or off plane from the plurality of wires (e.g., with respect to on cell wires). In the embodiment where the bends are in a direction off plane, the method can include bending the wires in plane. In an embodiment, the bending can be performed from opposite ends to evenly distribute the bend forces experienced by the solar cells and/or wires. In an example, the bending can be from a top or bottom of the plan view (e.g., referring to FIG. 16D in plane) or a top or bottom of the side of the solar cells (e.g., referring to FIG. 16B). In an embodiment, the bending can be performed from alternating directions (referring to part (k) of FIG. 16D). In an embodiment, the bending can be performed from one direction (referring to part (l) of FIG. 16D). In an embodiment, as described above, a cutting process can be performed on the plurality of wires to form a string of solar cells. In an example, the cutting can be performed using a scanning laser. In an example, cutting wires can include cutting the wires with less than 1 mm of overhang from the solar cells.

The above examples include wire cut structures. In an embodiment, wires are cut with less than 1 mm of overhang from the cell 1600 to prevent shorting to adjacent a finger (emitter). Laser cutting close to a wafer or cell edge can allow the wire to cool faster and can prevent the wire from forming a ball as it cools (which is an additional shorting risk).

Figure 17A:
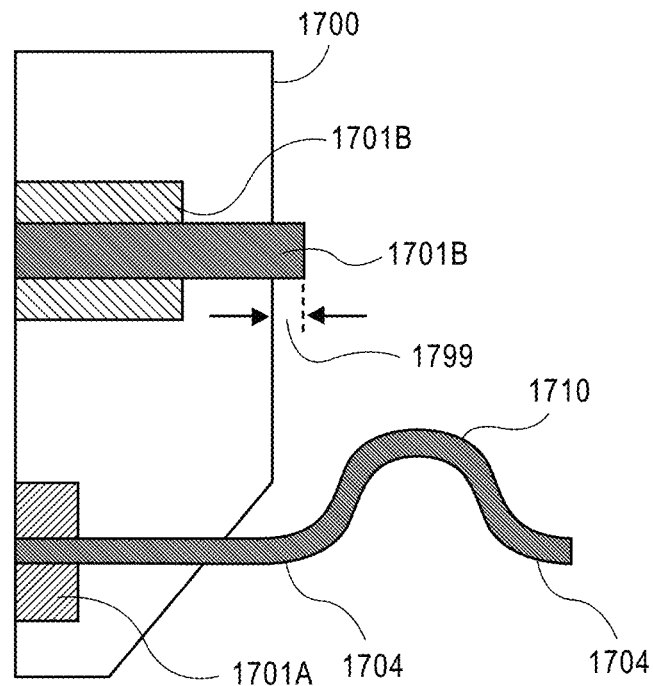
FIG. 17A illustrates a magnified view of an arrangement for wire-based metallization of solar cells, in accordance with an embodiment of the present disclosure.

FIG. 17A illustrates a magnified view of an arrangement for wire-based metallization of solar cells, in accordance with an embodiment of the present disclosure. Referring to FIG. 17A, a cell 1700 has emitter types 1701A and 1701B. A stress relief feature 1710 is in plane relative to an on cell wire 1704. The stress relief feature 1710 is made for every other wire in this example. A cut wire 1703 has an overhang 1799 which, in one embodiment, is approximately less than 1 mm.

Figure 17B:
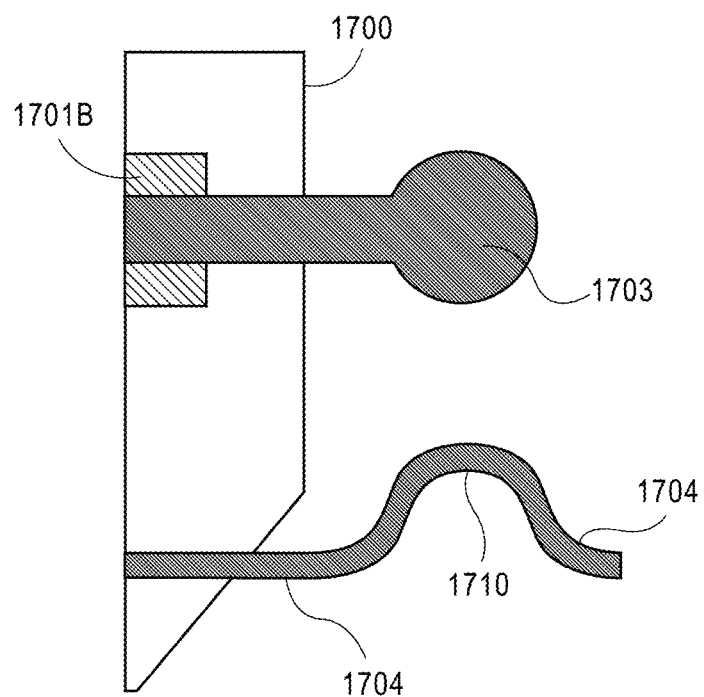
FIG. 17B illustrates a magnified view of an arrangement for wire-based metallization of solar cells, in accordance with an embodiment of the present disclosure.

As a comparison to FIG. 17A, FIG. 17B illustrates a magnified view of an arrangement for wire-based metallization of solar cells. Referring to FIG. 17B, a cell 1700 has emitter types 1701A and 1701B. A stress relief feature 1710 is in plane relative to an on cell wire 1704. The stress relief feature 1710 is made for every other wire in this example. A cut wire 1703 has a ball since due to slower cooling further from the edge of the cell 1700. The ball may create a shorting risk.

In another aspect, uniaxial tensile testing for on-cell and spool wire (e.g., off-cell) samples has revealed that the elastic region has similar slope in both cases (i.e., equal stiffness), but an on-cell wire is more ductile due to effective annealing during thermocompression. In addition, the wire cross-section can change from rectangular to circular as the wire transitions off the cell. The combination of change in material ductility and geometry at the same location can create a stress concentration at the interface that can result in early onset failures in low and high cycle fatigue.

An interconnect formation process may not compress the wire in between cells. In such cases, the wire portion between the cells can have different material properties and a different geometry than the wire portion that has been bonded and compressed on the cell. The resulting discontinuities can create stress concentrations when loaded and are likely points of early failure. As an example, FIG. 18A illustrates a cross-sectional view of an arrangement for wire-based metallization of solar cells, in accordance with an embodiment of the present disclosure. FIG. 18B is an image of a wire portion in a region between two solar cells of the arrangement shown in FIG. 18A, in accordance with an embodiment of the present disclosure.

Referring to FIGS. 18A and 18B, adjacent cells 1800A and 1800B are coupled by a wire 1804. The wire 1804 has flat regions 1806 on-cell where thermocompression has been used, a round region 1808 between cells 1800A and 1800B, and transition regions 1810 between the flat regions 1806 and the round region 1808. The transition regions 1810 can be a potential failure location where wire breakage can occur.

Figure 19A:
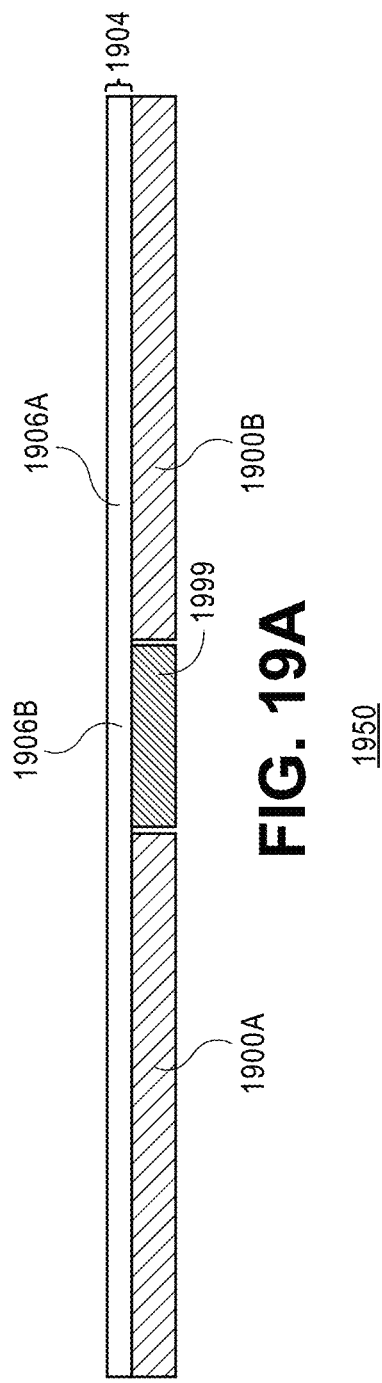
FIG. 19A illustrates a cross-sectional view of an arrangement for wire-based metallization of solar cells, in accordance with an embodiment of the present disclosure.
Figure 19B:
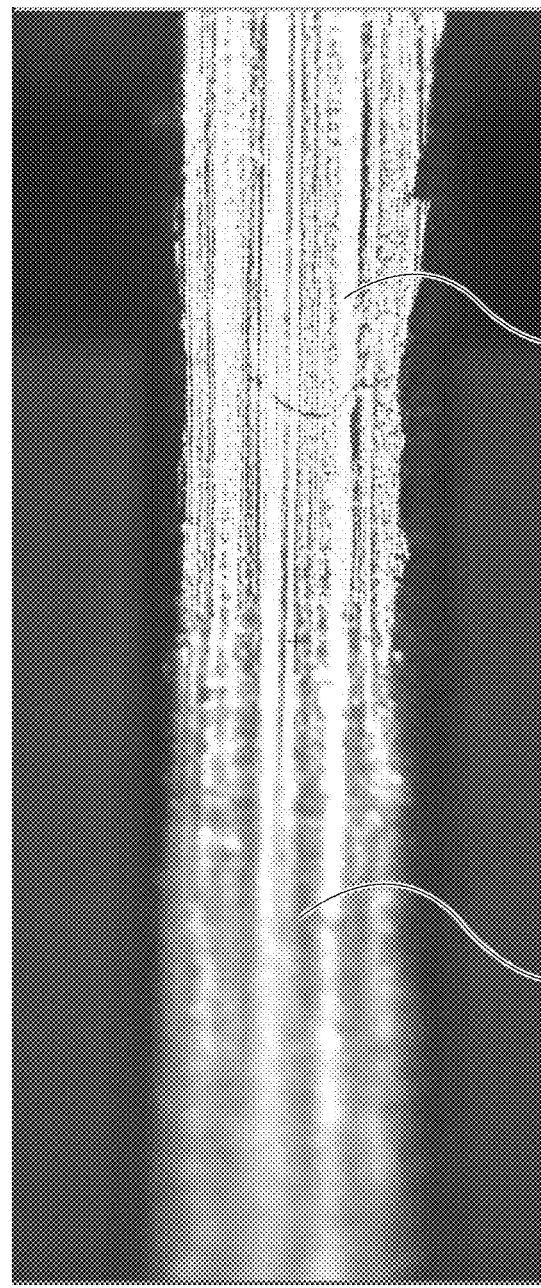
FIG. 19B is an image of a wire portion in a region between two solar cells of the arrangement shown in FIG. 19A, in accordance with an embodiment of the present disclosure.

In an embodiment, addressing the above issues, a wire having a cross section of uniform geometry and material properties on and off cell is implemented for metallization. In a particular embodiment, a plug, placeholder piece (e.g., such as a shim or a silicon shim), chuck portion is inserted either temporarily or permanently in a gap between the cells to act as a bridging feature during thermocompression. A wire is subjected to continuous a thermocompression process across the region between cells, yielding fewer geometric and material property discontinuities along the length of the wire. As an example, FIG. 19A illustrates a cross-sectional view of an arrangement for wire-based metallization of solar cells, in accordance with an embodiment of the present disclosure. FIG. 19B is an image of a wire portion in a region between two solar cells of the arrangement shown in FIG. 19A, in accordance with an embodiment of the present disclosure.

Referring to FIGS. 19A and 19B, adjacent cells 1900A and 1900B are coupled by a wire 1904. The wire 1904 has flat regions 1906A on-cell where thermocompression to the cells 1900A and 1900B has been performed, and a flat region 1906B where thermocompression has been implemented over a shim, temporary plug, permanent plug, placeholder piece or a chuck portion 1999. In an example, material 1999 can include a silicon shim, a high temperature ceramic, a high temperature ceramic textured on at least on side and/or any other applicable material. In an embodiment, the material 1999 can include a material that is removed after performing a thermocompression process or a material that is kept coupled to the wire 1904 and included in a final product (e.g., solar cell string, laminate or solar module). In an embodiment, the material 1999 can be used as a cloaking structure or a cloaking material to block the wires from in a final product (e.g., solar cell string, laminate or solar module). The wire 1904 does not include a transition region such as transition region 1810 of FIGS. 18A and 18B.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein.

Thus, wire-based metallization and stringing techniques for solar cells, and the resulting solar cells, modules, and equipment, have been disclosed. The above structures and techniques can be readily applied and used in solar cell products such as solar cell strings, photovoltaic (PV) laminates and photovoltaic (PV) modules.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

The following examples pertain to further embodiments. The various features of the different embodiments can be variously combined with some features included and others excluded to suit a variety of different applications.

Example embodiment 1: A solar cell includes a substrate having a surface. A plurality of N-type and P-type semiconductor regions is disposed in or above the surface of the substrate. A conductive contact structure is disposed on the plurality of N-type and P-type semiconductor regions, the conductive contact structure including a plurality of conductive wires, each conductive wire of the plurality of conductive wires essentially continuously bonded directly to a corresponding one of the N-type and P-type semiconductor regions.

Example embodiment 2: The solar cell of example embodiment 1, wherein each conductive wire of the plurality of conductive wires is parallel along a direction to form a one-dimensional layout of the conductive contact structure.

Example embodiment 3: The solar cell of example embodiment 1 or 2, wherein each conductive wire of the plurality of conductive wires has a flattened circular profile.

Example embodiment 4: The solar cell of example embodiment 1, 2 or 3, wherein each conductive wire of the plurality of conductive wires has a surface with microgrooves along a length of the conductive wire.

Example embodiment 5: The solar cell of example embodiment 1, 2, 3 or 4, wherein the substrate is substantially rectangular, and wherein the plurality of N-type and P-type semiconductor regions and the plurality of conductive wires are substantially parallel to an edge of each of the substrate.

Example embodiment 6: The solar cell of example embodiment 1, 2, 3, 4 or 5, wherein the plurality of N-type and P-type semiconductor regions is disposed in a back surface of the substrate, the back surface opposite an opposing light-receiving surface of the substrate.

Example embodiment 7: The solar cell of example embodiment 1, 2, 3, 4 or 5, wherein the plurality of N-type and P-type semiconductor regions is disposed above a back surface of the substrate, the back surface opposite an opposing light-receiving surface of the substrate.

Example embodiment 8: A solar cell includes a substrate having a surface. A plurality of N-type and P-type semiconductor regions is disposed in or above the surface of the substrate. A conductive contact structure is disposed on the plurality of N-type and P-type semiconductor regions, the conductive contact structure including a plurality of non-coated conductive wires, each non-coated conductive wire of the plurality of non-coated conductive wires bonded directly to a corresponding one of the N-type and P-type semiconductor regions.

Example embodiment 9: The solar cell of example embodiment 8, wherein each non-coated conductive wire of the plurality of non-coated conductive wires is parallel along a direction to form a one-dimensional layout of the conductive contact structure.

Example embodiment 10: The solar cell of example embodiment 8 or 9, wherein each non-coated conductive wire of the plurality of non-coated conductive wires has a flattened circular profile.

Example embodiment 11: The solar cell of example embodiment 8, 9 or 10, wherein each non-coated conductive wire of the plurality of non-coated conductive wires has a surface with microgrooves along a length of the non-coated conductive wire.

Example embodiment 12: The solar cell of example embodiment 8, 9, 10 or 11, wherein the substrate is substantially rectangular, and wherein the plurality of N-type and P-type semiconductor regions and the plurality of non-coated conductive wires are substantially parallel to an edge of each of the substrate.

Example embodiment 13: The solar cell of example embodiment 8, 9, 10, 11 or 12, wherein the plurality of N-type and P-type semiconductor regions is disposed in a back surface of the substrate, the back surface opposite an opposing light-receiving surface of the substrate.

Example embodiment 14: The solar cell of example embodiment 8, 9, 10, 11 or 12, wherein the plurality of N-type and P-type semiconductor regions is disposed above a back surface of the substrate, the back surface opposite an opposing light-receiving surface of the substrate.

Example embodiment 15: A solar cell includes a substrate having a surface. A plurality of N-type and P-type semiconductor regions is disposed in or above the surface of the substrate. A conductive contact structure is disposed on the plurality of N-type and P-type semiconductor regions, the conductive contact structure including a plurality of non-coated conductive wires, each non-coated conductive wire of the plurality of non-coated conductive wires bonded through a metal layer to a corresponding one of the N-type and P-type semiconductor regions.

Example embodiment 16: The solar cell of example embodiment 15, wherein the metal layer is a metal seed layer.

Example embodiment 17: The solar cell of example embodiment 15 or 16, wherein each non-coated conductive wire of the plurality of non-coated conductive wires is parallel along a direction to form a one-dimensional layout of the conductive contact structure.

Example embodiment 18: The solar cell of example embodiment 15, 16 or 17, wherein each non-coated conductive wire of the plurality of non-coated conductive wires has a flattened circular profile.

Example embodiment 19: The solar cell of example embodiment 15, 16, 17 or 18, wherein each non-coated conductive wire of the plurality of non-coated conductive wires has a surface with microgrooves along a length of the non-coated conductive wire.

Example embodiment 20: The solar cell of example embodiment 15, 16, 17, 18 or 19, wherein the substrate is substantially rectangular, and wherein the plurality of N-type and P-type semiconductor regions and the plurality of non-coated conductive wires are substantially parallel to an edge of each of the substrate.

Example embodiment 21: A string of solar cells includes a plurality of back-contact solar cells, wherein each of the plurality of back-contact solar cells includes P-type and N-type doped diffusion regions. A plurality of conductive wires is disposed over a back surface of each of the plurality of solar cells, wherein each of the plurality of conductive wires is substantially parallel to the P-type and N-type doped diffusion regions of each of the plurality of solar cells. Every other one of the plurality of conductive wires is cut in a region between each adjacent pair of the plurality of solar cells, and wherein portions of uncut wires have a different cross-sectional profile in the region between each adjacent pair of the plurality of solar cells than portions of the uncut wires bonded to the solar cells.

Example embodiment 22: The string of solar cells of example embodiment 21, wherein the portions of uncut wires have a circular cross-sectional profile in the region between each adjacent pair of the plurality of solar cells, and the portions of the uncut wires bonded to the solar cells have a flattened circular profile.

Example embodiment 23: The string of solar cells of example embodiment 21 or 22, wherein each of the plurality of solar cells is substantially rectangular, and wherein the P-type doped diffusion regions, the N-type doped diffusion regions, and the plurality of conductive wires are substantially parallel to a first edge of each of the plurality of solar cells.

Example embodiment 24: The string of solar cells of example embodiment 21, 22 or 23, wherein a given cut section of wire of the plurality of conductive wires is to electrically couple at most two solar cells together in series, wherein the P-type doped diffusion regions of one of the two solar cells is connected to the N-type doped diffusion regions of the other of the two solar cells.

Example embodiment 25: The string of solar cells of example embodiment 21, 22, 23 or 24, further including a conductive busbar at an end of the string of solar cells, wherein the conductive busbar is folded over a back of one of the solar cells.

Example embodiment 26: A method of electrically coupling solar cells includes aligning conductive wires over back sides of adjacent solar cells, wherein the conductive wires are aligned substantially parallel to P-type and N-type doped diffusion regions of the solar cells. The method also includes bonding the conductive wires directly to the back side of each of the solar cells over the P-type and N-type doped diffusion regions using thermocompression bonding, ultrasonic bonding, or thermosonic bonding. The method also includes cutting every other one of the conductive wires between each adjacent pair of the solar cells.

Example embodiment 27: A system for electrically coupling solar cells includes a wire support to align conductive wires substantially parallel with P-type and N-type doped diffusion regions of each of the solar cells. The system also includes a bond head to bond the conductive wires to the back side of each of the solar cells over the P-type and N-type doped diffusion regions. The system also includes a cutter to sever the conductive wires.

Example embodiment 28: The system of example embodiment 27, wherein the bond head to apply pressure to the conductive wires, wherein the bond head includes a corresponding groove or side wall to ensure that each conductive wire cannot move laterally during the bonding to remain aligned to the corresponding one of the P-type and N-type doped diffusion regions.

Example embodiment 29: A string of solar cells includes a plurality of solar cells, wherein each of the plurality of solar cells includes P-type and N-type doped diffusion regions. A plurality of conductive wires is disposed over a back surface of each of the plurality of solar cells, wherein each of the plurality of conductive wires is substantially parallel to the P-type and N-type doped diffusion regions of each of the plurality of solar cells. One or more of the plurality of conductive wires adjoins a pair of adjacent solar cells of the plurality of solar cells and has a relief feature between the pair of adjacent solar cells.

Example embodiment 30: The string of solar cells of example embodiment 29, wherein the relief feature comprises an additional material connecting the plurality of conductive wires adjoining the pair of adjacent solar cells.

Example embodiment 31: The string of solar cells of example embodiment 30, wherein the additional material comprises a material selected from the group consisting of a ribbon, wire and foil.

Example embodiment 32: The string of solar cells of example embodiment 30, wherein the relief feature comprises a region selected from the group consisting of a solder region, weld region and a cut region.

Example embodiment 33: The string of solar cells of example embodiment 30, wherein the relief feature comprises an approximately 90 degree angle to the plurality of conductive wires.

Example embodiment 34: The string of solar cells of example embodiment 30, wherein the relief feature comprises an angle greater than or less than approximately 90 degrees to the plurality of conductive wires.

Example embodiment 35: The string of solar cells of example embodiment 29, wherein the relief feature comprises a first bend relief feature having a bend orientation, the bend orientation of the first bend relief feature in plane to the plurality of conductive wires.

Example embodiment 36: The string of solar cells of example embodiment 35, further comprising a second bend relief feature having a bend orientation, the bend orientation of the second bend relief feature in plane to the plurality of conductive wires.

Example embodiment 37: The string of solar cells of example embodiment 36, wherein the bend orientation of the second bend relief feature is in the same direction as the bend orientation of the first bend relief feature.

Example embodiment 38: The string of solar cells of example embodiment 36, wherein the bend orientation of the second bend relief feature is in an opposite direction as the bend orientation of the first bend relief feature.

Example embodiment 39: The string of solar cells of example embodiment 36, wherein the relief feature comprises a third bend relief feature having a bend orientation, the bend orientation of the third bend relief feature in plane to the plurality of conductive wires.

Example embodiment 40: The string of solar cells of example embodiment 39, wherein the bend orientation of the first, second and third bend relief feature are in an alternating direction.

Example embodiment 41: The string of solar cells of example embodiment 29, wherein one side edge of the plurality of solar cells are connected by at least one conductive wire and another, opposite, side edge of the plurality of solar cells is open.

Example embodiment 42: The string of solar cells of example embodiment 29, further comprising a shim coupled to the plurality of conductive wires, the shim disposed on one side of the plurality of conductive wires adjacent to the plurality of solar cells.

Example embodiment 43: The string of solar cells of example embodiment 42, wherein the shim comprises a material selected from the group consisting of a silicon shim, a high temperature ceramic and a cloaking material.

Example embodiment 44: The string of solar cells of example embodiment 29, wherein the P-type doped diffusion regions of a first solar cell of the plurality of solar cells is directly in alignment with the P-type doped diffusion regions a second solar cell of the plurality of solar cells.

Example embodiment 45: The string of solar cells of example embodiment 29, wherein the P-type doped diffusion regions of a first solar cell of the plurality of solar cells is directly in alignment with the N-type doped diffusion regions a second solar cell of the plurality of solar cells.

Example embodiment 46: The string of solar cells of example embodiment 29, wherein the plurality of solar cells comprise a plurality of back-contact solar cells.

Example embodiment 47: A method of fabricating a solar cell string, the method comprising positioning at least two solar cells adjacent to one another, wherein the emitter regions of a first solar cell are in alignment with the emitter regions of a second solar cell. Positioning a plurality of wires in alignment with the emitter regions of the first and second solar cells. Performing a thermocompression process to bond the plurality of wires to the emitter regions of the first and second solar cells. Positioning an interconnect material in contact with the plurality of wires, wherein the interconnect material can be positioned between the first and second solar cells. And performing a welding and cutting process on the interconnect material and the plurality of wires.

Example embodiment 48: A method of fabricating a solar cell string, the method comprising: positioning at least two solar cells adjacent to one another, wherein the positioning comprising positioning a second solar cell in an orientation 180 degrees rotated to a first solar cell. Positioning a plurality of wires in alignment with emitter regions of the first and second solar cells. Performing a thermocompression process to bond the plurality of wires to the emitter regions of the first and second solar cells. Bending the plurality of wires at locations in between the first and second solar cell. And performing a cutting process on the plurality of wires.

Figure 20A:
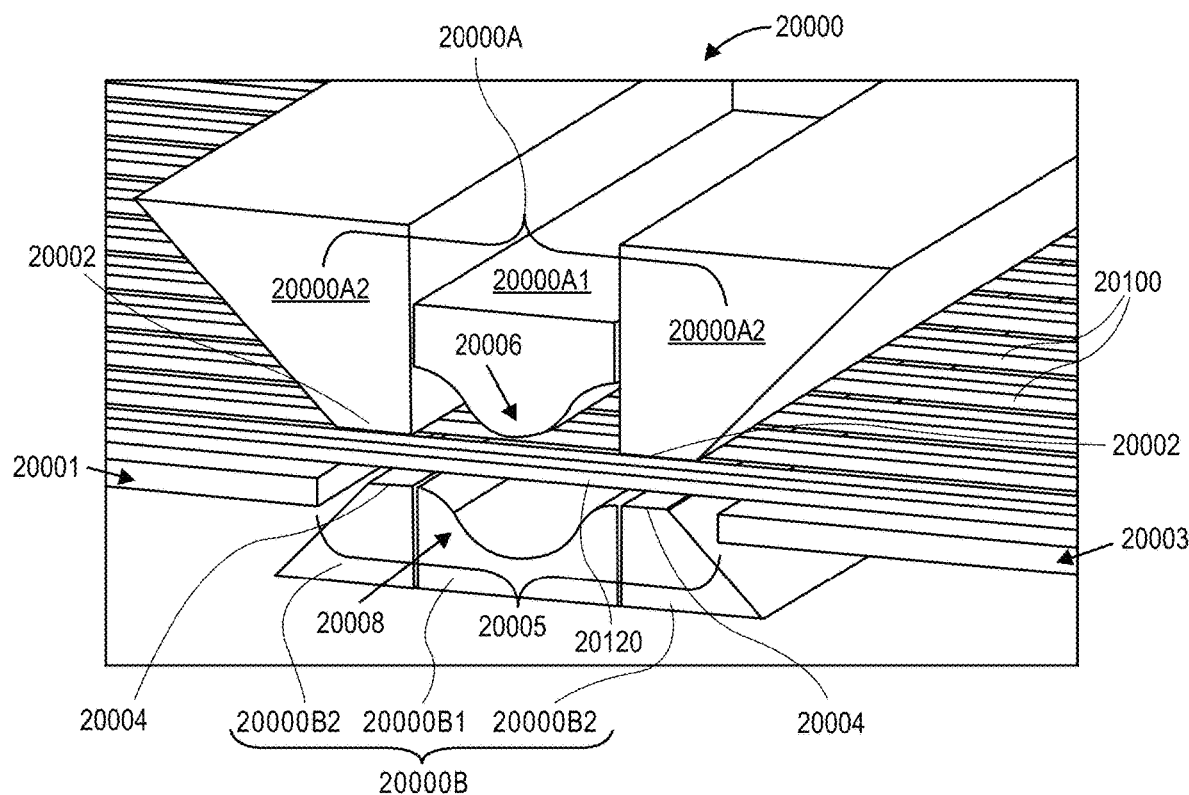
FIG. 20A illustrates a perspective view of an arrangement for wire-based metallization of solar cells prior to forming a strain relief feature, in accordance with an embodiment of the present disclosure.
Figure 20B:
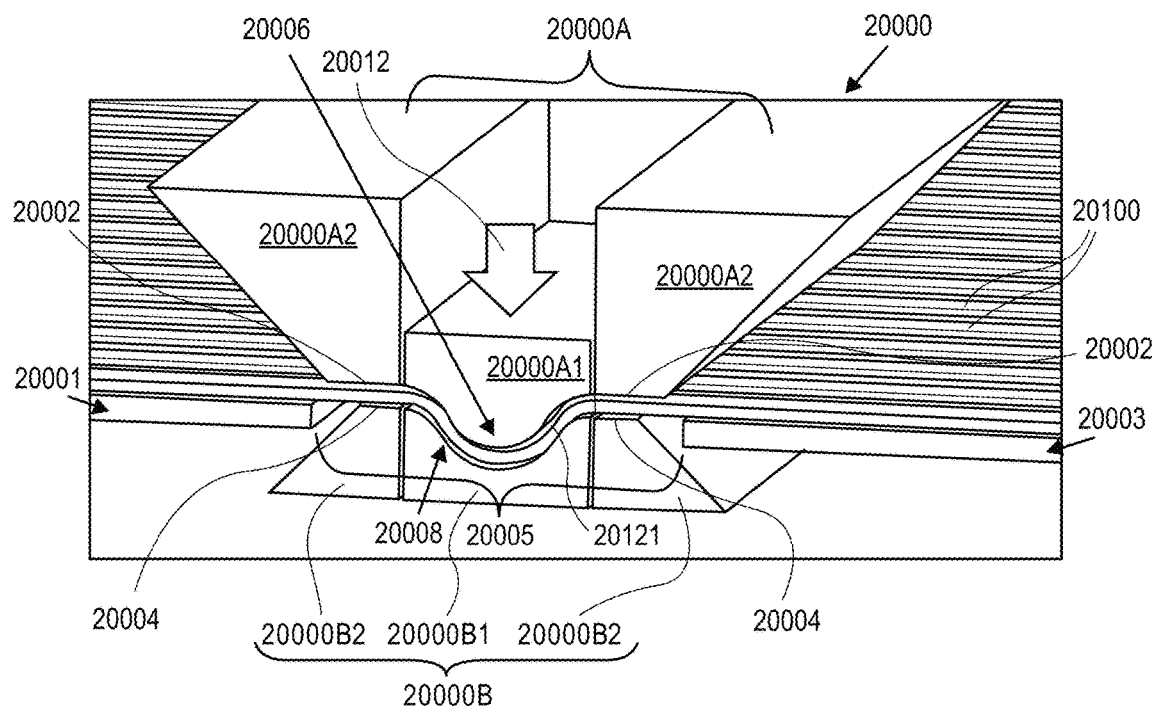
FIG. 20B illustrates a perspective view of an arrangement for wire-based metallization of solar cells after to forming a strain relief feature, in accordance with an embodiment of the present disclosure.

As described above, wires can be used to string solar cells together instead of using interconnects to form a solar cell string. Solar cell strings can benefit from strain relief features at the interconnect metallization to prevent failures, e.g., due to thermal expansion and contraction. After wires are bonded across the cells, e.g., as described above, solar cell strings can be placed in tooling including an upper and lower forming die. As the die is closed, wires can be compressed and bent to form the strain relief features. Thus, for solar cell strings with wire metallization, it can be beneficial to form a strain relief feature, and FIGS. 20A and 20B show a method and tools for forming such strain relief features, including resulting solar cell metallization structures. As used herein, the strain relief feature can also be referred to as a strain relief bend, stress relief feature and/or a stress relief bend.

In an embodiment, addressing the strain relief features described above, FIGS. 20A and 20B show solar cells having a wire and/or a plurality of wires coupled thereto, prior to and after formation of a strain relief feature. In a particular example, the techniques, equipment and/or resulting structures described in FIGS. 20A and 20B can be used to form the features described in FIG. 16A-16D above. In an embodiment, FIGS. 20A and 20B show a technique which uses a matched metal forming tool to form a strain relief feature between interconnected solar cells, where the compression on the wire can plastically deform the wire connecting the solar cells.

Referring to FIG. 20A, in an embodiment, a perspective view of an arrangement for wire-based metallization of solar cells prior to forming a strain relief feature is shown, according to some embodiments. In an embodiment, a forming piece 20000 can placed over and under a plurality of wires 20100 coupled to solar cells 20001, 20003. In an embodiment, the forming piece 20000 can be disposed over and under a region 20005 of the wires located at 20120 between the solar cells 20001, 20003, as shown. In an embodiment, the solar cells 20001, 20003 can include emitter regions where the plurality of wires 20100 can be coupled to the emitter regions of the solar cells 20001, 20003 (e.g., as described above in FIGS. 16A-D). In an embodiment, the forming piece 20000 can include a die and/or a forming die. In an embodiment, the forming piece 20000 can include two portions a top portion 20000A and a bottom portion 20000B. In an embodiment, the top portion 20000A can include a shaping portion 20000A1 and clamping portions 20000A2. In an embodiment, the shaping portion 20000A1 can include a curved and/or extruded portion 20006. In an embodiment, the extruded portion 20006 can be in a curved shape as shown in FIG. 20A. In an embodiment, the extruded portion 20006 can be in a gaussian curve shape, bell curve shape, in a shape of a semi-circle, semi-oblong, and/or any other applicable shape. In an embodiment, the extruded portion 20006 can be in a shape of a strain relief feature (e.g., as described in FIGS. 16A-16D above). In an embodiment, the clamping portions 20000A2 can include flat portions 20002. In an embodiment, the flat portions 20002 can be configured substantially inhibit the movement of the plurality of wires 20100 during the forming strain relief features. In an embodiment, although the top portion 20000A is shown including multiple portions 20000A1, 20000A2, in another embodiment the top portion can be a single portion, where the extruded portion 20006 and flat portions 20002 can be included in the single top portion. In an embodiment, the bottom portion 20000B can include a receiving portion 20008 and flat portions 20004. As shown, in one embodiment, the bottom portion 20000B can include multiple portions including a shaping portion 20000B1, and clamping portions 2000B2. In an embodiment, the shaping portion 20000B1 can include the receiving portion 20008. In an embodiment, the clamping portions 20000B2 can include flat portions 20004 In an embodiment, the bottom portion 20000B can be a single portion, e.g., not include separate portions 20000B1, 20000B2. In an embodiment, the receiving portion 20008 can be in a shape configured to receive the extruded portion 20006. In an example, the receiving portion 20006 can have a shape matched, negative to and/or opposite to the shape of the extruded portion 20006. In an embodiment, the flat portions 20004 of the bottom portion 20000B can be configured to hold down the plurality of wires 20100 when forming the strain relief features. In an embodiment, the flat portions 20002, 20004 can hold down the plurality of wires and/or inhibit movement of the wires during forming of a strain relief feature. In an embodiment, the forming piece 20000 can include one or more materials. In an example, the forming piece 20000 can include aluminum, steel, ceramic materials, tungsten, tungsten alloys and other materials.

Referring to FIG. 20B, in an embodiment, a perspective view of an arrangement for wire-based metallization of solar cells after forming a strain relief feature is shown, according to some embodiments. In an embodiment, the features and/or structures described in FIG. 20A are similar and/or the same to the features and/or structures described in FIG. 20A. In an embodiment, the same number references found in FIG. 20B can refer to the structures and/or features described in FIG. 20A. In an embodiment, force 20012 can be applied to the plurality of wires 20100 via the extruded portion 20006 to form a strain relief feature 20121 as shown. In an example, the wires 20100 can be compressed by the force 20012 applied via the extruded portion 20006. In an embodiment, a mechanical stop limit can limit the amount of compression on the wire 20100.

Referring again to FIG. 20B, in an embodiment, the solar cells 20001, 20003 can be required to move together during the wire bending process because the length of the wire can be fixed. This can create complexity in tooling and processing. Thus, the simultaneous compression of the wire during shaping/bending can provide additional length to the wire to make the strain relief feature (e.g., strain bend), inhibiting the movement of the solar cells during processing. In an embodiment, the flat portions 20002, 20004 can be configured substantially inhibit the movement of the plurality of wires 20100 when forming a strain relief feature 20121. In an example, a spring and/or any other mechanical mechanism can be used to apply force from the flat portions 20002, 20004 to the wire 20100. In some embodiments, the forming piece 20000 can be heated. In an embodiment, the heating can include heating the forming piece 20000 to temperatures in a range of 100-500 degrees Celsius. In an embodiment, during and/or after compression, the cross-sectional area of the wire at 20121 between cells can also be reduced, while at the same time extra length can be added to the wire 20100 so that movement of the solar cells relative to each other during manufacturing and process is reduced. In an example, the resulting thickness of the wire 20100 after compression at the strain relief feature 20121 (e.g., at 20005 between solar cells) can be reduced to 20-99% of the original cross section of the wire prior to forming the strain relief feature 20212.

Referring again to FIG. 20B, an arrangement for wire-based metallization of solar cells including a strain relief feature is shown. In an embodiment, the solar cells 20001, 20003 can be physically and/or electrically connected together by the plurality of wires 20100. In an embodiment, the wires 20100 can include the strain relief feature 20121. In an embodiment the strain relief feature 20121 can be located at a region 20005 between the solar cells 20001, 20003. In an embodiment, the strain relief feature can have a shape of in a gaussian curve shape, bell curve shape, in a shape of a semi-circle, semi-oblong, and/or any other applicable shape. In an embodiment, the strain relief feature 20121 can have a shape as described in FIGS. 16A-16D above. In an example, the strain relief feature 20121 can include a bend in a direction perpendicular to the plane or direction defined by the solar cells 20001, 20003 (e.g., referring to FIG. 16D). In an embodiment, the resulting thickness of the wire 20100 after compression at the strain relief feature 20121 (e.g., at 20005 between solar cells) can be reduced to 20-99% of the original cross section of the wire prior to forming the strain relief feature 20212. Also, in reference to the above, every other one of the plurality of wires 20100 can be cut in a region between each adjacent pair of the plurality of solar cells 20001, 20003 (e.g., as shown in FIGS. 16B-16D).

What is claimed is:

1. A method of fabricating a solar cell string, the method comprising:
    positioning at least two solar cells adjacent to one another, wherein emitter regions of a first solar cell are in alignment with emitter regions of a second solar cell;
    positioning an intervening structure between the first and second solar cells in a location outside of a footprint of the first and second solar cells;
    positioning a plurality of wires in alignment with the emitter regions of the first and second solar cells;
    performing a thermocompression process to bond the plurality of wires to the emitter regions of the first and second solar cells, the thermocompression bonding performed in the presence of the intervening structure, wherein one or more of the plurality of wires has a bottom surface with a flat region, rounded side surfaces, and a top surface with a flat region between the first and second solar cells in the location outside of a footprint of the first and second solar cells;
    removing the intervening structure from between the first and second solar cells subsequent to performing the thermocompression process;
    positioning an interconnect material in contact with the plurality of wires, wherein the interconnect material is positioned between the first and second solar cells; and
    performing a welding and cutting process on the interconnect material and the plurality of wires.

2. A method of fabricating a solar cell string, the method comprising:

positioning at least two solar cells adjacent to one another, wherein the positioning comprising positioning a second solar cell in an orientation 180 degrees rotated to a first solar cell;

positioning an intervening structure between the first and second solar cells in a location outside of a footprint of the first and second solar cells;

positioning a plurality of wires in alignment with emitter regions of the first and second solar cells;

performing a thermocompression process to bond the plurality of wires to the emitter regions of the first and second solar cells, the thermocompression bonding performed in the presence of the intervening structure, wherein one or more of the plurality of wires has a bottom surface with a flat region, rounded side surfaces, and a top surface with a flat region between the first and second solar cells in a location outside of the footprint of the first and second solar cells;

removing the intervening structure from between the first and second solar cells subsequent to performing the thermocompression process;

bending the plurality of wires at locations in between the first and second solar cell; and performing a cutting process on the plurality of wires.

3. A method of fabricating a string of solar cells, the method comprising:

providing a plurality of solar cells, wherein each of the plurality of solar cells includes P-type and N-type doped diffusion regions;

positioning an intervening structure between adjacent ones of the plurality of solar cells in a location outside of a footprint of the plurality of solar cells;

disposing a plurality of conductive wires over a back surface of each of the plurality of solar cells, wherein each of the plurality of conductive wires is substantially parallel to the P-type and N-type doped diffusion regions of each of the plurality of solar cells;

performing a thermocompression process to bond the plurality of conductive wires to the P-type and N-type doped diffusion regions of the plurality of solar cells, the thermocompression bonding performed in the presence of the intervening structure, wherein one of the plurality of conductive wires adjoins a pair of adjacent solar cells of the plurality of solar cells and has a bottom surface with a flat region, rounded side surfaces, and a top surface with a flat region between the pair of adjacent solar cells in a location outside of a footprint of the pair of adjacent solar cells; and removing the intervening structure from between the adjacent ones of the plurality of solar cells subsequent to performing the thermocompression process.

4. The method of claim 3, wherein the further comprising:

forming a relief feature that comprises an additional material connecting the plurality of conductive wires adjoining the pair of adjacent solar cells.

5. The method of claim 4, wherein the additional material comprises a material selected from the group consisting of a ribbon, wire and foil.

6. The method of claim 4, wherein the relief feature comprises a region selected from the group consisting of a solder region, weld region and a cut region.

7. The method of claim 4, wherein the relief feature comprises an approximately 90 degree angle to the plurality of conductive wires.

8. The method of claim 4, wherein the relief feature comprises an angle greater than or less than approximately 90 degrees to the plurality of conductive wires.

9. The method of claim 4, wherein the relief feature comprises a first bend relief feature having a bend orientation, the bend orientation of the first bend relief feature in plane to the plurality of conductive wires.

10. The method of claim 9, further comprising a second bend relief feature having a bend orientation, the bend orientation of the second bend relief feature in plane to the plurality of conductive wires.

11. The method of claim 10, wherein the bend orientation of the second bend relief feature is in the same direction as the bend orientation of the first bend relief feature.

12. The method of claim 10, wherein the bend orientation of the second bend relief feature is in an opposite direction as the bend orientation of the first bend relief feature.

13. The method of claim 10, wherein the relief feature comprises a third bend relief feature having a bend orientation, the bend orientation of the third bend relief feature in plane to the plurality of conductive wires.

14. The string of solar cells of claim 13, wherein the bend orientation of the first, second and third bend relief feature are in an alternating direction.

15. The method of claim 3, wherein one side edge of the plurality of solar cells are connected by at least one conductive wire and another, opposite, side edge of the plurality of solar cells is open.

16. The method of claim 3, wherein the intervening structure is a shim, the shim on one side of the one of the plurality of conductive wires adjacent to the plurality of solar cells.

17. The method of claim 16, wherein the shim comprises a material selected from the group consisting of a silicon shim, a high temperature ceramic and a cloaking material.

18. The method of claim 3, wherein the P-type doped diffusion regions of a first solar cell of the plurality of solar cells is directly in alignment with the P-type doped diffusion regions a second solar cell of the plurality of solar cells.

19. The method of claim 3, wherein the P-type doped diffusion regions of a first solar cell of the plurality of solar cells is directly in alignment with the N-type doped diffusion regions a second solar cell of the plurality of solar cells.

20. The method of claim 3, wherein the plurality of solar cells comprise a plurality of back-contact solar cells.

* * * * *